United States Patent [19]

Hidaka et al.

[11] Patent Number: 5,687,123
[45] Date of Patent: Nov. 11, 1997

[54] SEMICONDUCTOR MEMORY DEVICE

[75] Inventors: Hideto Hidaka; Mikio Asakura; Kazuyasu Fujishima; Tsukasa Ooishi; Kazutami Arimoto; Shigeki Tomishima; Masaki Tsukude, all of Hyogo, Japan

[73] Assignee: Mitsubishi Denki Kabushiki Kaisha, Tokyo, Japan

[21] Appl. No.: 312,968

[22] Filed: Sep. 30, 1994

[30] Foreign Application Priority Data

Oct. 14, 1993 [JP] Japan .................................. 5-257328
Jan. 10, 1994 [JP] Japan .................................. 6-001017
Jun. 29, 1994 [JP] Japan .................................. 6-148007

[51] Int. Cl.$^6$ ........................................................ G11C 7/00
[52] U.S. Cl. ............... 365/189.09; 365/174; 365/189.01; 365/189.11; 365/2.01; 365/226; 365/230.06
[58] Field of Search .................. 365/189.01, 226, 365/189.11, 189.09, 230.06, 174, 201

[56] References Cited

U.S. PATENT DOCUMENTS

| 4,679,172 | 7/1987 | Kirsch et al. ........................... 365/222 |
| 5,299,154 | 3/1994 | Oowaki et al. ......................... 365/149 |
| 5,444,659 | 8/1995 | Yokokura ............................. 365/189.09 |
| 5,446,697 | 8/1995 | Yoo et al. .............................. 365/226 |

FOREIGN PATENT DOCUMENTS

| 62-208496 | 9/1987 | Japan . |
| 4-70718 | 11/1992 | Japan . |
| 5-89677 | 4/1993 | Japan . |
| 5-54265 | 8/1993 | Japan . |

OTHER PUBLICATIONS

ISSCC 89/Digest of Technical Papers, Feb. 17, 1989, pp. 248-249.

Primary Examiner—Do Hyun Yoo
Attorney, Agent, or Firm—Lowe, Price, LeBlanc & Becker

[57] ABSTRACT

Drains of first and second transistors are connected to a low level line of an internal circuitry such as a sense amplifier related to determination of a potential in a memory cell. The first transistor has its gate diode-connected to a sense drive line and its source grounded. The second transistor receives at its gate an internally generated signal, and its source is grounded. In the standby state, the potential of the sense drive line is set higher than low level of said word lines by the threshold voltage Vthn of the first transistor and used as dummy GND potential Vss', and in the active state, the second transistor is rendered conductive so as to prevent floating of the sense drive line from the dummy GND potential Vss'.

42 Claims, 57 Drawing Sheets

FIG. 26
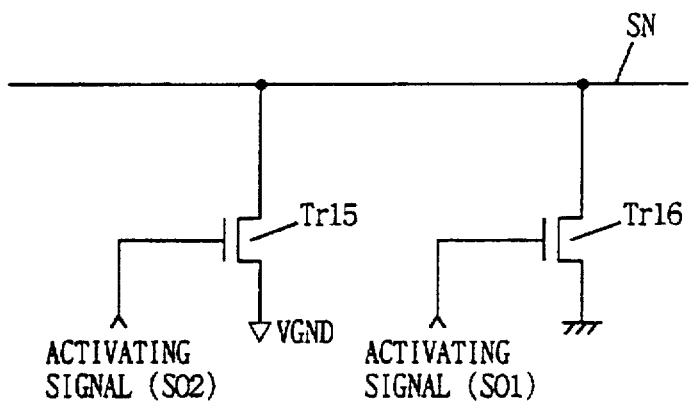
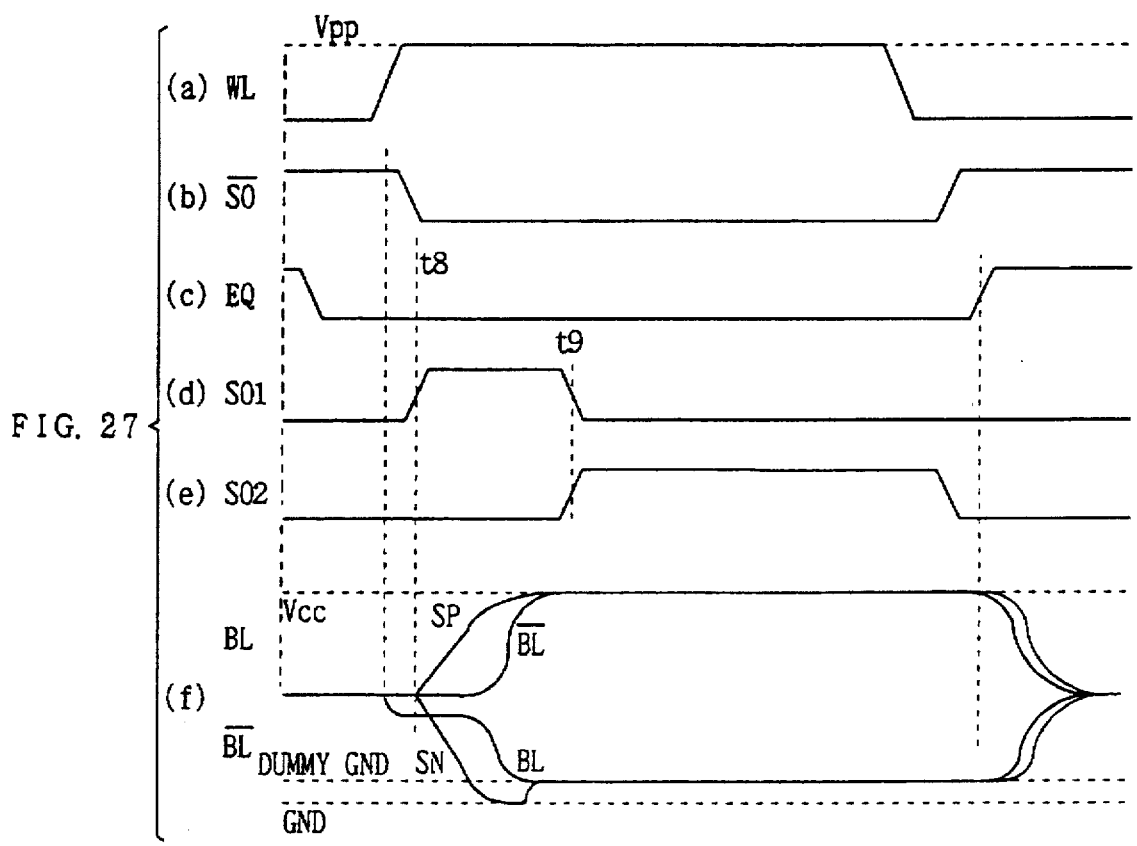
FIG. 27

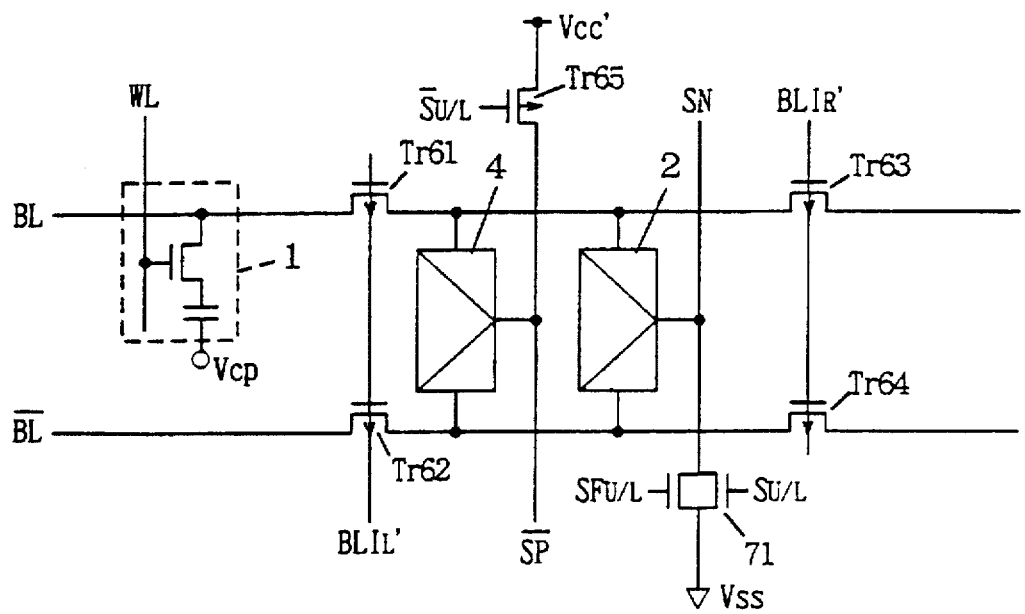

a: SUB THRESHOLD CHARACTERISTIC WITHOUT BACKGATE
b: SUB THRESHOLD CHARACTERISTIC WITH VBB=-1V APPLIED
c: SUB THRESHOLD CHARACTERISTIC UNDER ACTUAL DISTURB CONDITION
d: LEAK CURRENT DETERMINED BY JUNCTION

5,687,123

SEMICONDUCTOR MEMORY DEVICE

BACKGROUND OF THE INVENTION

FIELD OF THE INVENTION

The present invention relates to a semiconductor memory device. More specifically, the present invention relates to a semiconductor memory device in which low level potential of sense amplifiers, memory cells and bit lines constituting a memory cell array is adapted to be higher than the low level of the word lines of the chip body, in a dynamic random access memory including a memory cell array arranged on a semiconductor substrate, sense amplifiers and circuitry for controlling these.

DESCRIPTION OF THE BACKGROUND ART

FIG. 101 is a schematic diagram showing a main portion of a conventional DRAM. Referring to FIG. 101, a memory cell MC is connected to a word line WL and a bit line pair BL, $\overline{BL}$. Bit line pair BL and $\overline{BL}$ is connected to an n channel sense amplifier 2, an equalizer circuit 3 and a p channel sense amplifier 4 through transfer gates Tr71 and Tr72. Transfer gates Tr71 and Tr72 are controlled by a gate control signal BLI. To equalizer circuit 3, a VBL signal at the potential of ½ Vcc as well as an EQ signal are applied. In response to the EQ signal, equalizer circuit 3 precharges bit lines BL and $\overline{BL}$ to ½ Vcc by VBL signal. Sense amplifiers 2 and 4 are to amplify a small potential difference read from the memory cell MC to the bit line pair BL and $\overline{BL}$. Sense amplifier 2 is activated when a sense amplifier activating signal SO is applied to a sense drive line SN, while sense amplifier 4 is activated when an activating signal $\overline{SO}$ is applied to a sense drive line SP.

FIG. 102 is a time chart showing the operation of the memory array shown in FIG. 101. There are a plurality of blocks of the memory array shown in FIG. 101, and each block is activated when a corresponding block activating signal is applied thereto. However, at this time, sense amplifiers 2 and 4 have not yet been activated. When data is to be read from memory cell MC, the BLI signal attains to the "H" level, transfer gates TR71 and TR72 are rendered conductive, and bit line pair BL, $\overline{BL}$ is connected to sense amplifiers 2 and 4 and to equalizer circuit 3. When word line WL rises to the boosted voltage Vpp as shown in (a) of FIG. 102, a small potential difference is read from memory cell MC to bit line pair BL and $\overline{BL}$, activating signal SO attains to the "H" level and activating signal $\overline{SO}$ attains to the "L" level as shown in (b) and (c) of FIG. 102, and sense amplifiers 2 and 4 are activated, respectively. The small potential difference between the bit line pair BL and $\overline{BL}$ is amplified by sense amplifiers 2 and 4, and the potential is enhanced to the level of "H" or "L".

Now, the "L" level of the amplitude of the bit line pair BL and $\overline{BL}$ is the low level of the word lines. In this case, the "L" level of a non-selected word line is equivalent to the "L" level of the amplitude of the bit line pair BL and $\overline{BL}$. Therefore, because of sub threshold leak current of the word line which is at the low level of the word lines, charges stored in the memory cell MC flows to the bit line and the amount of charges decrease, resulting in possible destruction of the data in the memory cell MC. In order to prevent this phenomenon, conventionally, a negative voltage bias Vbb is applied to the memory array portion. However, it requires a negative potential generating circuit for generating the negative voltage bias Vbb. In addition, this approach has disadvantage such as increase of array noise as the current incidental to memory array operation flows to the side of the ground, floating of the "L" level of the non-selected word line, increase of the sub threshold leak current of the word line and degradation of the refresh characteristics.

SUMMARY OF THE INVENTION

Therefore, an object of the present invention is to provide a semiconductor memory device in which threshold voltage of memory cell transistors can be set low and reliability can be improved, and in addition, which eliminates the need of a triple well structure.

Briefly stated, the semiconductor memory device of the present invention includes a memory cell array including memory cells each connected to one of a plurality of bit lines and one of a plurality of word lines; a sense amplifier for amplifying a small potential difference read from the memory cell array to the bit line, a control circuit for controlling reading of data from the memory cell array and writing of data to the memory cell array, and a potential setting circuit for setting lines of low level potential in the sense amplifier, the memory cells and bit lines to a potential higher than the low level of the word lines.

Therefore, according to the present invention, since the lines of the low level potential of the sense amplifier group, the memory cells and the bit lines are set to a potential higher than the low level of the word lines, the threshold voltage of the memory cell transistor can be set lower, reliability can be improved, a boosted voltage generating circuit becomes unnecessary, and the triple well structure becomes unnecessary.

More preferably, in order to enhance the potential of the low level potential line by the threshold voltage of a semiconductor element, the potential setting circuit discharges the potential of the low level potential line by a second semiconductor element in response to a signal which corresponds to a period in which large current flows.

More preferably, the potential setting circuit includes a reference voltage generating circuit for generating a reference voltage which is approximately equal to the low level potential, and a potential compensating circuit for comparing the reference voltage with the low level potential line, and for compensating the potential of the low level potential line so that the potential becomes higher than the low level of the word lines. The potential compensating circuit includes a comparing circuit and a switching circuit which switches in response to the comparison output from the comparing circuit.

Further, potential setting circuit includes a sustain circuit for intermittently supplying a power supply potential to the low level potential line for compensating the potential thereof so that it attains a level higher than the low level of the word lines. The sustain circuit includes an oscillating circuit and a pumping circuit.

More preferably, the potential setting circuit includes a reference voltage generating circuit for generating a reference potential, a comparing circuit for comparing the reference voltage with the potential of the low level potential line, and a switching circuit for discharging the potential of the low level potential line to the low level of the word lines side in accordance with the output from the comparing circuit.

More preferably, a low level lowering preventing circuit such as a diode is provided for preventing lowering of the potential of the low level potential line from the potential higher than the low level of the word lines.

More preferably, a voltage comparison stopping circuit for disabling the voltage comparing circuit while a large current flows, and floating preventing circuit for preventing floating of the potential of the low level potential line by forcefully operating the switching circuit while the large current flows are provided.

Further, more preferably, the sense amplifier includes a switching element connected between the low level potential line and the ground for enhancing the potential of the low level potential line by the threshold voltage thereof. The switching element includes a switching circuit which is rendered conductive when an input potential becomes equal to or lower than the low level of the word lines for applying a negative potential to an input electrode of the switching element while a large current flows so as to make short the response time. The switching circuit applies the low level of the word lines to the input electrode of the switching element in the former half and a negative potential in the latter half of the period in which the large current flows.

According to the another aspect, the present invention provides a semiconductor memory device having an internal circuit to which a power supply voltage is applied externally, which includes a potential setting circuit for setting a high level potential supplied in the internal circuit to a potential different from the externally supplied power supply voltage, and for setting a low level potential supplied in the internal circuit different from the low level of the word lines, and a circuit for changing the high level and low level potentials dependent on whether the semiconductor memory device is in and not in operation.

In accordance with another aspect, the present invention provides a semiconductor memory device in which a chip is formed on a semiconductor substrate, which includes a memory cell array including memory cells each connected to one of a plurality of bit lines and one of a plurality of word lines; a sense amplifier for amplifying a small potential difference read from the memory cell array to the bit line; a control circuit for controlling reading of data from the memory cell array and writing of data to the memory cell array; a substrate potential generating circuit for supplying a negative level substrate potential to the semiconductor substrate; a boosted voltage generating circuit for generating a boosted voltage to be supplied to the word line; and a potential setting circuit for switching the boosted voltage potential and the negative potential to arbitrary potentials dependent on whether the chip is in use or not in use.

In accordance with a still another aspect of the present invention, the semiconductor memory device includes a memory cell array including a plurality of memory cells each connected to one of a plurality of bit lines and one of a plurality of word lines, a sense amplifier for amplifying a small potential difference read from the memory cell array to a bit line, a control circuit for controlling reading of data from the memory cell array and writing of data to the memory cell array, a potential setting circuit for setting a low level potential line of the bit lines, memory cells and sense amplifier to a potential higher than the low level of the word lines, and a potential compensating circuit for compensating the set low level potential.

According to a still another aspect of the present invention, the semiconductor memory device includes a memory cell array including a plurality of memory cells each connected to one of a plurality of bit lines and one of a plurality of word lines, a sense amplifier for amplifying a small potential difference read from the memory cell array to a bit line, a control circuit for controlling reading of data from the memory cell array and writing of data to the memory cell array, a potential setting circuit for setting a low level potential line of the bit lines, memory cells and sense amplifier to a potential higher than the low level of the word lines, a potential elevating compensating circuit responsive to lowering of the set potential higher than the low level of the word lines, compensating for the lowering by elevating the potential, and voltage lowering compensating circuit responsive to rise of the potential for compensating the rise by lowering the potential.

According to a still further aspect of the present invention, the semiconductor memory device includes a memory cell array including memory cells each connected to one of a plurality of bit lines and one of a plurality of word lines, a sense amplifier for amplifying a small potential difference read from the memory cell array to the bit line, a driving line for driving the sense amplifier, and a potential setting means for setting, when the sense amplifier is driven, the low level potential of the driving line to a potential higher than the low level of the word lines.

According to a still further aspect of the present invention, the semiconductor memory device includes a memory cell array including memory cells each connected to one of a plurality of bit lines and one a plurality of word lines, a sense amplifier for amplifying a small potential difference read from the memory cell array to a bit line, a transfer gate connected between the bit line and the sense amplifier, and a control circuit for setting, when the sense amplifier is driven, the gate potential of the transfer gate to the low level of the word lines and the low level potential of the bit line to the threshold voltage of the transfer gate.

According to a still further aspect of the present invention, the semiconductor memory device includes a memory cell array including a plurality of memory cells each connected to one of a plurality of bit lines and one of a plurality of word lines, a sense amplifier for amplifying a small potential difference read from the memory cell array to a bit line, a control circuit for controlling reading of data from the memory cell array and writing of data to the memory cell array, and a potential setting circuit for setting low level potential line of the bit lines, memory cells and sense amplifier to a potential higher than the low level of the word lines, and for setting a high level potential to a potential lower than the power supply voltage level externally applied.

According to a still further aspect of the present invention, a semiconductor memory device provided with chips formed on a semiconductor substrate includes a memory cell array including memory cells each connected to one of a plurality of bit lines and one of a plurality of word lines, a sense amplifier for amplifying a small potential difference from the memory cell array to a bit line, a control circuit for controlling reading of data from the memory cell array and writing of data to the memory cell array, a potential setting circuit for setting low level potential line of bit lines, memory cells and sense amplifier to a potential higher than the low level of the word lines, and a low level of the word lines forcing circuit for forcing, when data retention time of a memory cell is to be tested, the low level potential line of the bit lines, memory cell and sense amplifier to the low level of the word lines.

According to a still further aspect of the present invention, the semiconductor memory device provided with chips formed on a semiconductor substrate includes a memory cell array including memory cells each connected to one of a plurality of bit lines and one of a plurality of word lines, a word line driving circuit for driving a word line, a sense amplifier for amplifying a small potential difference read from the memory cell array to a bit line, a control circuit for controlling reading of data from the memory cell array and writing of data to the memory cell array, and a potential setting circuit for setting, when data retention time of the memory cell is to be tested, the low level potential line of the word line driving circuit to a potential higher than the low level of the word lines.

According to a still further aspect, the semiconductor memory device provided with chips formed on the semiconductor substrate includes a memory cell array including memory cells each connected to one of a plurality of bit lines and one of a plurality of word lines, a sense amplifier for amplifying a small potential difference read from the memory cell array to a bit line, a control circuit for controlling reading of data from the memory cell array and writing of data to the memory cell array, a substrate potential generating circuit for supplying a negative level substrate potential to the semiconductor substrate, and a substrate potential setting circuit for setting, when data retention time of the memory cell is to be tested, the substrate potential of the semiconductor substrate to a potential higher than the negative level substrate potential.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 26 is a schematic diagram showing a third embodiment in accordance with the sixth aspect of the present invention.

FIG. 27 is a time chart showing the operation of the embodiment of FIG. 26.

FIG. 51 is a schematic diagram showing a second embodiment in accordance with the seventh aspect of the present invention.

FIG. 52 is a time chart showing the operation of the embodiment shown in FIG. 51.

DESCRIPTION OF THE PREFERRED EMBODIMENTS

Figure 1B:
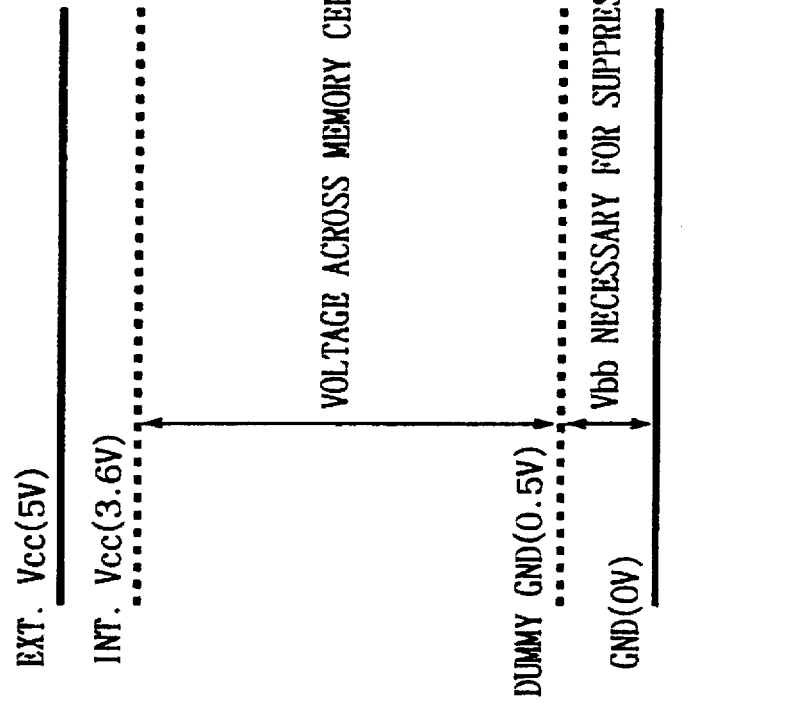
FIGS. 1A and 1B are illustrations comparing concepts of the prior art and of the present invention.
Figure 1A:
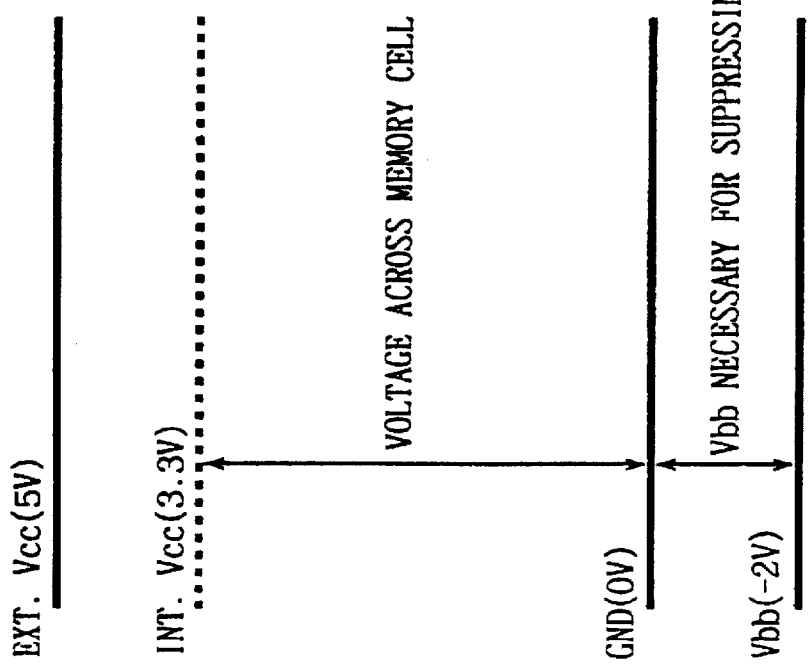

FIGS. 1A and 1B are illustrations for comparing the concepts of the prior art and of the present invention. In the prior art example, referring to FIG. 1A, an internal power supply voltage Int. Vcc (3.3V) is generated from an external power supply voltage Ext.Vcc (5V), a potential between the internal power supply voltage Int. Vcc and the low level of the word lines GND (0V) is being applied to the memory cell, and it is necessary to apply a negative potential Vbb (−2V) to the memory cell in order to suppress the sub threshold leak. For this reason, a negative potential generating circuit was necessary in the prior art.

By contrast, in the present invention, referring to FIG. 1B, the "L" level of the amplitude of the bit line is set not to the low level of the word lines GND but to a dummy GND level (VGND) (0.5V) which is newly generated between the bit line precharge level and the low level of the word lines GND. In this case, the "L" level (GND) of the non-selected word line is in a state relatively biased negative with respect to the "L" level of the bit line amplitude.

Figure 2:
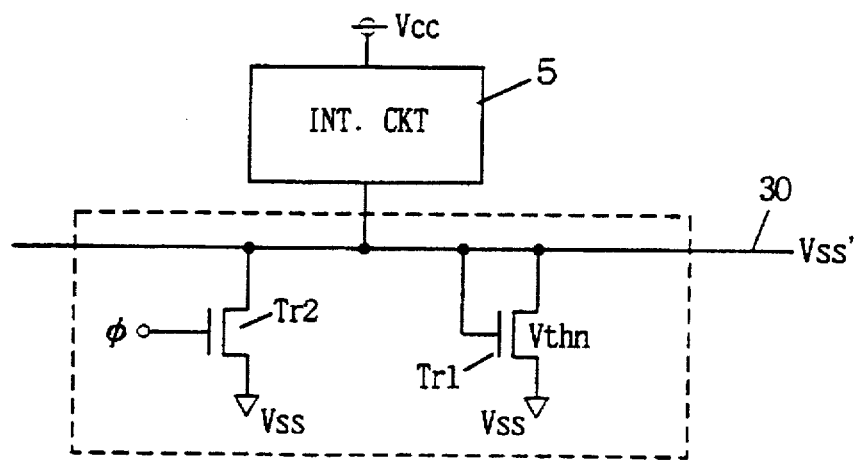
FIG. 2 is a schematic diagram showing a first embodiment of a first aspect of the present invention.

FIG. 2 is a schematic diagram showing a first embodiment in accordance with the first aspect of the present invention. Referring to FIG. 2, an internal circuit 5 is related to determination of memory cell potential, such as a bit line charging/discharging circuit (sense amplifier circuit), a half Vcc generating circuit or the like, and not the whole circuitry of the chip (it should be noted that the word line driving circuit is not included). In the prior art, internal circuit 5 is connected to the low level of the word lines. However, in this embodiment, it is connected to a dummy GND line 30. To dummy GND line 30, the gate and the drain of an n channel transistor Tr1 as well as the drain of an n channel transistor Tr2 are connected. The n channel transistors Tr1 and Tr2 have their sources connected to the low level of the word lines Vss'. An internally generated signal φ is applied to the gate of n channel transistor Tr2. The n channel transistor Tr1 elevates the potential Vss' of the dummy GND line 30 by its threshold voltage Vthn. However, when a large current flows from the memory cell array to the ground when active, especially at the time of charging/discharging the bit lines or at the time when the bit line is connected to the I/O line because of the change in the column address, it is difficult to maintain the level Vss' of the dummy GND line 30 near the threshold voltage Vthn only by means of the n channel transistor Tr1, in view of drivability. The reason for this is that n channel transistor Tr1 operates near the threshold voltage and has relatively high resistance, with the level Vss' of the dummy GND line 30 being near the threshold voltage Vthn. Accordingly, only at the time of charging/discharging the bit lines or at the time when the bit line is connected to the I/O line because of the change in the column address, n channel transistor Tr2 is rendered conductive by the internally generated signal φ, so as to suppress floating of the potential Vss' of the dummy GND line 30.

Figure 3:
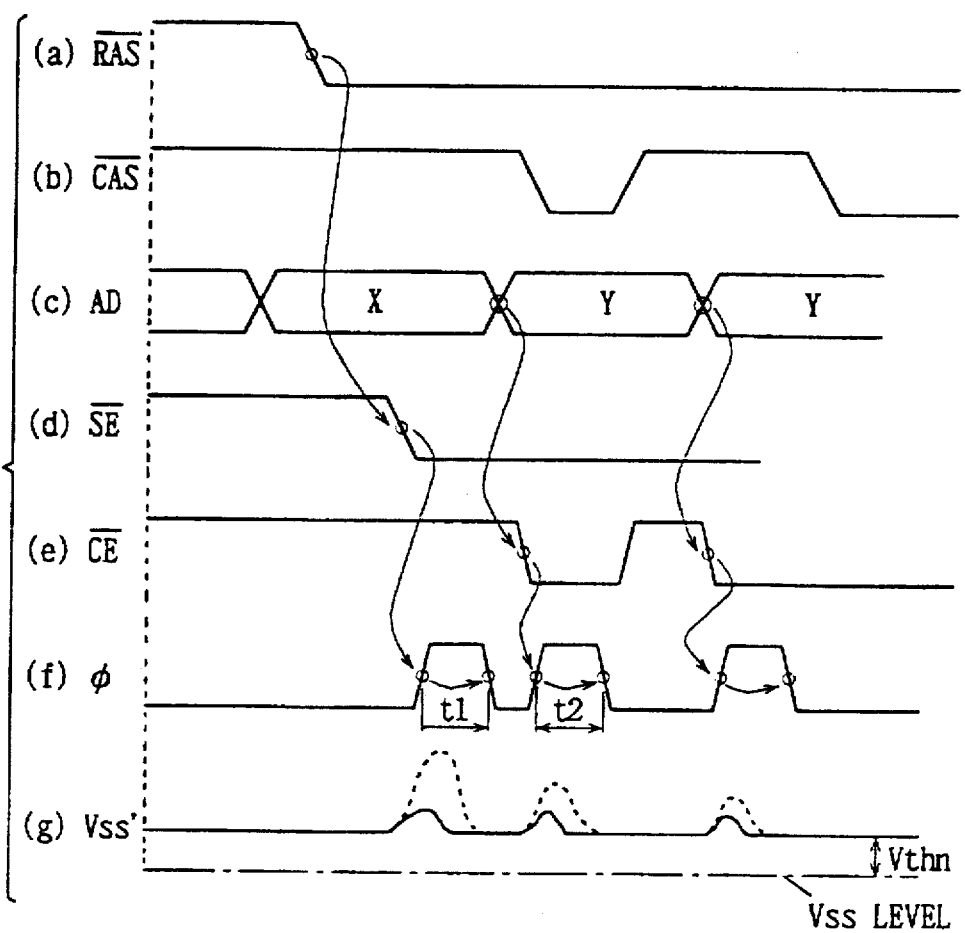
FIG. 3 is a time chart showing the operation of the circuit of FIG. 2.

FIG. 3 is a time chart showing the operation of the example of FIG. 2. The operation of the example of FIG. 2 will be described with reference to FIG. 3. As shown in (a) of FIG. 3, in the standby state in which a row address strobe signal $\overline{RAS}$ is at the "H" level, the internally generated signal φ is at the "L" level as shown in FIG. 3(f). After the row address strobe signal $\overline{RAS}$ falls to the "L" level, a word line is activated by the row address shown in (c) of FIG. 3, information in the memory cell is transmitted to the bit line, a sense amplifier activating signal $\overline{SE}$ attains to the "L" level as shown in (d) of FIG. 3, and the sense amplifier is activated. At this time, the total capacitance of the bit lines connected to the activated word line is charged/discharged. In response to the sense amplifier activating signal $\overline{SE}$, the internally generated signal φ rises to the power supply voltage Vcc, and after the lapse of a prescribed time period t1, falls to the low level of the word lines Vss'. Consequently, in a time period t1, the resistance between the low level of the word lines Vss and the potential Vss' of the dummy GND line is reduced, enabling sensing operation at high speed. In the period t1, though the potential Vss' of the dummy GND line is drawn near to the low level of the word lines Vss', it floats by some extent as shown in (g) of FIG. 3 because of the resistance component of n channel transistor Tr2, since a large current flows for charging/discharging the bit lines. By setting the time t1 such that the amount of floating attains approximately the same level as the threshold voltage Vthn in this period, floating of Vss' caused by n channel transistor Tr2 can be prevented. More specifically, if n channel transistor Tr2 is not connected to dummy GND line 30, the potential Vss' of dummy GND line 30 floats as shown by the dotted line in (g) of FIG. 3. However, because of the function of n channel transistor Tr2, floating can be suppressed as shown by the solid line of (g) of FIG. 3.

After the sensing operation, in a read cycle, a column activating signal $\overline{CE}$ shown in (e) of FIG. 3 is activated by the change in the column address, a column selection line is activated and a specific bit line is connected to an I/O line. The potential of the I/O line flows in to the bit line, and the potential Vss' of dummy GND line 30 floats as shown in (g) of FIG. 3. In this case also, in response to activation of the column activating signal $\overline{CE}$, the internally generated signal φ is set to and kept at the level of the low level of the word lines of a time period t2, as in the case of sense activation. In the write cycle also, the same effect can be obtained by setting the internally generated signal φ to the level of the low level of the word lines Vcc for a period of time corresponding to the timing of writing data from the I/O line to the bit line. Here, as the timing of the internally generated signal φ, sense amplifier activating signal SE and column activating signal $\overline{CE}$ are described as examples in this embodiment. However, any internal signal generated around the timing of the start of sensing operation or connection of I/O line and the bit line may be used to generate the signal φ. The n channel transistor Tr has its gate and drain short-circuited and connected to the dummy GND line 30 and its source connected to the low level of the word lines Vss. However, a p channel transistor having its gate and drain short-circuited and connected to the low level of the word lines Vss and its source connected to the dummy GND line 30 may be used. Though the internally generated signal φ is activated at a timing around the start of operation of the sense amplifier and at a timing around the connection of the I/O line and the bit line in the above embodiment, the signal may be activated at either of these timings.

Figure 4:
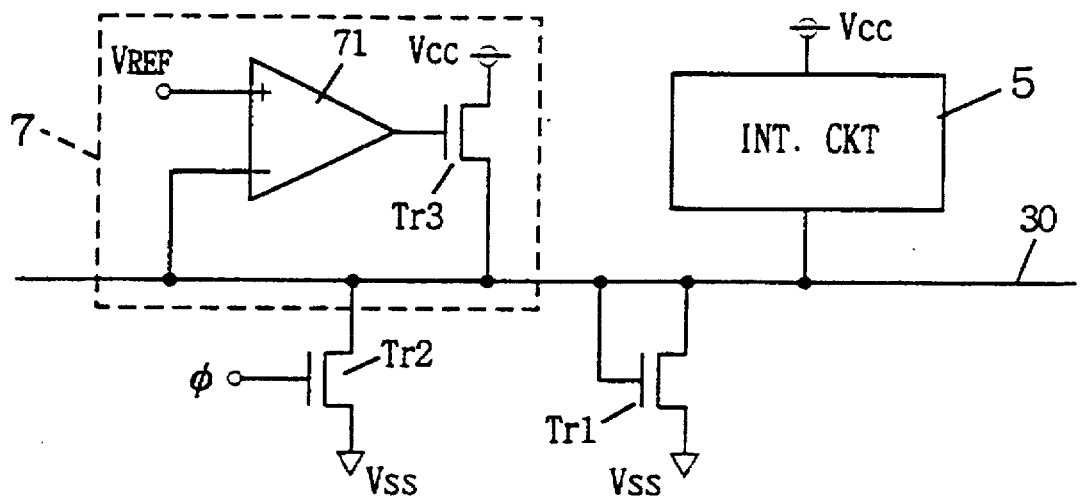
FIG. 4 is a schematic diagram showing a second embodiment in accordance with the first aspect of the present invention.

FIG. 4 is a schematic diagram showing a second embodiment in accordance with the first aspect of the present invention. In this embodiment shown in FIG. 4, a clamp circuit 7 is connected to the dummy GND line 30 in order to prevent lowering of the level of the dummy GND line 30 caused by the operation of n channel transistor Tr2 in the embodiment shown in FIG. 3. Clamp circuit 7 includes a differential amplifying circuit 71 comparing the potential Vss' of the dummy GND line 30 with a reference voltage, and an n channel transistor Tr3 receiving the output from differential amplifying circuit 71 for charging the potential of dummy GND line 30. The n channel transistor Tr3 has its gate connected to the output of differential amplifying circuit 71, its drain connected to the power supply potential Vcc and its source connected to the dummy GND line 30. When the level Vss' of the dummy GND line 30 is lower than the reference voltage, differential amplifying circuit 71 provides a "H" level signal so as to render n channel transistor Tr3 conductive, and provides a "H" level signal from the power supply potential Vcc to dummy GND line 30 to charge the same. If the potential of dummy GND line 30 rises, differential amplifying circuit 71 renders n channel transistor Tr3 non-conductive, and suppresses lowering of the level of dummy GND line 30 caused by the mismatch of the conduction period t1 or t2 of n channel transistor Tr2, which has been described with reference to FIG. 3 above.

Figure 5:
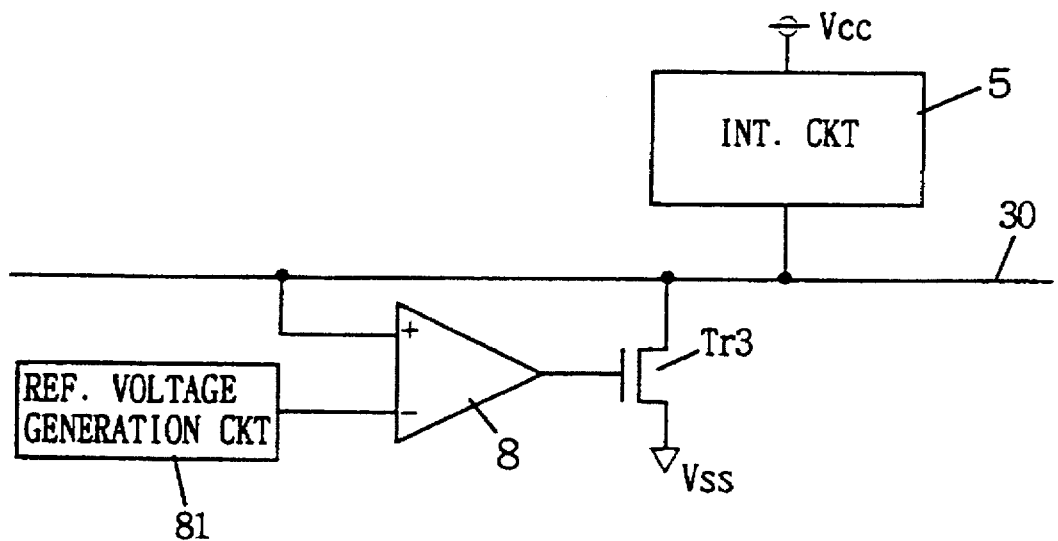
FIG. 5 is a schematic diagram showing a first embodiment in accordance with a second aspect of the present invention.

FIG. 5 shows a first embodiment in accordance with a second aspect of the present invention. The embodiment shown in FIG. 5 includes a reference voltage generating circuit 81 generating a voltage of approximately the same level as that of dummy GND line 30, a differential amplifying circuit 8 for comparing the level of dummy GND line 30 with the reference voltage, and an n channel transistor Tr3 receiving the output from differential amplifying circuit 8. The n channel transistor Tr3 has its gate connected to an output of differential amplifying circuit 8, its drain connected to dummy GND line 30 and its source connected to the low level of the word lines Vss'. In this embodiment, if the level of dummy GND line 30 is higher than the reference voltage output from reference voltage generating circuit 81, a "H" level signal is applied from the differential amplifying circuit 8 to the gate of n channel transistor Tr3. In response, n channel transistor Tr3 is rendered conductive, discharging the potential of dummy GND line 30. When the potential of dummy GND line 30 becomes lower than the reference voltage, differential amplifying circuit 8 stops discharging by n channel transistor Tr3, so that the level of the dummy GND line 30 is maintained at a level Vss' which is higher than the low level of the word lines.

Figure 6:
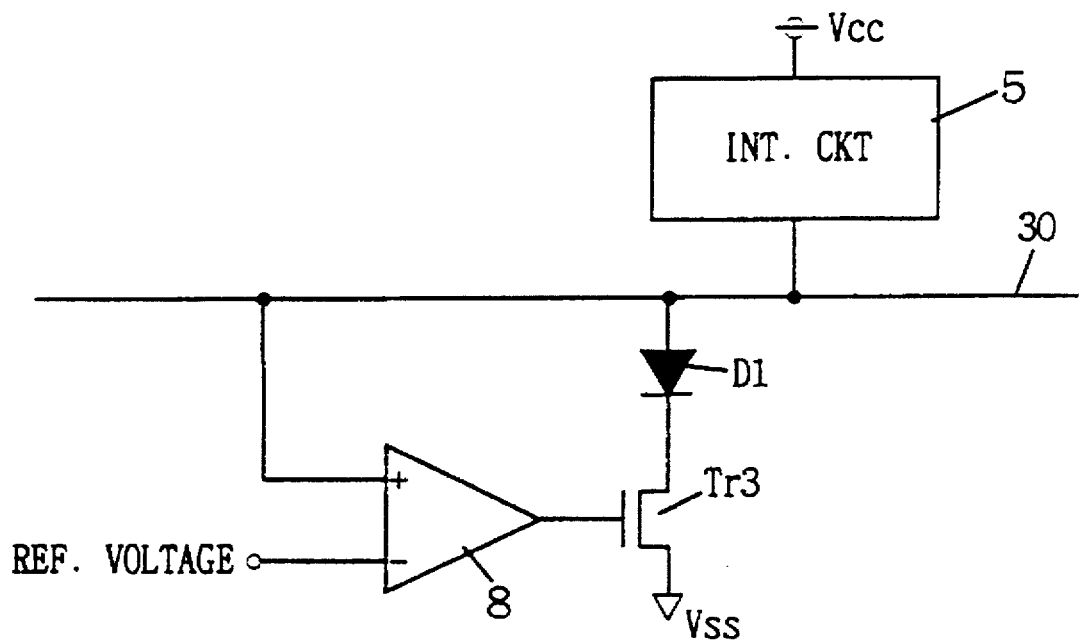
FIG. 6 is a schematic diagram showing a second embodiment in accordance with the second aspect of the present invention.

FIG. 6 is a schematic diagram showing a second embodiment in accordance with a second aspect of the present invention. The embodiment of FIG. 6 is an improvement of the embodiment shown in FIG. 5, preventing lowering of the level of dummy GND line 30 caused by response delay of differential amplifying circuit 8. More specifically, a diode D1 is connected between the drain of n channel transistor Tr3 and the dummy GND line 30. Since diode G1 is connected between the drain of n channel transistor Tr3 and dummy GND line 30, when a small current is flowing through diode D1, dummy GND line 30 is not pulled to the level of the low level of the word lines Vss but elevated by the diffusion potential (of about 0.6V) of the diode D1, and therefore lowering of the level of dummy GND line 30 can be suppressed and stable potential of dummy GND line 30 can be obtained.

Figure 7:
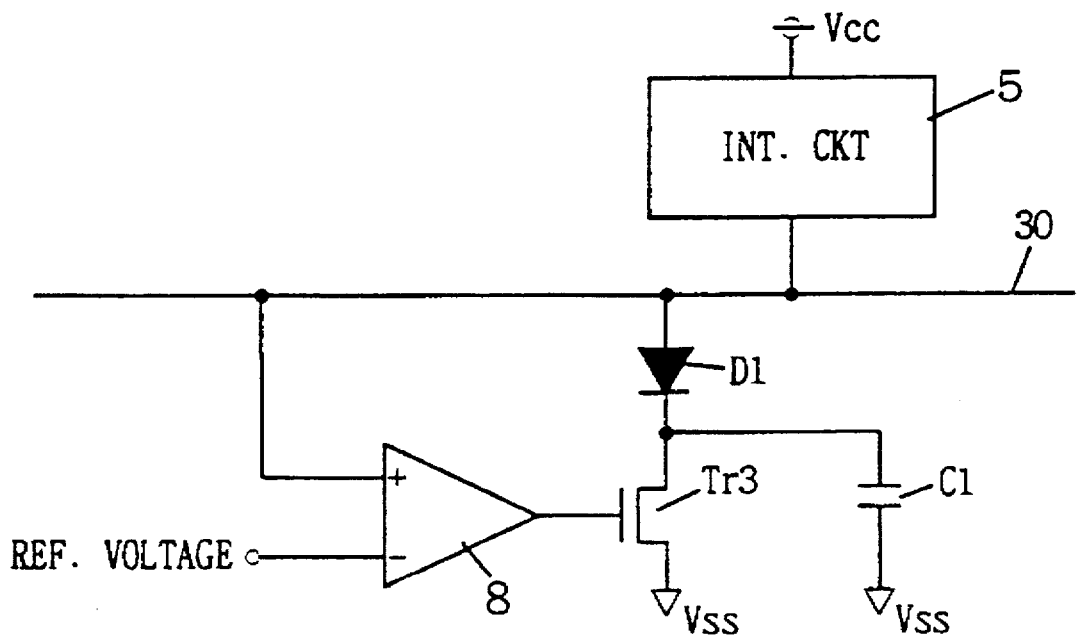
FIG. 7 is a schematic diagram showing a third embodiment in accordance with the second aspect of the present invention.

FIG. 7 is a schematic diagram showing a third embodiment in accordance with a second aspect of the present invention. The embodiment shown in FIG. 7 is an improvement of the embodiment shown in FIG. 6 and lowering of the level of dummy GND line 30 caused by response delay of differential amplifying circuit 8 is suppressed. More specifically, a decoupling capacitor C1 is connected between the low level of the word lines and a node between diode D1 and the drain of n channel transistor Tr3. Generally, a decoupling capacitor should be connected to dummy GND line 30. However, in this example, current change caused by the operation of internal circuit 5 is absorbed by the decoupling capacitor, hindering the compensating effect of diode D1. Accordingly, a decoupling capacitor C1 is connected between the ground and a node between diode D1 and a drain of n channel transistor Tr3 so that the compensation at the diffusion potential by diode D1 is ensured, and lowering of the level of dummy GND line 30 can be suppressed, providing stable potential Vss'.

Figure 8:
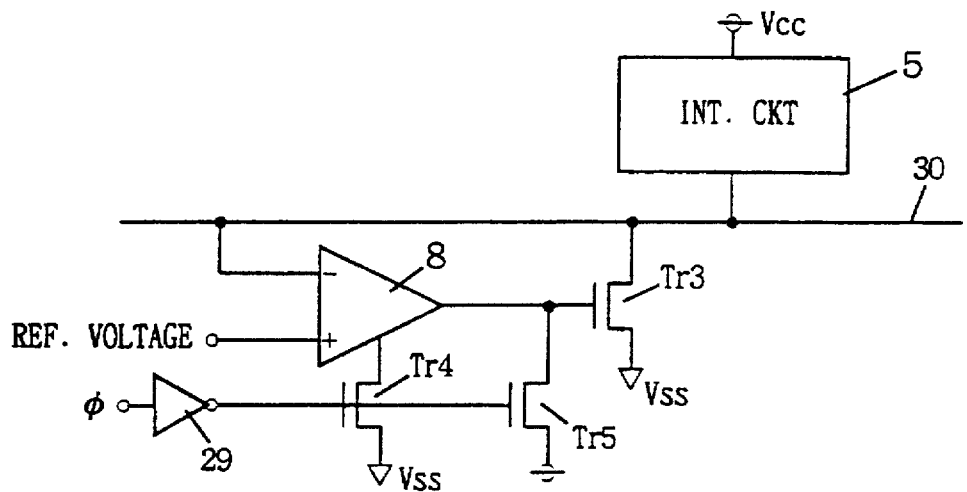
FIG. 8 is a schematic diagram showing a fourth embodiment in accordance with the second aspect of the present invention.

FIG. 8 is a schematic diagram showing a fourth embodiment in accordance with a second aspect of the present invention. This embodiment is an improvement of the embodiment shown in FIG. 5, in which floating of the level of dummy GND line 30 caused by response delay of differential amplifying circuit 8 when a large current is consumed is improved. This embodiment is a combination of the embodiment shown in FIG. 5 and embodiment of FIG. 2. More specifically, a differential amplifying circuit stopping circuit consisting of an n channel transistor Tr4 is connected to differential amplifying circuit 8, and a float preventing circuit consisting of an n channel transistor Tr5 is connected to the gate of n channel transistor Tr3. More specifically, n channel transistor Tr4 has its drain connected to an activation input terminal of differential amplifying circuit 8, and its source grounded. The n channel transistor Tr5 has its drain connected to the power supply potential Vcc, and its source connected to the gate of n channel transistor Tr3. Internally generated signal is inverted by an inverter 29 and applied to the gates of n channel transistors Tr4 and Tr5.

Figure 9:
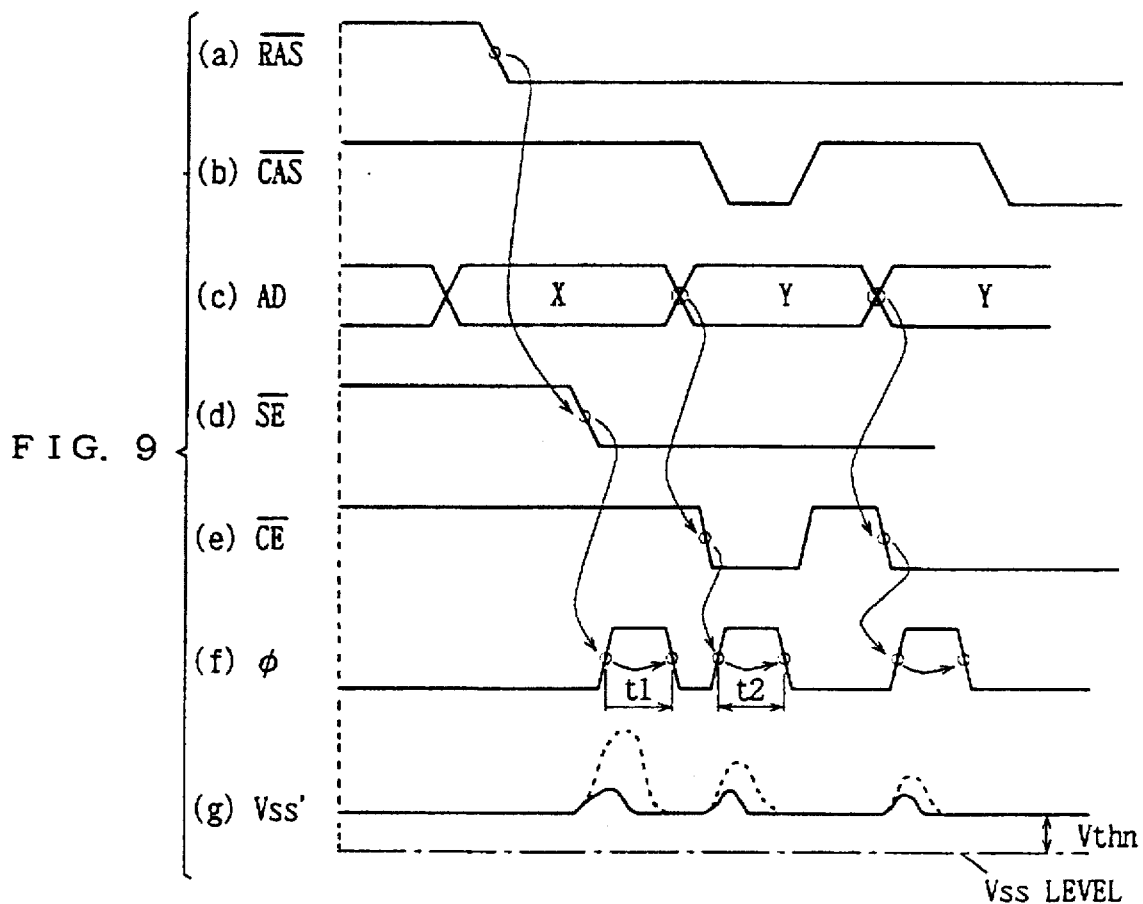
FIG. 9 is a time chart showing the operation of the circuit shown in FIG. 8.

FIG. 9 is a time chart showing the operation of the embodiment of FIG. 8. The operation of the embodiment shown in FIG. 8 will be described with reference to FIG. 9. At a timing when large current flows in the memory cell array, that is, when sensing operation is started or when the I/O line is connected to the bit line, upon reception of sense amplifier activating signal $\overline{SE}$ shown in (d) of FIG. 9 or column activating signal $\overline{CE}$ shown in (e) of FIG. 9, an internally generated signal φ shown in (f) of FIG. 9 is inverted by a inverter 9, and n channel transistor Tr4 is rendered conductive, so that operation of differential amplifying circuit 8 is stopped. When internally generated signal φ attains to the "L" level, n channel transistor Tr5 is rendered conductive, a "H" level signal is forcefully applied to the gate of n channel transistor Tr3 from power supply potential Vcc, forcing the operation of n channel transistor Tr3, so that floating of dummy GND line 30 is prevented.

Figure 10:
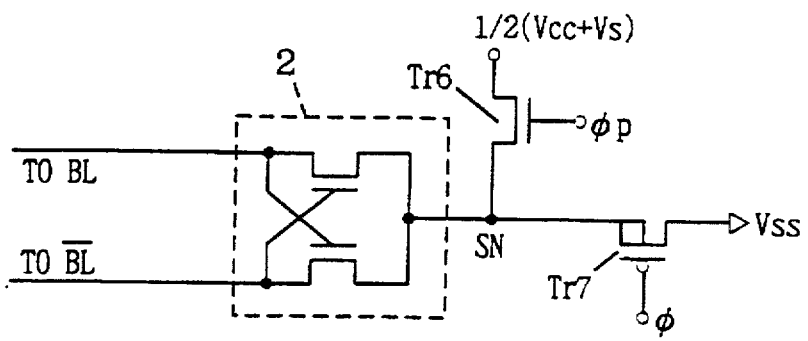
FIG. 10 is a schematic diagram showing a first embodiment in accordance with a third aspect of the present invention.

FIG. 10 is a schematic diagram showing a first embodiment in accordance with a third aspect of the present invention. The embodiment of FIG. 10 is adapted such that when a sense amplifier drive line SN of sense amplifier 2 is at "L" level, the level of the dummy GND line 30 is set to a potential Vss' which is higher than the ground potential Vss.

Figure 101:
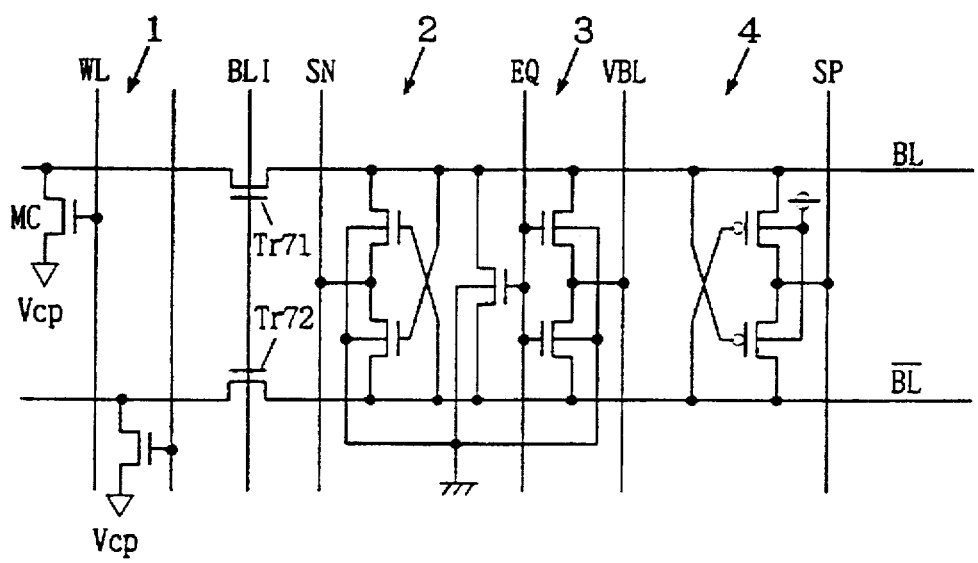
FIG. 101 is a schematic diagram of a conventional semiconductor memory cell array.
Figure 102:
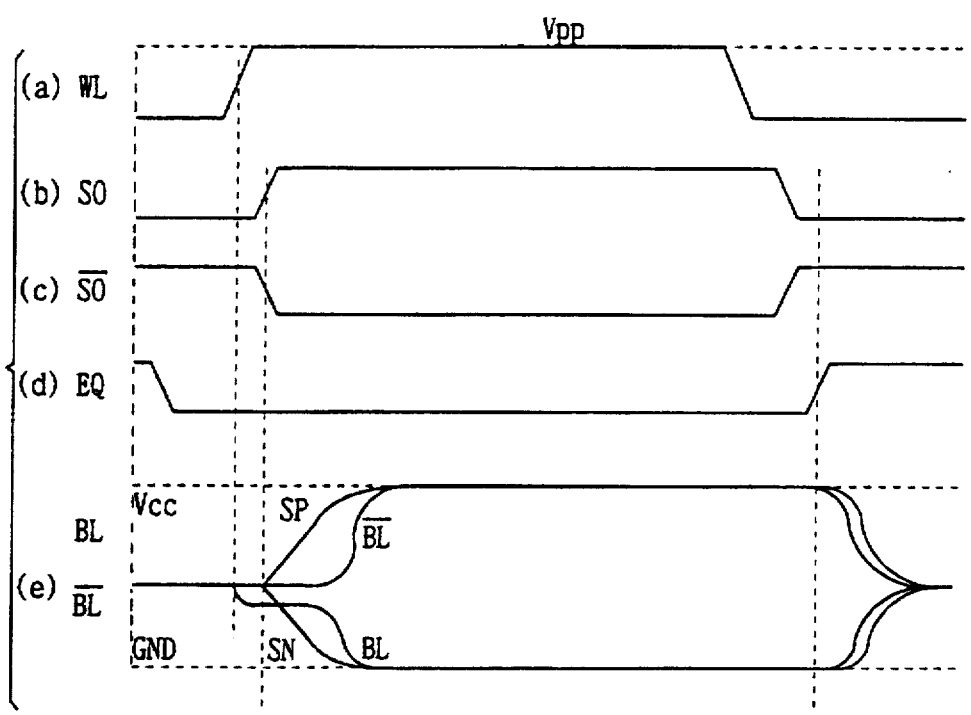
FIG. 102 is a time chart showing the operation of the memory cell array shown in FIG. 101.

Generally, in the reading operation of a DRAM, after the fall of a row address strobe signal $\overline{RAS}$, a word line WL is activated by a row address, information in the memory cell is transmitted to the bit line BL and amplified by sense amplifier 2, as already described with reference to FIG. 101. Sense amplifiers 2 and 4 are basically formed by n and p channel two sense amplifiers as shown in FIG. 101 and in each of the sense amplifiers 2 and 4, gates and drains of two transistors are cross coupled and the sources are connected together, and this commonly connected node is connected to the ½ (Vcc+Vs) line through an n channel transistor Tr6. When n channel transistor Tr6 is rendered conductive, sensing operation starts, the small potential difference of the bit line BL is activated to the level of the power supply line, and re-writing is performed to the memory cell. In this embodiment shown in FIG. 10, a p channel transistor Tr7 is connected between sense amplifier drive line SN and the low level of the word lines Vss'. The potential of sense amplifier drive line SN is adapted not to be lower than the threshold Vthp of p channel transistor Tr7. The internally generated signal φ is applied to the gate of p channel transistor Tr7.

Figure 11:
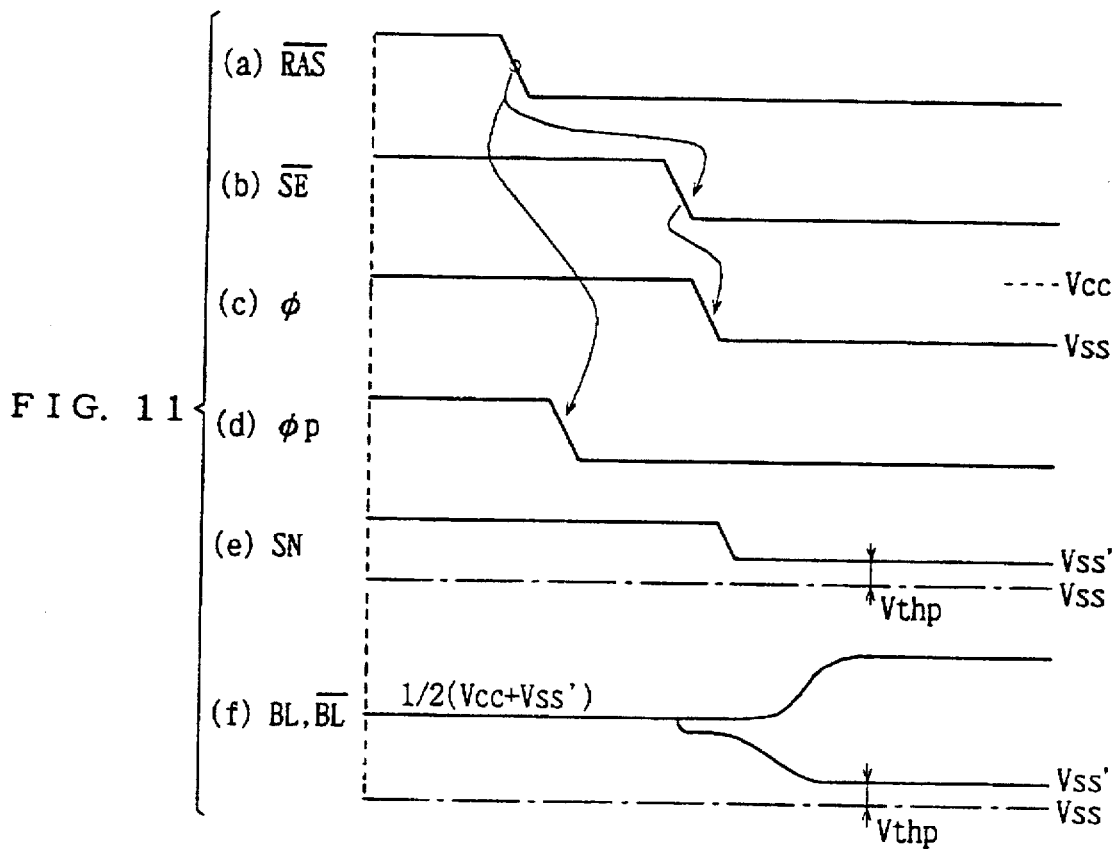
FIG. 11 is a time chart showing the operation of the embodiment shown in FIG. 10.

FIG. 11 is a time chart showing the operation of FIG. 10. Referring to FIG. 11, the operation of the embodiment shown in FIG. 10 will be described. At the standby state, referring to (a) of FIG. 11, row address strobe signal $\overline{RAS}$ is at the "H" level, and therefore, internally generated signal φP is at the "H" level, as shown in (d) of FIG. 11. Since internally generated signal φp is applied to the gate of n channel transistor Tr6, n channel transistor Tr6 is rendered conductive, and sense amplifier drive line SN is precharged to the level of ½ (Vcc+Vthp). When row address strobe signal $\overline{RAS}$ falls to "L" and sense amplifier activating signal $\overline{SE}$ falls to the "L" level as shown in (b) of FIG. 11, internally generated signal φ attains to the "L" level. In response to the internally generated signal φ, p channel transistor Tr7 is rendered conductive, and sensing operation starts. When the level of sense amplifier drive line SN attain to approximately the same level as the threshold voltage Vthp of p channel transistor Tr7, it is rendered nonconductive, the final level of the sense amplifier 2 on the side of "L" level reaches the threshold voltage Vthp, and the "L" level written to the memory cell is equivalent to the threshold voltage Vthp.

Figure 12:
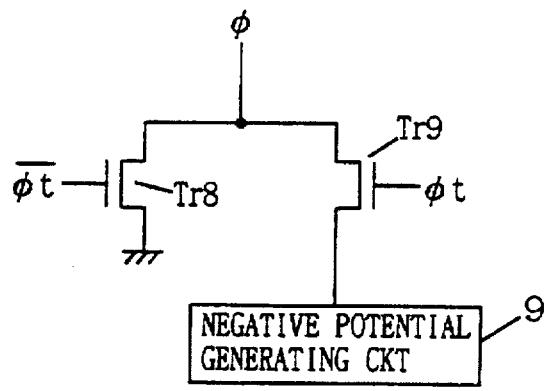
FIG. 12 is a schematic diagram showing a second embodiment in accordance with the third aspect of the present invention.

FIG. 12 is a schematic diagram showing a second embodiment in accordance with a third aspect of the present invention. The embodiment of FIG. 12 is an improvement of the embodiment shown in FIG. 10. In this embodiment, improvement is made to prevent floating of the voltage of sense amplifier drive line SN caused by p channel transistor Tr7 operating near the threshold voltage and as a result having higher resistance, when large current is consumed. More specifically, internally generated signal φ applied to the gate of p channel transistor Tr7 is generated from a switching circuit shown in FIG. 12. The switching circuit includes n channel transistors Tr8 and Tr9. To the gate of n channel transistor Tr8, a control signal $\overline{\phi t}$ is applied which signal is at the "H" level only for a period t1 from the fall of sense amplifier activating signal $\overline{SE}$ to the "L" level and at the "L" level except that period. To the gate of n channel transistor Tr9, a control signal φt is applied which signal is at the "L" level only for the period t1 and except this period at "H" level. The n channel transistor Tr8 has its source grounded, and n channel transistor Tr9 receives at its drain a negative voltage −Vb from negative potential generating circuit 9. In order to obtain much improvement, the negative voltage −Vb should preferably be selected to be larger than the threshold voltage Vthp of p channel transistor Tr7 of FIG. 10. The drain of n channel transistor 8 and the source of n channel transistor Tr9 are commonly connected to the gate of p channel transistor Tr7 of FIG. 10.

Figure 13:
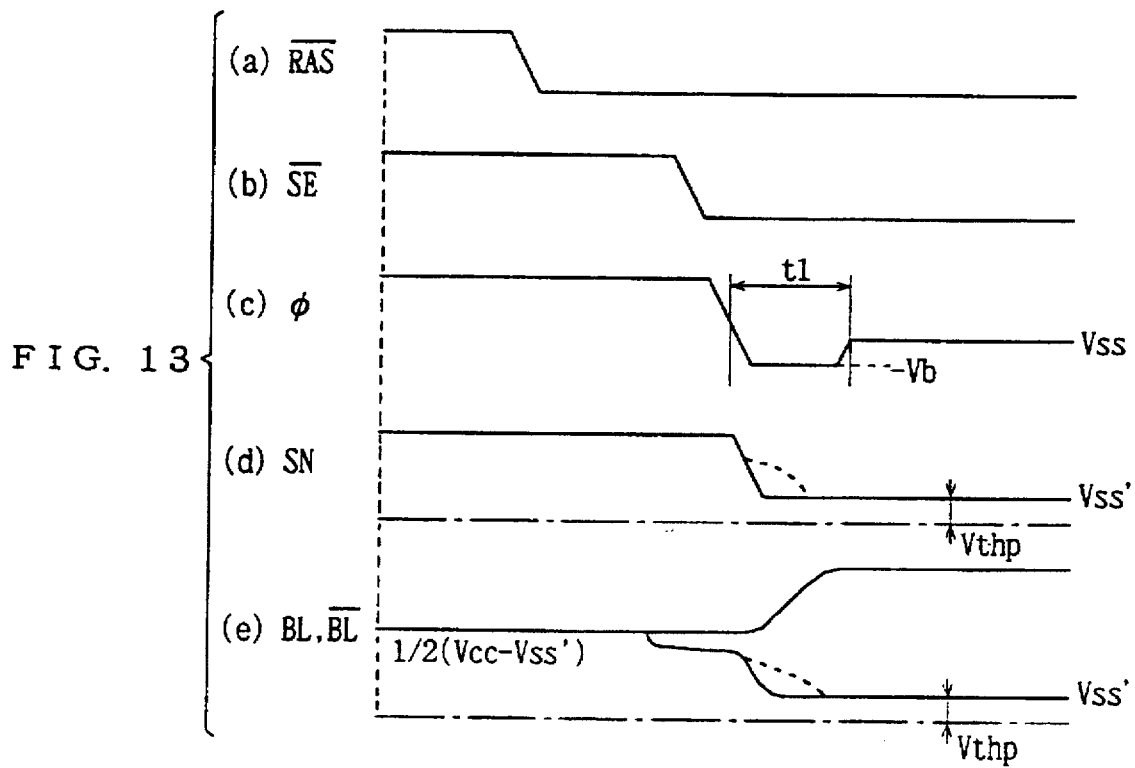
FIG. 13 is a time chart showing the operation of the embodiment of FIG. 12.

FIG. 13 is a time chart showing the operation of the circuit of FIG. 12. Referring to FIG. 13, the operation of the embodiment shown in FIG. 12 will be described. When sense amplifier activating signal $\overline{SE}$ falls to the "L" level as shown in (b) of FIG. 13, control signal φt rises to "H" level, and n channel transistor Tr9 is rendered conductive. Consequently, the negative voltage −Vb is applied to the gate of p channel transistor Tr7 of FIG. 10 as the internally generated signal φ. This facilitates conduction of p channel transistor Tr7, reduces resistance, and therefore floating of sense amplifier drive line SN can be prevented. More specifically, when an internally generated signal φ of which "L" level is the low level of the word lines Vss is applied as shown in (c) of FIG. 11 to the gate of p channel transistor Tr7 shown in FIG. 10, the wave of sense amplifier drive line SN falling from "H" level to "L" level becomes moderate as shown by the dotted line of (d) of FIG. 13, and accordingly, the potential of bit lines BL, $\overline{BL}$ fall moderately as shown by the dotted line of (e) of FIG. 13, hindering high speed operation. By contrast, as the negative potential −Vb is applied to the gate of p channel transistor Tr7 only for the period t1 at the start of sensing at which period a large current flows, by means of the switch circuit of the embodiment shown in FIG. 12, the sense amplifier drive line SN can be steeply lowered as shown in (d) of FIG. 13, realizing higher speed of operation. After the lapse of time t1, n channel transistor Tr8 is rendered conductive by control signal $\overline{\phi t}$, and internally generated signal φ attains to the level of the low level of the word lines Vss.

Figure 14:
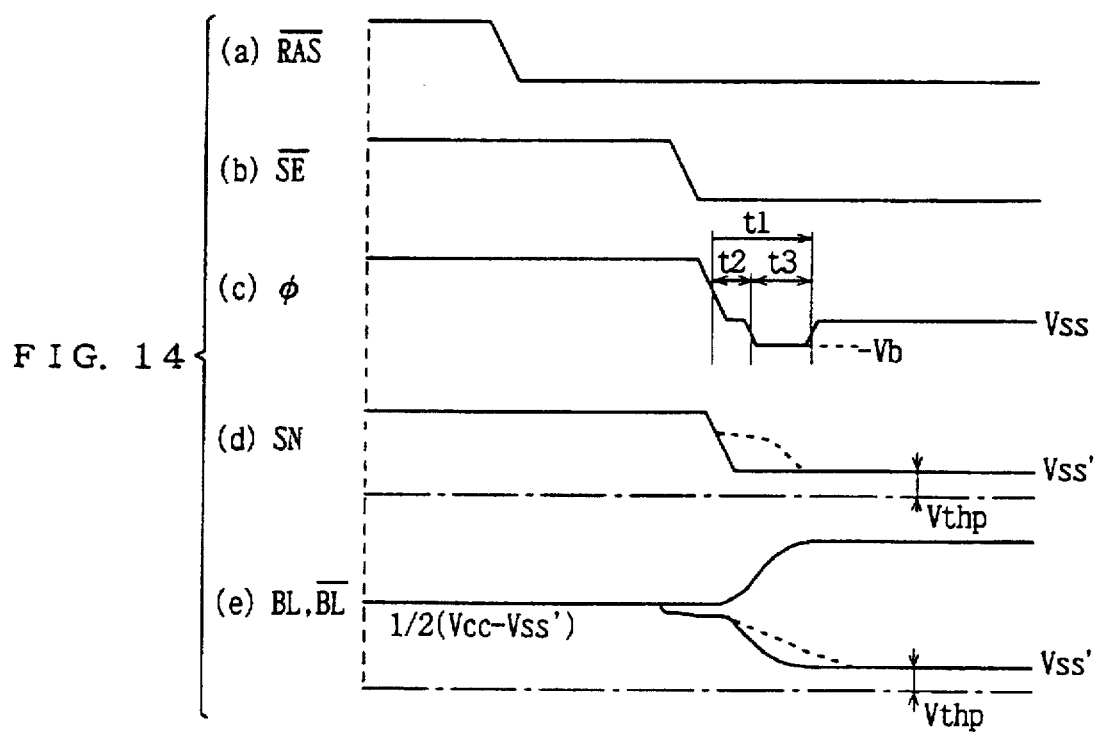
FIG. 14 is a time chart showing operation of a third embodiment in accordance with the third aspect of the present invention.

FIG. 14 is a time chart showing a third embodiment in accordance with a third aspect of the present invention. This embodiment is a further improvement of FIG. 13, in which floating of sense amplifier drive line SN caused by high resistance of p channel transistor Tr7 of FIG. 10 is further suppressed. More specifically, of the period t1 at the start of sensing operation when a large current flows, the internally generated signal φ is kept at the level of the low level of the word lines Vss of the former half period t2, and kept at the negative potential −Vb level only for the latter half period t3. Therefore, to the gate of n channel transistor Tr8 shown in FIG. 12, a control signal $\overline{\phi t}$ which is kept at the "H" level only the period t2 and after the period t1 is applied. In this embodiment, since the period in which the negative potential −Vb is applied to the gate of p channel transistor Tr7 can be made shorter than in the embodiment of FIG. 12, load of the negative potential generating circuit 9 can be reduced.

Figure 15:
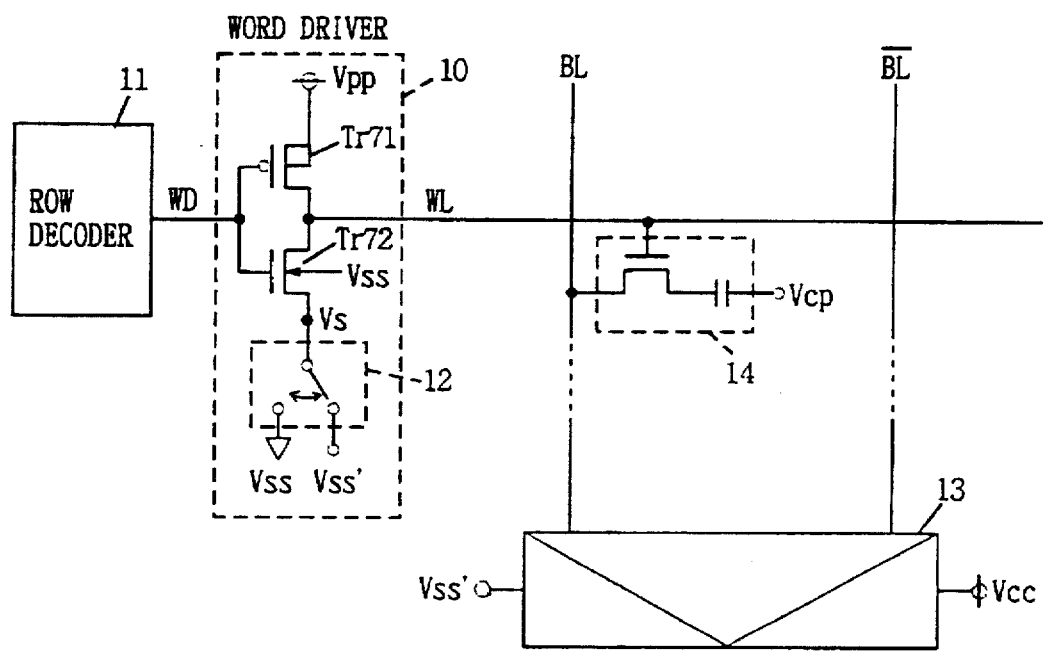
FIG. 15 is a schematic diagram showing a first embodiment in accordance with a fourth aspect of the present invention.
Figure 16:
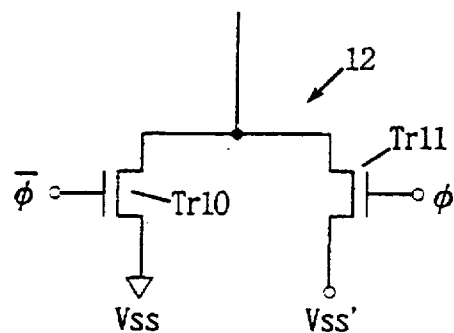
FIG. 16 shows an example of a switch circuit shown in FIG. 15.

FIG. 15 is a schematic diagram showing a first embodiment in accordance with a fourth aspect of the present invention. In the embodiment shown in FIG. 15, a circuit generating a dummy GND level signal is provided in the semiconductor substrate and the sense amplifier amplifies the bit line potential between the power supply potential Vcc and the dummy GND line 30, wherein the ground level of a word drive circuit driving the word line is adapted to be switched between the low level of the word lines Vss and the level Vss' of the dummy GND line 30 by means of switching circuit 12. More specifically, row decoder 11 decodes a row address signal and applies the decoded word signal to a word driver 10. Word driver 10 includes a p channel transistor 71 and an n channel transistor 72, and to the gates of p channel transistor 71 and n channel transistor 72, the word signal is applied from row decoder 11. To the drain of p channel transistor 71, a boosted voltage Vpp is applied, and the source of p channel transistor 71 and the drain of n channel transistor 72 are connected to a word line WL. The n channel transistor 72 has its source connected to switch circuit 12, and switch circuit 12 switches the low level of the word lines Vss and the potential Vss' of dummy GND line 30. Switch circuit 12 includes n channel transistors Tr10 and Tr11 as shown in FIG. 16. To the gate of n channel transistor Tr10, the internally generated signal $\bar{\phi}$ is applied, and to the gate of n channel transistor Tr11, the internally generated signal $\phi$ is applied. The drains of n channel transistors Tr10 and Tr11 are connected to the source of n channel transistor Tr72 shown in FIG. 15. The n channel transistor Tr10 has its source connected to the low level of the word lines Vss, and n channel transistor Tr11 has its source connected to the potential Vss' of dummy GND line 30.

At a crossing between word line WL and bit line BL, a memory cell 14 is connected, and the bit lines BL and $\overline{BL}$ are connected to a sense amplifier 13. The power supply voltage Vcc and the potential Vss of dummy GND line 30 are applied to sense amplifier 13.

Figure 17:
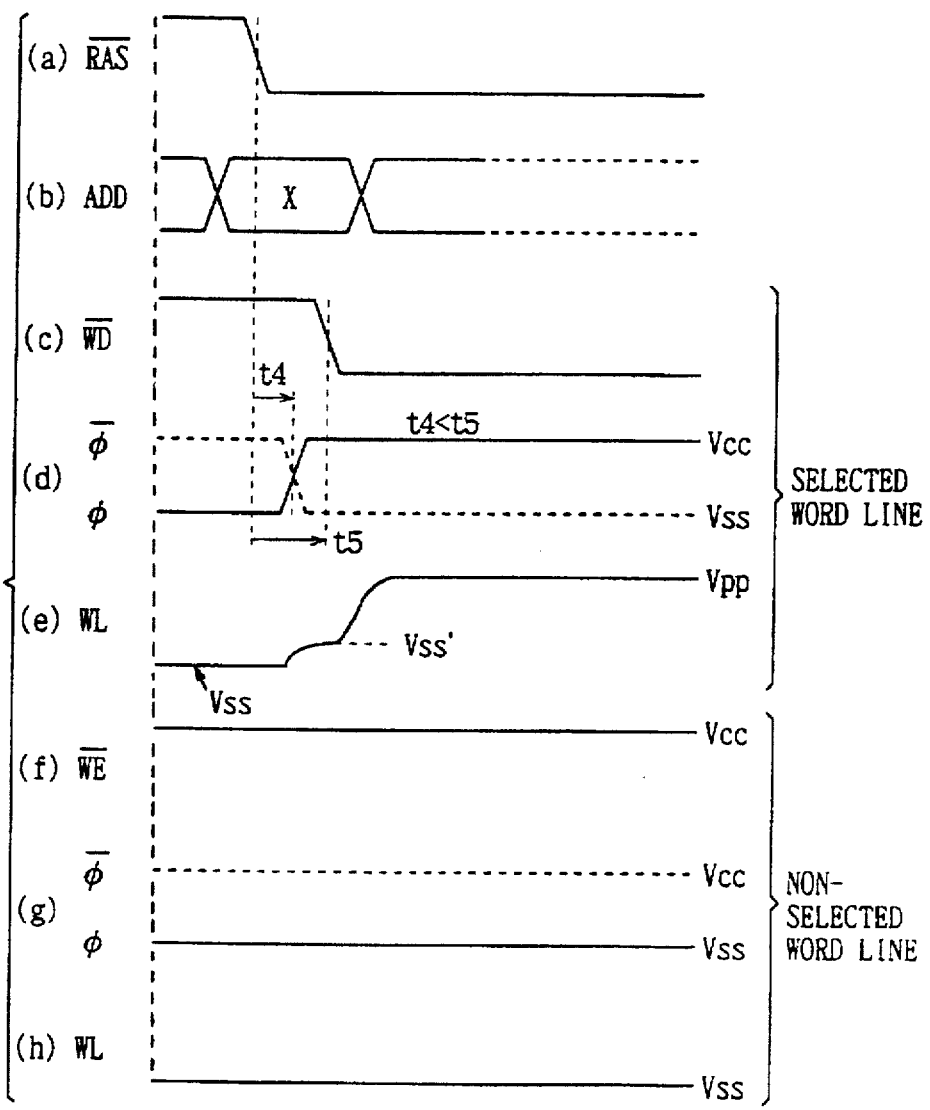
FIG. 17 is a time chart showing operation of the embodiment of FIG. 15.

FIG. 17 is a time chart showing the operation of the embodiment of FIG. 15. Referring to FIG. 15, the operation of the embodiment of FIG. 15 will be described. When a row address signal shown in (b) of FIG. 17 is applied to row decoder 11, a word line drive signal WD is applied from row decoder 11 to word driver 10. At this time, the internally generated signal $\phi$ applied to switch 12 is at the "L" level as shown in (d) of FIG. 17, and $\bar{\phi}$ is at the "H" level. Therefore, switch circuit 12 applies the low level of the word lines Vss to the source of n channel transistor Tr72. After the row address strobe signal $\overline{RAS}$ attains to the "L" level as shown in (a) of FIG. 17, after the lapse of time t4 but before the time t5 at which word lie drive signal falls to "L" level, the internally generated signal $\phi$ attains to "H" level and $\bar{\phi}$ attains to "L" level. Consequently, switch circuit 12 applies the potential Vss' of dummy GND line 30 to the source of n channel transistor Tr72. As a result, as shown in (e) of FIG. 17, word line WL rises at first from the low level of the word lines Vss to the potential Vss' of the dummy GND line 30, and then boosted to the boosted voltage Vpp.

Meanwhile, since the low level of the word lines of a non-selected word driver, not shown, is still at Vss, the non-selected word line is maintained at the Vss level.

Since word line WL is first raised from the level of the low level of the word lines Vss to the potential Vss' of dummy GND line 30 and then raised to the boosted voltage Vpp as shown in (e) of FIG. 17, the load of driving with the boosted power supply Vpp can be reduced and the word line WL can be raised at high speed.

Figure 18:
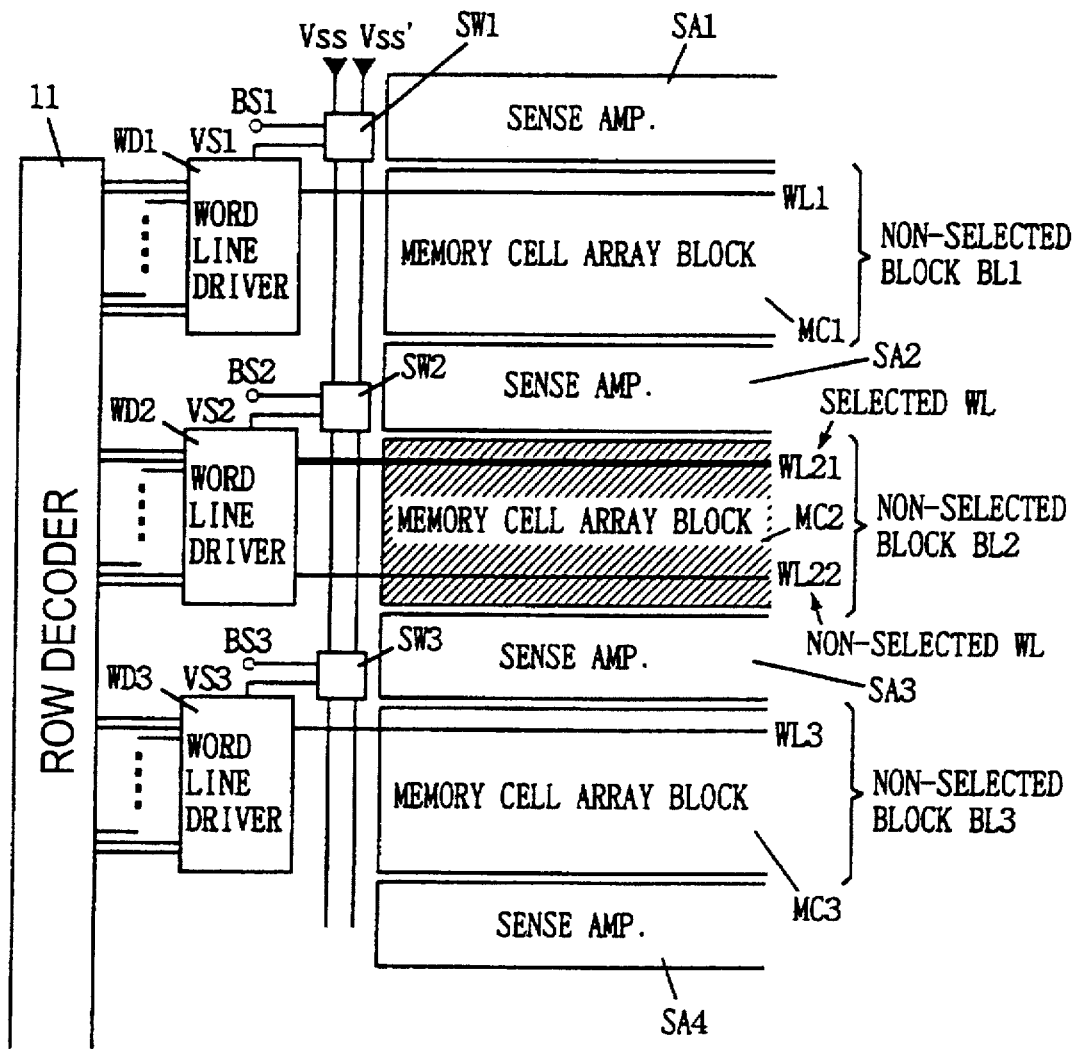
FIG. 18 is a block diagram showing a second embodiment in accordance with the fourth aspect of the present invention.

FIG. 18 is a block diagram showing a second embodiment in accordance with the fourth aspect of the present invention. Different from the embodiment shown in FIG. 15 in which the low level of the word lines of the selected word driver only is switched to the potential Vss' of the dummy GND line 30, in this embodiment shown in FIG. 18, the low level of the word lines of a word driver group including the selected word driver is switched to the potential Vss' of the dummy GND line 30, so as to reduce the number of switch circuits. More specifically, there are a plurality of memory cell array blocks MC1, MC2 and MC3 respectively arranged between sense amplifiers SA1, SA2, SA3 and SA4 and word drivers WD1 to WD3 are provided corresponding to memory cell array blocks MC1 to MC3, respectively. A word line drive signal is applied from row decoder 11 to these word drivers WD1 to WD3. Word drivers WD1 to WD3 drive word lines of the corresponding memory cell array blocks MC1 to MC3. Further, in order to switch the low level of the word lines of each word driver WD1 to WD3 between Vss and the potential Vss' of the dummy GND line 30, switch circuits SW1 to SW3 are provided, each of which switch circuits SW1 to SW3 is independently selected by block selecting signals VS1 to VS3.

Figure 19:
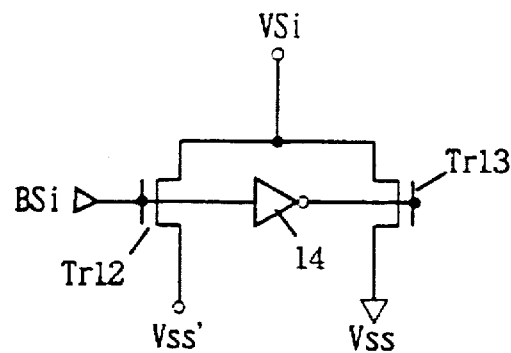
FIG. 19 is a schematic diagram showing an example of a switch circuit shown in FIG. 18.

FIG. 19 is a schematic diagram showing an example of the switch circuit shown in FIG. 18. The switch circuits SW1 to SW3 shown in FIG. 18 each include n channel transistors Tr12 and Tr13 and an inverter 14 as shown in FIG. 19. A block selecting signal BSi is applied to the gates of n channel transistors Tr12 and Tr13, and the drains of these transistors are commonly connected to the ground line VSi of word driver WDi. The n channel transistor Tr12 has its source connected to the potential Vss' of dummy GND line 30, and n channel transistor Tr13 has its source connected to the low level of the word lines Vss.

Figure 20:
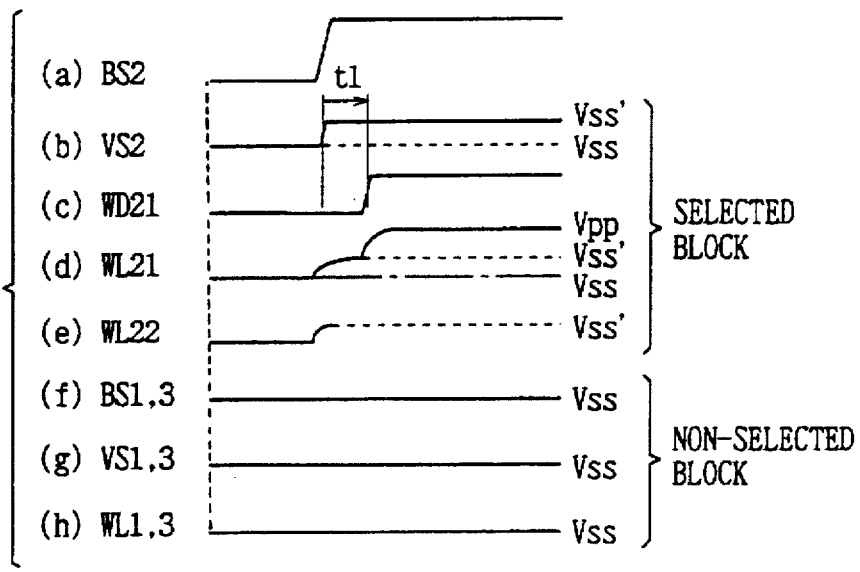
FIG. 20 is a time chart showing the operation of the embodiment shown in FIG. 18.

FIG. 20 is a time chart showing the operation of FIG. 18. Referring to (a) of FIG. 20, when a word driver WD2 is selected by block selecting signal BS2, the ground line of word driver WD2 is raised from the low level of the word lines Vss to the potential Vss' of dummy GND line 30 as shown in (b) of FIG. 20. Before the word line driving signal WD21 from row decoder 11 rises to the "H" level at the timing shown in (c) of FIG. 20, the word line WL21 and non-selected word line WL22 connected to word driver WD2 are raised to the potential Vss' of dummy GND line 30 from the low level of the word lines Vss, as shown in (d) of FIG. 20. When the word line driving signal WD21 is raised to "H", only the word line WL21 is raised to the boosted voltage Vpp. At this time, referring to (e) of FIG. 20, the non-selected word line WL22 is maintained at the potential Vss' of the dummy GND line, and therefore disturb refresh characteristic is not degraded.

Since block selection signals BS1 and BS3 are at the "L" level as shown in FIG. 20(f), word drivers WD1 and WD3 are not selected, the ground lines thereof are maintained at the low level of the word lines Vss as shown in (g) of FIG. 20, and word lines WL1 and WL3 are also maintained at the low level of the word lines Vss as shown in (h) of FIG. 20.

In the embodiment shown in FIG. 18, memory cell array blocks MC1 to MC3 divided by sense amplifiers SA1 to SA4 have been described as an example. However, the low level of the word lines may be switched in any other arbitrary blocks.

Figure 21:
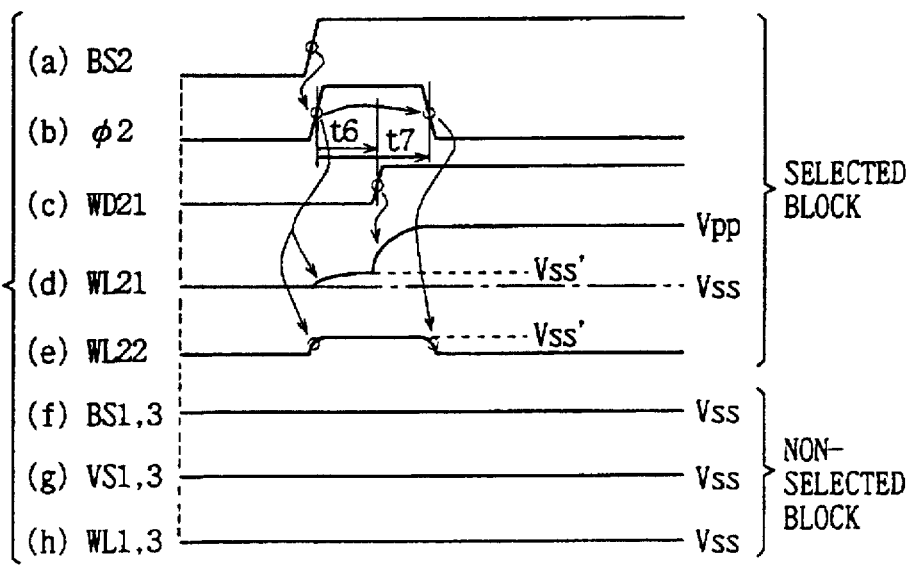
FIG. 21 is a time chart showing an operation of a third embodiment in accordance with the fourth aspect of the present invention.

FIG. 21 is a time chart showing the operation of a third embodiment in accordance with the fourth aspect of the present invention. In the embodiment shown in FIG. 18, when the "L" level of all the word lines in the selected block attains to the potential Vss' of dummy GND line 30, the disturb refresh characteristic of the memory cell connected to the non-selected word line in the selected block is degraded. The embodiment shown in FIG. 21 addresses this problem. More specifically, referring to (a) of FIG. 21, in response to the rise of block selection signal BS2, an activating signal $\phi2$ of the switch circuit attains to and kept at "H" only in the period t7 as shown in (b) of FIG. 21. As the activating signal $\phi2$ rises, the "L" level of the word line in the selected block attains to the potential Vss' of the dummy GND line 30. After the lapse of time t1 from the rise of the block selecting signal BS2, a specific word driver WD2 is activated, and the selected word line WL21 is raised to the boosted voltage Vpp level. When the activating signal φ2 falls after the lapse of time t2, the level of the non-selected word line WL22 returns from the potential Vss' of the dummy GND line 30 to the low level of the word lines Vss. Accordingly, degradation of the disturb refresh characteristic of the memory cell connected to the non-selected word line in the selected block can be prevented.

Figure 22:
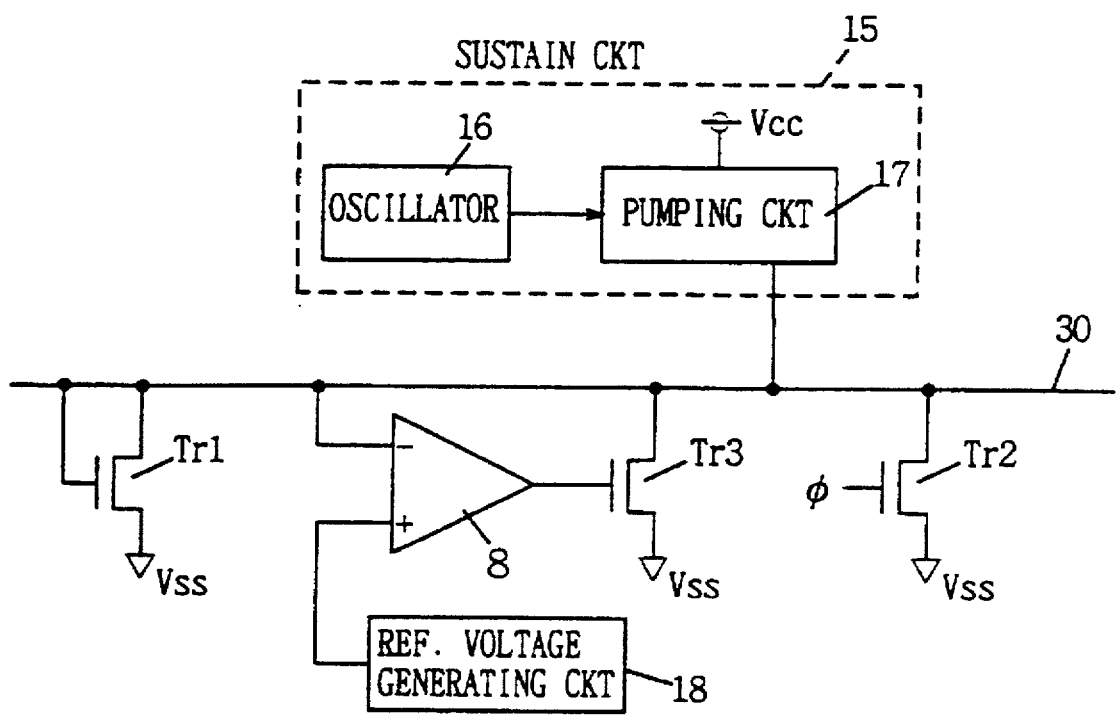
FIG. 22 is a schematic diagram showing a first embodiment in accordance with a fifth aspect of the present invention.

FIG. 22 is a schematic diagram showing a first embodiment in accordance with a fifth aspect of the present invention. This embodiment is a combination of embodiments of FIGS. 4 and 5, additionally including a sustain circuit 15 for compensating level lowering of sub threshold current or the like cause by leakage, for example. To dummy GND line 30, n channel transistors Tr1 and Tr2 are connected similar to the embodiment of FIG. 4, and n channel transistor Tr3 and differential amplifying circuit 8 shown in FIG. 5 are connected. A sustain circuit 15 is further connected to the dummy GND line 30. Sustain circuit 15 includes an oscillator 16 and a pumping circuit 17, and in response to an oscillating signal generated by oscillator 16, pumping circuit 17 intermittently supplies the power supply voltage Vcc to the dummy GND line 30.

The operation of the embodiment shown in FIG. 22 will be described. At the standby state, from a diode connected n channel transistor Tr1, the level of the threshold voltage Vthn of the n channel transistor Tr1 is provided to the dummy GND line 30. In response to an oscillating output from oscillator 16, the sustain circuit connected to the dummy GND line 30 supplies, by means of the pumping circuit 17, the power supply Voltage Vcc intermittently to the dummy GND line 30, so as to compensate for the lowering of the level of the sub threshold current or the like caused by the leakage.

In the active state, only during the sense amplifier operation in which large current is consumed, n channel transistor Tr is rendered conductive, resistance of the sensing power supply line is lowered, and floating of the dummy GND line 30 is controlled so as to increase the speed of operation of the sensing operation. In the active period, other than the sense amplifier operating period, differential amplifying circuit 8 is activated so as to compensate for the floating of the dummy GND line 30 caused by charges flowing in from the I/O line resulting from operation of the column circuitry and to maintain stable potential Vss'. By this combination, it becomes possible to realize lower power consumption and generation of stable potential Vss' higher than the low level of the word lines at the dummy GND line 30.

Figure 23:
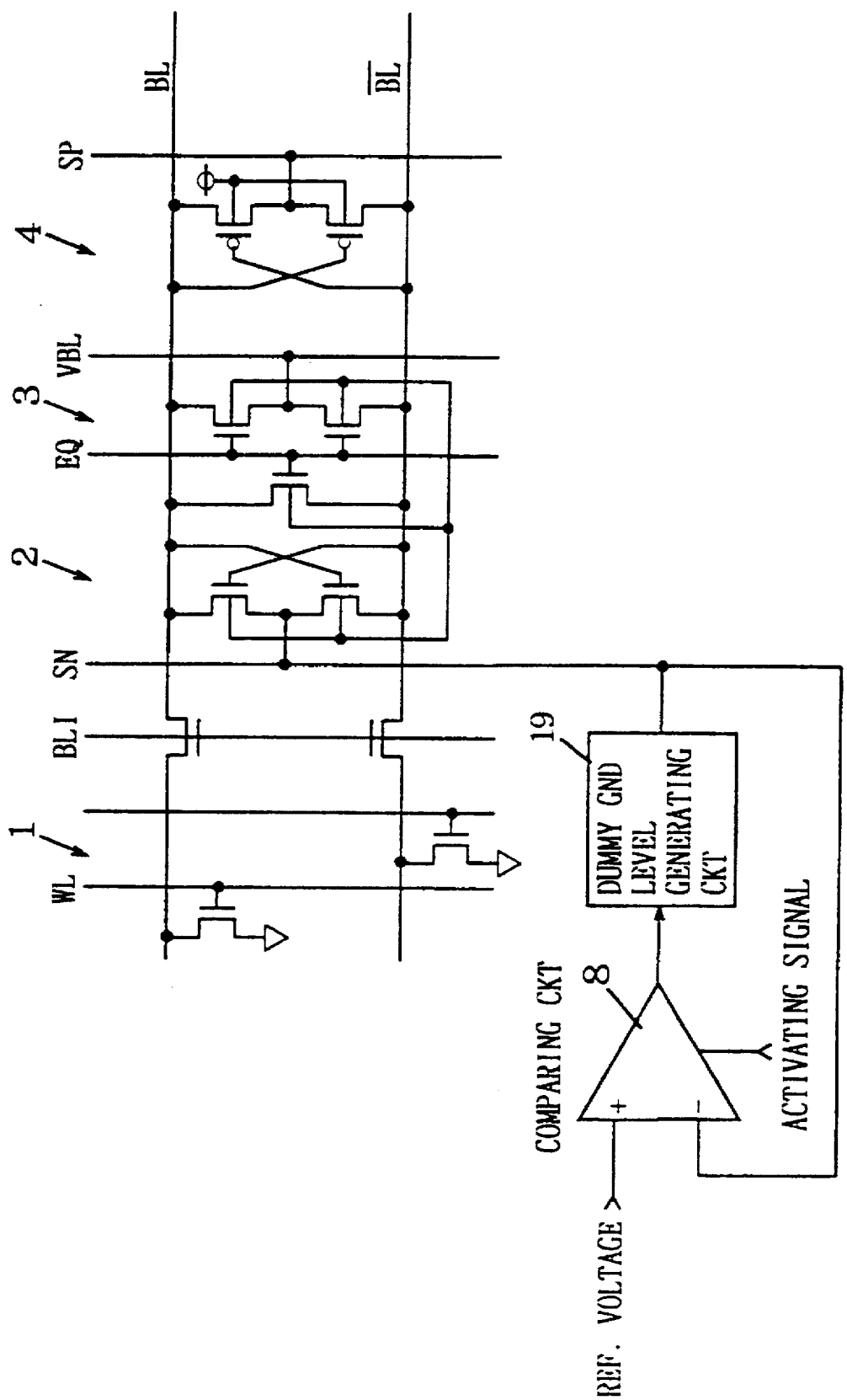
FIG. 23 is a schematic diagram showing a first embodiment in accordance with a sixth aspect of the present invention.

FIG. 23 is a schematic diagram showing a first embodiment in accordance with a sixth aspect of the present invention. In this embodiment shown in FIG. 23, when the sense drive line SN for activating a sense amplifier in the array circuit shown in FIG. 101 is at the "L" level, it is set to the potential Vss' of the dummy GND potential which is higher than the low level of the word lines. For this purpose, a comparing circuit 8 and a dummy GND level generating circuit 19 is provided and, from the output of comparator circuit 8, the dummy GND potential Vss' is generated from dummy GND level generating circuit 19 and applied to sense drive line SN. Comparing circuit 8 compares the level of sense drive line SN with a reference voltage. A discharge transistor which is rendered conductive in response to an output from comparator circuit 8, for example, may be used as the dummy GND level generating circuit 19.

An activating signal is applied to comparing circuit 8 such that it is activated only when the sense amplifier 2 is active.

The reason why is that the level of sense drive line SN is set to a desired precharge level at the time of precharging.

Figure 24:
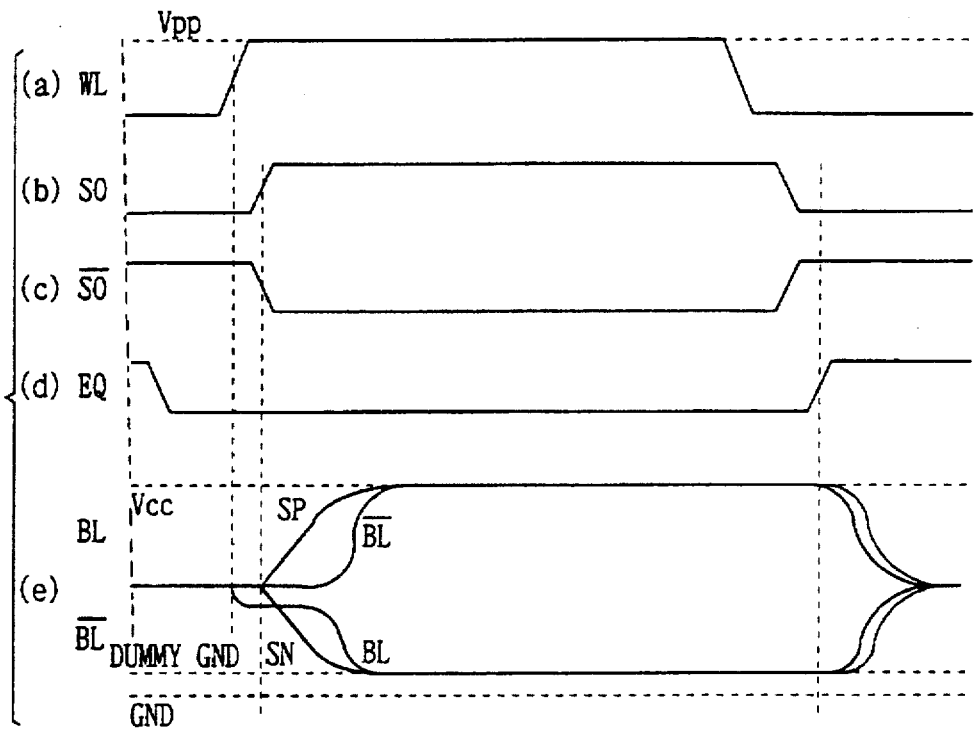
FIG. 24 is a time chart showing the operation of the embodiment of FIG. 23.

FIG. 24 is a time chart showing the operation of FIG. 23. As already described with reference to FIG. 57 of the prior art, when the word line WL rises to the boosted voltage Vpp as shown in (a) of FIG. 24, an initial signal is read to the bit line pair BL, $\overline{BL}$ as shown in (e) of FIG. 24. By sense amplifier activating signals S0 and $\overline{S0}$ shown in (b) and (c) of FIG. 24, sense amplifiers 2 and 4 start sensing operation. At this time, comparing circuit 8 is activated by activating signal S0, compares the level of sense drive line SN with the reference voltage, and cause the dummy GND level generating circuit 19 to discharge until the level of sense drive line SN attains equal to the reference voltage. When the level of the sense drive line SN becomes equal to the reference voltage, discharging operation of dummy GND level generating circuit 19 stops, and potential drop of sense drive line SN stops. Consequently, the potential of sense drive line SN attains to the dummy GND potential Vss which is higher than the low level of the word lines, and the potential of the "L" level of bit line BN attains to the dummy GND potential Vss'.

Figure 25:
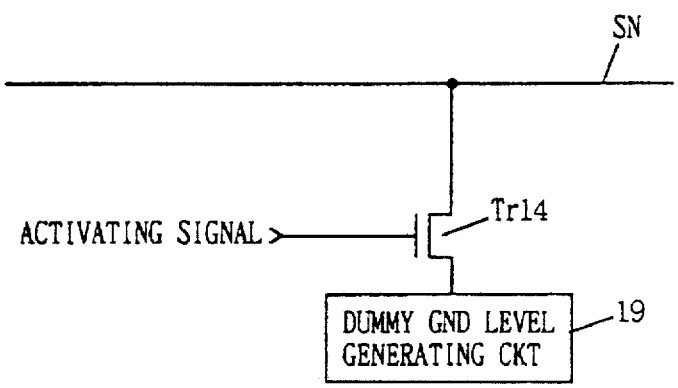
FIG. 25 is a schematic diagram showing a second embodiment in accordance with the sixth aspect of the present invention.

FIG. 25 shows a second embodiment in accordance with the sixth aspect of the present invention. In this embodiment, the dummy GND level generating circuit 19 generating the dummy GND potential Bss' is provided separately, and when n channel transistor TR14 is rendered conductive by sense amplifier activating signal S0, the potential of sense drive line SN is forced to be discharged to the dummy GND potential Vss'. In the embodiment shown in FIG. 23, it is necessary to provide a comparing circuit 8 and a dummy GND level generating circuit 9 for each sense amplifier. However, in this embodiment shown in FIG. 25, only one dummy GND level generating circuit 19 is necessary for a number of sense amplifiers and what is necessary is to provide an n channel transistor Tr14 for each sense amplifier. Therefore, the arrangement space can be reduced.

FIG. 26 shows a third embodiment in accordance with the sixth aspect of the present invention. In this embodiment, a path for discharging the sense drive line SN to the low level of the word lines and a path for discharging the sense drive line to the dummy GND potential Vss' are provided. More specifically, to sense drive line SN, drains of n channel transistors Tr15 and Tr16 are connected. The n channel transistor Tr15 has its source connected to the dummy GND level generating circuit 19 show in FIG. 25, and n channel transistor Tr16 has its source grounded. The n channel transistor Tr15 receives at its gate a second activating signal S02, and n channel transistor Tr16 receives at its gate a first activating signal S01.

FIG. 27 is a time chart showing the operation of the embodiment shown in FIG. 26. The operation of the embodiment of FIG. 26 will be described with reference to FIG. 27. At the time t8 when the sensing operation starts, the first activating signal S01 attains to the "H" level as shown in (d) of FIG. 27, and n channel transistor Tr16 is rendered conductive. As a result, sense drive line SN is discharged to the low level of the word lines and after the time t8, the first activating signal S01 attains to the "L" level, stopping discharging of n channel transistor Tr16. At time t9, the second activating signal S02 attains to the "H" level as shown in (e) of FIG. 27, n channel transistor Tr15 is rendered conductive, and sense drive line SN is discharged to the dummy GND potential Vss'. As a result, the sloop of the fall of the sense drive line SN to the "L" level can be made steep, improving response.

More specifically, if n channel transistor Tr16 of FIG. 26 is not provided and sense drive line SN is discharged to the dummy GND potential Vss' immediately after the start of sensing operation only by n channel transistor Tr15, then the source.drain voltage of n channel transistor Tr15 becomes lower, and discharging power of n channel transistor Tr15 decreases, so that the fall becomes less steep. By contrast, when n channel transistor Tr16 is provided parallel to n channel transistor Tr15 and the level of the sense drive line SN is discharged to the low level of the word lines at the initial stage, a large discharging power can be obtained because of the large potential difference, and therefore the sloop of fall can be made steep.

Referring to FIG. 26, the first and the second activating signals S01 and S02 may be switched by simply using a delay circuit, or the signals may be switched by monitoring the change in the level of the bit line or the level of the sense drive line SN.

Figure 28:
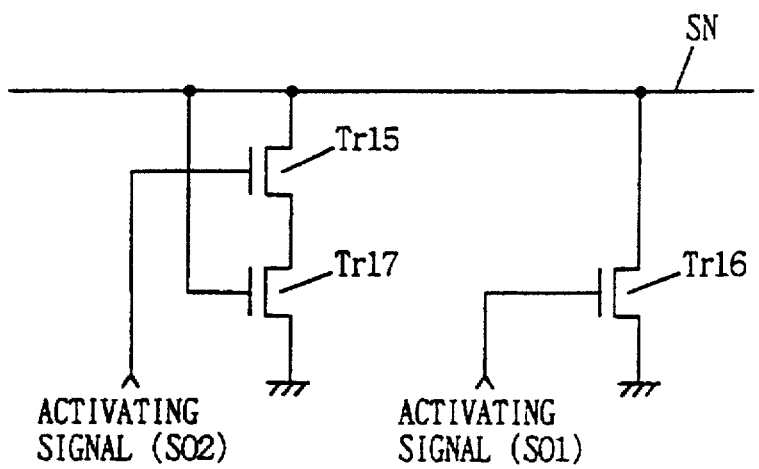
FIG. 28 is a schematic diagram showing a fourth embodiment in accordance with the sixth aspect of the present invention.

FIG. 28 shows a fourth embodiment in accordance with the sixth aspect of the present invention. In this embodiment, an n channel transistor Tr17 is connected in series between the ground and n channel transistor Tr 15 shown in FIG. 26, so as to make higher the level of sense drive line SN by the threshold voltage of n channel transistor Tr17. More specifically, n channel transistor Tr17 has its gate connected to sense drive line SN, its drain connected to the source of transistor Tr15, and its source grounded. In this embodiment also, at first transistor Tr16 is rendered conductive by the first activating signal S0 to discharge sense drive line SN, and then transistor Tr15 is rendered conductive by the second activating signal S02, and the potential of sense drive line SN is discharged to reach the threshold voltage of transistor Tr17. Generally, the level of the sense drive line after the sensing operation is stabilized in the sense amplifier is neither discharged nor charged. Therefore, in order to stabilize the level thereof, what is necessary is only to compensate for the leakage current in the sense amplifier. By using the diode connected transistor Tr17, compensation is realized.

In the embodiment shown in FIG. 28, the potential Vss' can be obtained by the threshold voltage of the diode connected transistor Tr17. Therefore, it is not necessary to separately provide the dummy GND level generating circuit 19 such as shown in FIG. 26.

Figure 29:
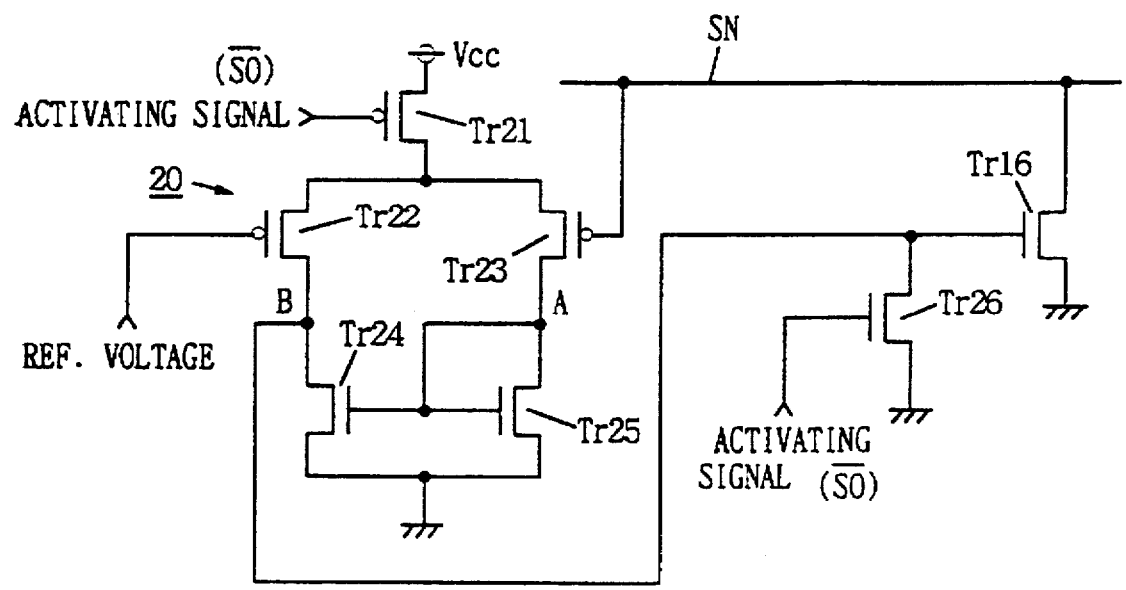
FIG. 29 is a schematic diagram showing a fifth embodiment in accordance with the sixth aspect of the present invention.

FIG. 29 is a schematic diagram showing a fifth embodiment in accordance with the sixth aspect of the present invention. In this embodiment shown in FIG. 29, the level of the sense drive line SN and the reference voltage are compared by a reference circuit 20, a discharge transistor Tr16 is controlled by the comparison output such that the sense drive line SN is discharged, and discharging of discharge transistor Tr is stopped by transistor Tr26 when sensing operation is inactive.

Comparing circuit 20 is formed by a simple current mirror circuit including p channel transistors Tr21 to Tr23 and n channel transistors Tr24 and Tr 25. More specifically, transistor Tr21 receives at its gate an activating signal $\overline{S0}$, and has its source connected to the power supply Vcc and its drain connected to the sources of transistors Tr22 and Tr23. Transistor Tr22 receives at its gate the reference voltage, transistor Tr23 has its gate connected to sense drive line Sn, and transistor Tr22 has its drain connected to the drain of transistor Tr24, the drain of transistor Tr26 and the gate of transistor Tr16 through a node B. Transistor Tr23 has its drain connected to the drain and the gate of transistor Tr25 through a node A, transistor Tr24 has its gate connected to the gate of transistor Tr25, and transistors Tr4 and Tr25 have their sources grounded. Transistor Tr16 has its drain connected to sense drive line SN and its source grounded. Transistor Tr26 receives at its gate the activating signal $\overline{S0}$, and has its source grounded.

The operation will be described. Assume that the sense drive line SN is charged to 1.25V and a reference voltage of, for example, 0.5V is applied to the gate of transistor Tr22. Transistor Tr21 is rendered conductive when the "L" level activating signal $\overline{S0}$ is applied, and apply the power supply voltage Vcc to the sources of transistors Tr22 and Tr23. At this time, since a potential of 1.25V which is higher than the reference voltage has been applied to the gate of transistor Tr23, only a small current flows through transistor Tr23, and therefore node A cannot be charged. Accordingly, the potential at node A lowers, reducing the current flowing into transistor Tr25.

Meanwhile, transistor Tr22 is rendered conductive as the reference voltage is 0.5V, pulling the node B to the "H" level. At this time, since the activating signal S0 at the "L" level has been applied to the gate of transistor Tr26, transistor Tr26 is non-conductive. Therefore, the gate of discharging transistor Tr16 attains to the "H" level and rendered conductive to discharge the potential of sense drive line. When the potential of node A lowers, transistor Tr25 becomes less conductive, causing the potential of node A to reach "H" level, the potential at node B to "L", and discharging transistor Tr16 stops discharging of the potential of sense drive line SN.

Figure 30:
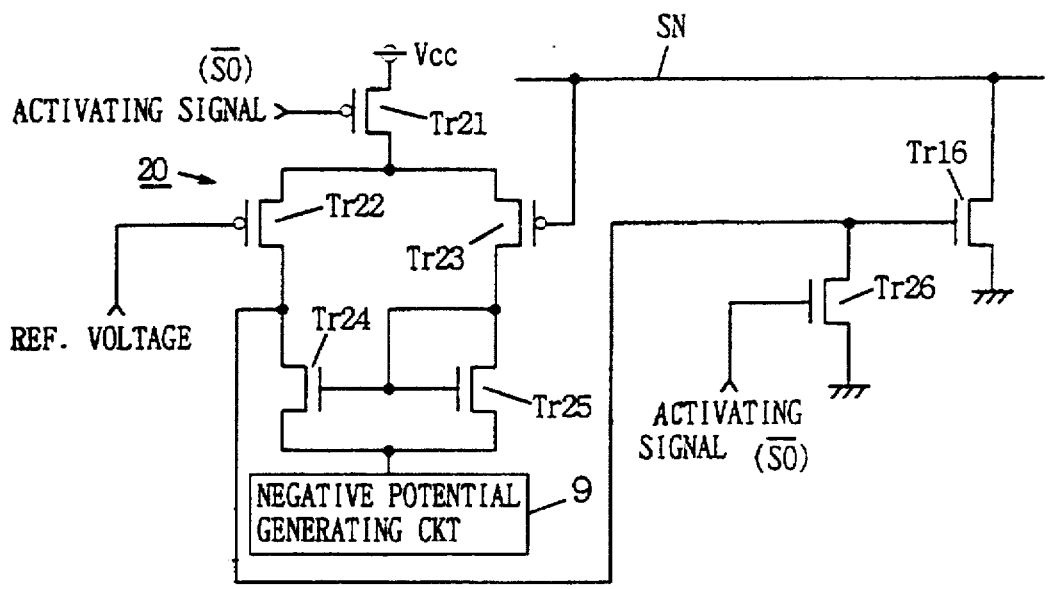
FIG. 30 is a schematic diagram showing a sixth embodiment in accordance with the sixth aspect of the present invention.

FIG. 30 is a schematic diagram showing a seventh embodiment in accordance with the sixth aspect of the present invention. This embodiment is a modification of the embodiment shown in FIG. 29, in which a negative potential is applied from negative potential generating circuit 9 to sources of transistors Tr24 and Tr25. The reason for this is that the range of operation of the current mirror circuit 20 may possibly be exceeded when the reference voltage is low, and that the level for comparison is set in the operational range of current mirror circuit 20 by setting the low level of the word lines of the current mirror circuit 20 to a lower negative potential.

Figure 31:
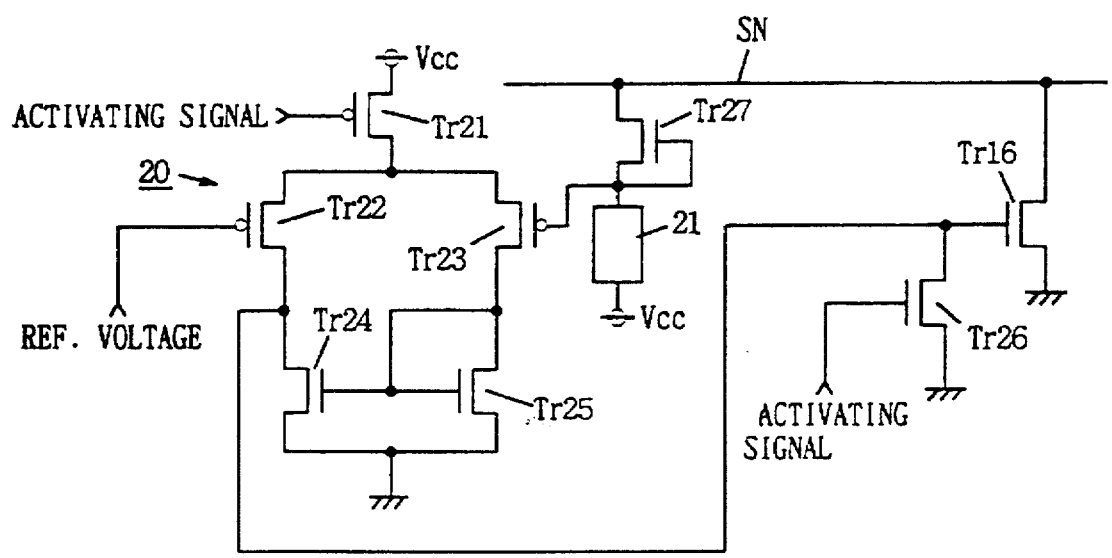
FIG. 31 s a schematic diagram showing a seventh embodiment in accordance with the sixth aspect of the present invention.

FIG. 31 is a schematic diagram showing an eighth embodiment in accordance with the sixth aspect of the present invention. As compared with the embodiment shown in FIG. 29, in the embodiment shown in FIG. 31, a level conversion circuit is provided between the gate of transistor Tr23 and the sense drive line SN, so that even when the comparison level is low, it can operate within the operational range of current mirror circuit 20. More specifically, transistor Tr23 has its gate connected to the drain and the gate of transistor Tr27, transistor Tr27 receiving at its source the power supply voltage Vcc through a resistor 21, and its source connected to the sense drive line SN. Since transistor Tr27 is diode connected, the potential of sense drive line SN has its level shifted by the threshold voltage Vth of transistor Tr27 and applied to the gate of transistor Tr23.

The reference voltage serving as the comparison level is set to a voltage higher than in the embodiment shown in FIG. 29. For example, it is set to 1.0V. The potential of the sense drive line SN of which level has been shifted is compared with the reference voltage by current mirror circuit 20, and discharging transistor Tr16 is controlled by the comparison output therefrom.

Figure 32:
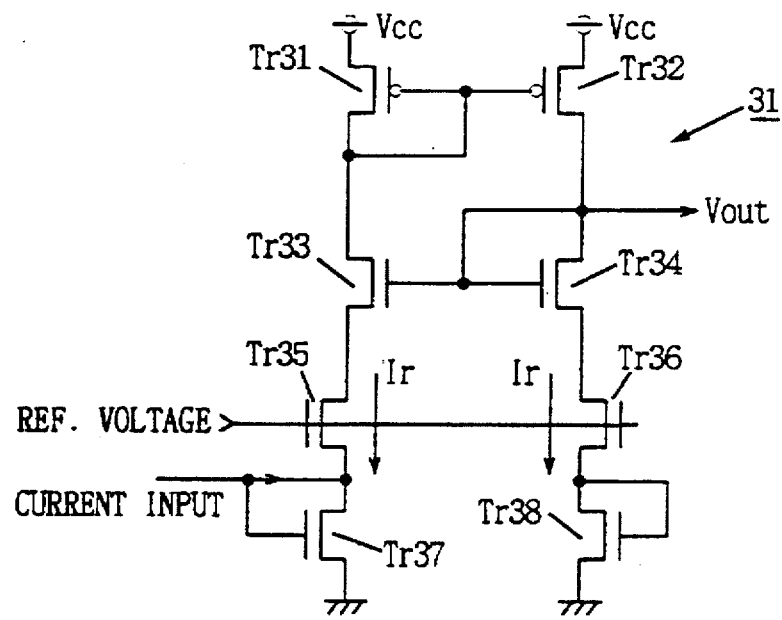
FIG. 32 s a schematic diagram showing an eighth embodiment in accordance with the sixth aspect of the present invention.
Figure 33:
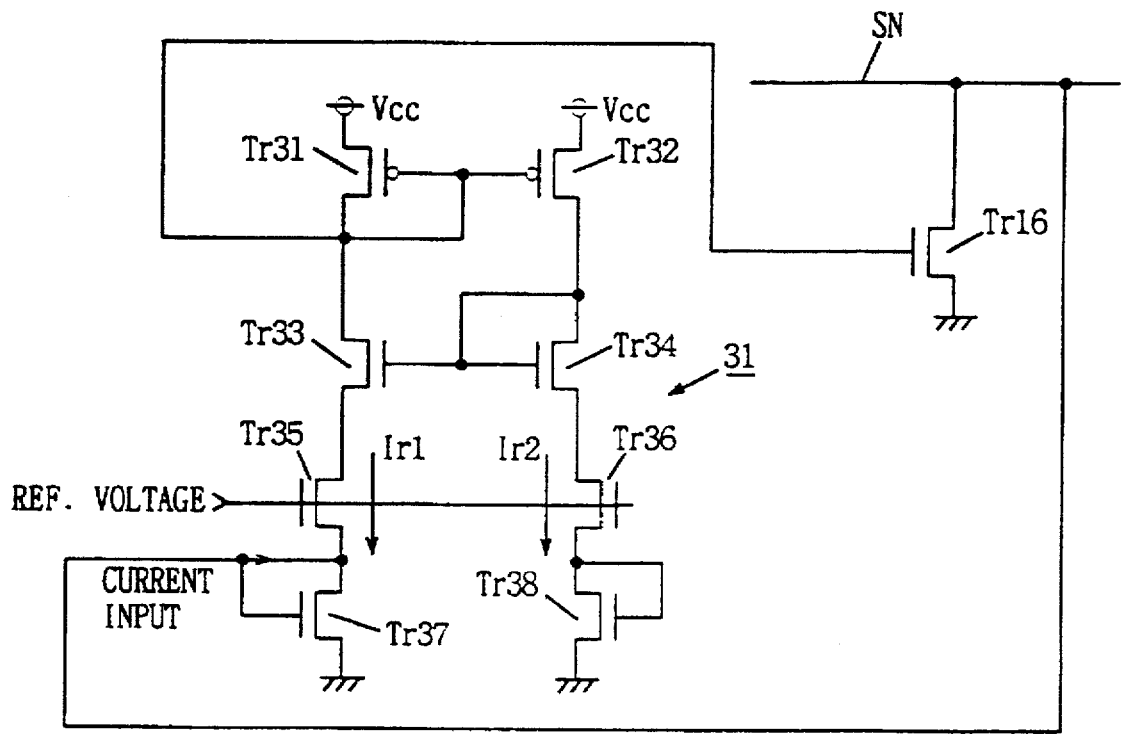
FIG. 33 s a schematic diagram showing an embodiment in which a current sensor of FIG. 32 is used as a comparing circuit.

FIG. 32 is a schematic diagram showing a ninth embodiment in accordance with the sixth aspect of the present invention, and FIG. 33 is a schematic diagram showing an embodiment in which the current sensor of FIG. 32 is used as a comparing circuit.

Current sensor 31 includes, between the power supply voltage Vcc and the ground, a path including a series connection of p channel transistor Tr31 and n channel transistors Tr33, Tr35 and Tr37, and a path including a series connection of a p channel transistor Tr32 and n channel transistors Tr34, Tr36 and Tr38, and the sensor compares the currents flowing through these two paths and provides a comparison output.

More specifically, as shown in FIG. 33, a reference voltage is input to the gates of transistors Tr35 and Tr36, the drain and the gate of transistors Tr37 and Tr38 are diode-connected respectively, and connected to sense drive line SN. If the gate of transistor Tr37 is not connected to the sense drive line SN, nodes A and B are both at the threshold voltage Vth of respective transistors Tr37 and Tr38, as the transistors Tr37 and Tr38 are both diode-connected. However, when a high potential is applied from the sense drive line SN to the gate of transistor Tr37, the potential at node A rises, current Ir1 flowing through node A decreases while current Ir2 flowing to node B increases. If the current Ir1 decreases, the potential at node C rises. To the node C, the gate of discharging transistor Tr16 is connected, and therefore discharging transistor Tr16 is rendered conductive as the potential at node C rises, discharging the potential of sense drive line SN. As the potential of sense drive line SN is discharged and the potential decreases, the potential at node A decreases correspondingly, the current Ir1 increases, while the current Ir2 decreases. When the potential of sense drive line SN comes to be approximately the same as the reference voltage, the node C attains to the "L" level, discharging transistor Tr16 is rendered non-conductive, and discharge stops.

Figure 34:
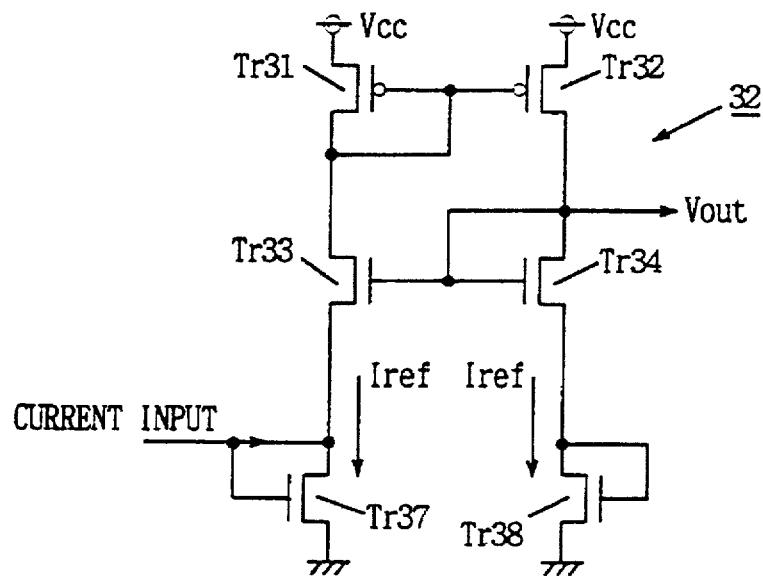
FIG. 34 s a schematic diagram showing another example of the current sensor.

FIG. 34 is a schematic diagram showing another example of the current sensor. Current sensor 31 shown in FIG. 34 is a simplified version of current sensor 31 shown in FIG. 32, in which transistor Tr35 and Tr36 are eliminated. The operation is approximately the same as the current sensor 31 of FIG. 32.

Figure 35:
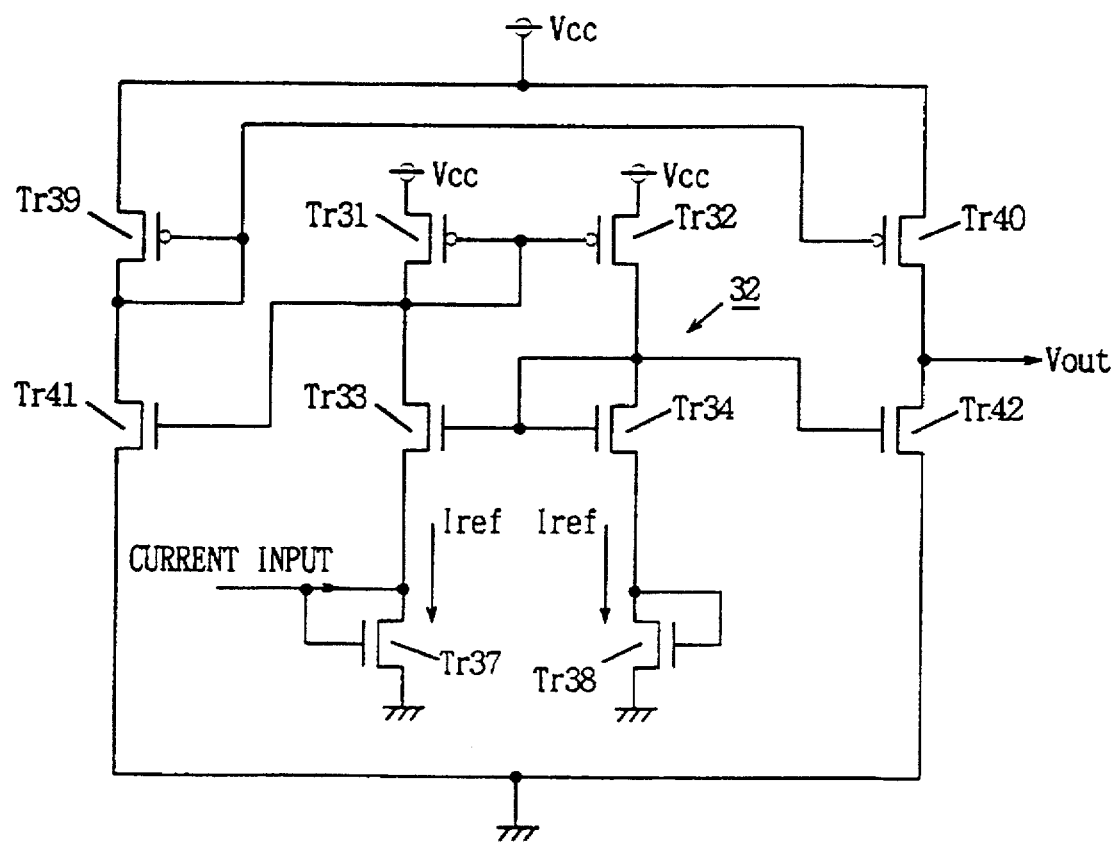
FIG. 35 is a schematic diagram showing a further example of the current sensor.

FIG. 35 is a schematic diagram showing still another example of the current sensor. Compared with the current sensor 32 shown in FIG. 34, the current sensor shown in FIG. 35 is connected to a voltage converting circuit including transistors Tr39, Tr41 as well as Tr40 and Tr42, so that the current comparison in current sensor 31 is converted to voltage comparison.

Figure 36:
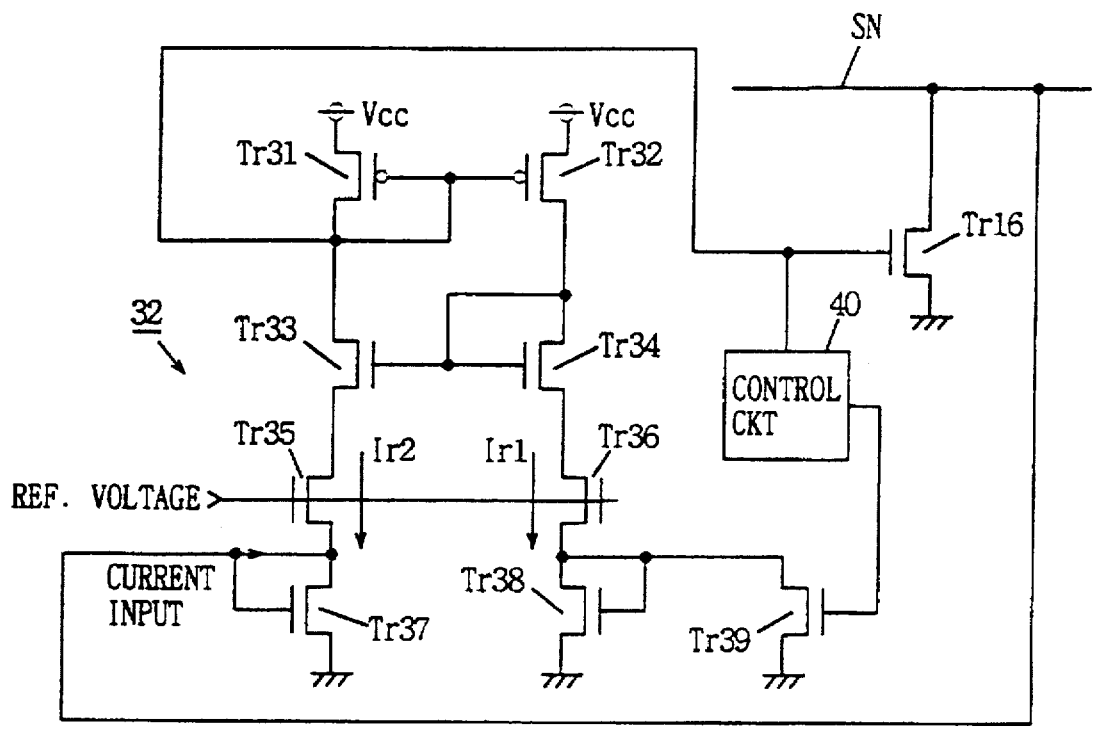
FIG. 36 is a schematic diagram of a current sensor provided with hysteresis characteristic.

FIG. 36 is a schematic diagram of a current sensor adapted to have hysteresis characteristic. When the potential of sense drive line SN is discharged and attains lower than the comparison voltage, the potential of sense drive line SN may oscillate because of operations of other circuits in which the potential of sense drive line SN once rises to be higher than the reference voltage and lowers to be lower than the reference voltage. In order to absorb such oscillation, in this embodiment shown in FIG. 36, current sensor 32 is adapted to have hysteresis characteristic. More specifically, the comparison output of current sensor 32 is applied to the gate of discharging transistor Tr16 as well as to a control circuit 40. When the comparison output from current sensor 32 is at the "H" level, control circuit 40 applies a signal of the "H" level to the gate of transistor Tr39. Transistor Tr39 has its drain connected to the gate and the drain of transistor Tr38, and its source grounded. When the potential of sense drive line SN is higher than the reference voltage, discharging transistor Tr16 discharges the potential of sense drive line SN in accordance with the comparison output of current sensor 32.

At this time, since control circuit 40 renders conductive transistor Tr39, the current flowing at node B is the sum of currents flowing through transistors Tr38 and Tr39, and hence it is larger than the current flowing through node A. When the potential of sense drive line SN becomes lower than the reference voltage, the comparison output from current sensor 32 attains to the "L" level, and discharging transistor Tr16 stops discharging. In response to the comparison output attaining "L", control circuit 40 renders non-conductive the transistor Tr39. Accordingly, the current Ir1 flowing through node B becomes smaller than the current Ir2 flowing through node A, the potential at node B rises, and comparison level rises substantially, generating hysteresis in the comparison level. When the potential at sense drive line SN becomes lower than the reference voltage, the comparison level becomes higher because of the hysteresis characteristic, and hence oscillation of the level of sense drive line SN can be prevented.

Figure 37:
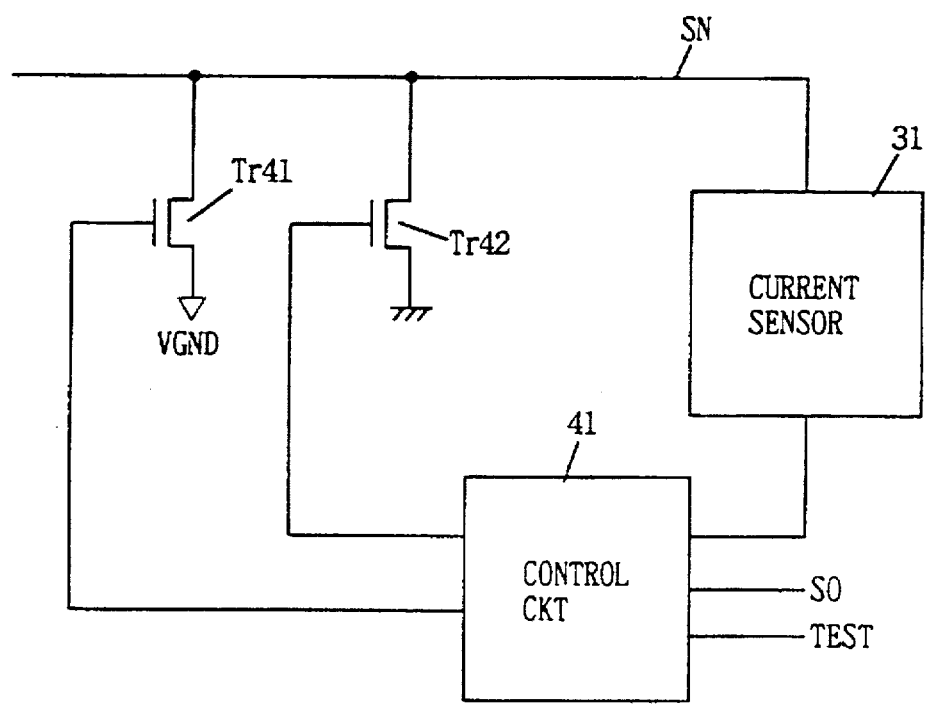
FIG. 37 is a block diagram showing an example in which the present invention in accordance with the sixth aspect is applied to a test circuit for testing data retention time of a memory cell.

FIG. 37 is a block diagram showing an example in which the invention in accordance with a sixth aspect is applied to a test circuit for testing the data retention time of the memory cell.

The above described embodiments are directed to prevent sub threshold leak of the word line transistor by setting higher the low level potential of the bit line than the low level of the word lines, by setting the potential of the sense drive line SN higher than the low level of the word lines by the potential Vss'.

However, when data retention time of the memory cell is to be tested, sometimes it is desirable to test under the condition in which sub threshold leak is likely. Therefore, in the embodiment shown in FIG. 37, in the test mode, sense drive line SN is set to the low level of the word lines and in the normal mode, the potential of the sense drive line is set to the potential Vss' of the dummy GND line.

More specifically, current sensor 31 compares the reference voltage with the potential of sense drive line SN, and provides the comparison output to control circuit 41. An activating signal S0 and a test signal are applied to control circuit 41. Drains of transistors Tr41 and Tr42 are connected to the sense drive line SN. To the source of transistor Tr41, the dummy GND potential Vss' is applied from the dummy GND level generating circuit 19 shown in FIG. 25. Transistor Tr42 has its source grounded. When activating signal S0 is applied, control circuit 41 applies a signal at "H" level to the gate of transistor Tr41, and at the time of testing, applies a signal at the "H" level to the gate of transistor Tr42.

Therefore, in normal use, when it is determined by the current sensor 31 that the potential of sense drive line SN is higher than the reference voltage and the activating signal S0 is applied, control circuit 41 renders conductive the transistor Tr41 and discharges the sense drive line SN to the dummy GND potential Vss'. At the time of testing, when the test signal is applied to control circuit 41, control circuit 41 renders conductive the transistor Tr42 and discharges the sense drive line SN to the ground level. Therefore, the sub threshold leak current of word line transistor is increased and floating of the level of the non-selected word line caused by the array noise is increased. Therefore, sub threshold leak current of the word line transistor is increased. Accordingly, the retention time characteristic of the memory cell element represented by the disturb refresh characteristic is degraded, and hence time necessary for evaluating the characteristic can be reduced.

According to this embodiment, as compared with the prior art, retention characteristic of the memory element can be surely improved by the disturb test. Therefore, if the memory cell satisfies the target retention time with this embodiment applied, it means that the retention time characteristic by the disturb test is surely improved. Therefore, the time necessary for disturb refresh or the like can be reduced. Since increase of the time for testing with respect to refreshing, especially increase of time for testing with respect to disturb refresh has come to be a serious problem. Therefore, reduction in test time attained by the present embodiment is of significant importance.

Figure 38:
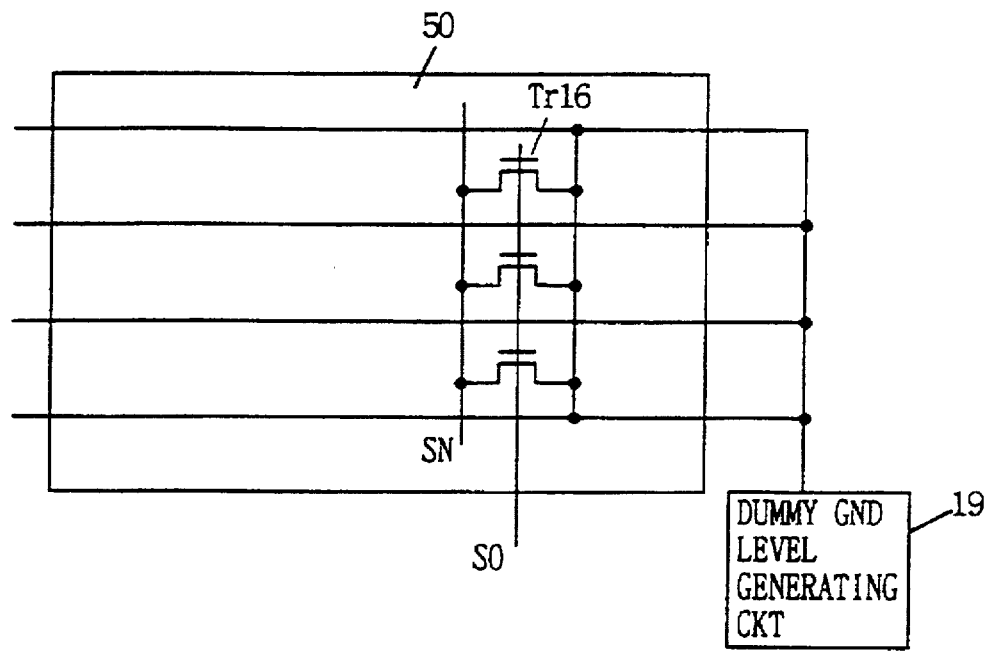
FIG. 38 shows an example in which the present invention in accordance with the sixth aspect is applied to each memory block.

FIG. 38 shows an example in which the embodiment in accordance with a sixth aspect is applied to each memory block. In the example shown in FIG. 38, a plurality of dummy GND lines 41 are provided on a memory block including a number of memory cells (not shown), and a dummy GND level generating circuit 19 is provided outside the memory block 50. The dummy GND potential Vss' is supplied from dummy GND generating circuit 19 to each dummy GND line 51. Discharging transistors Tr16 are arranged corresponding to dummy GND lines 51, respectively, and the activating signal S0 is applied to the gate of each of the transistors. When the activating signal S0 attains to the "H" level, the dummy GND potential Vss' generated from the dummy GND generating circuit 19 is supplied to sense drive line SN.

Figure 39:
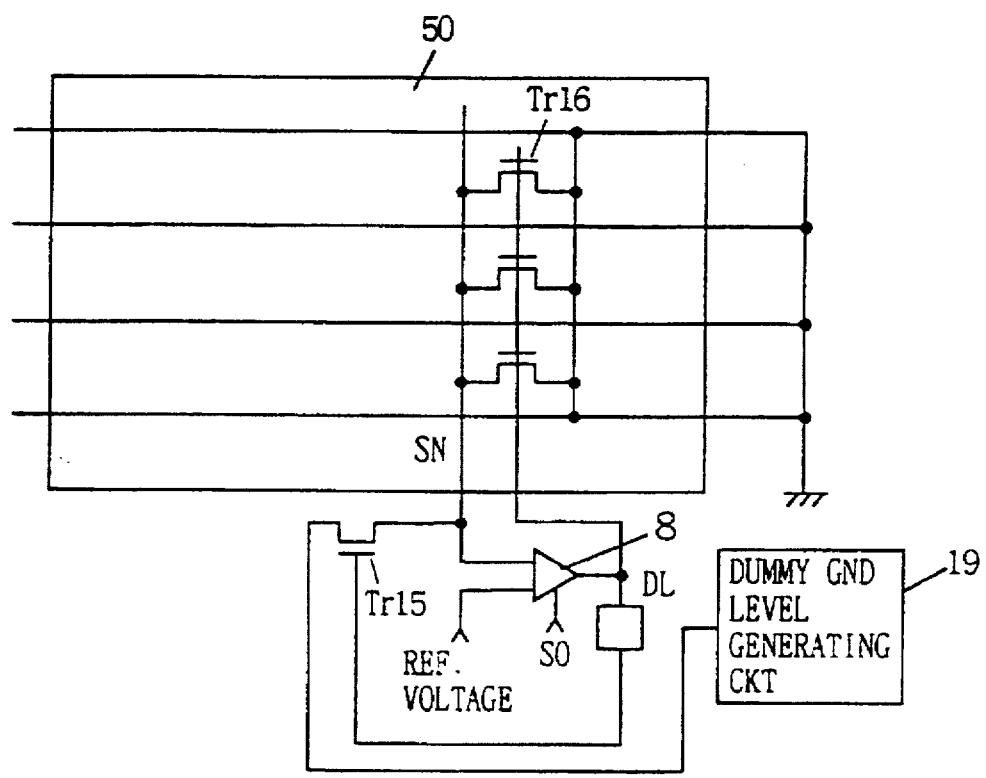
FIG. 39 shows another example in which the present invention in accordance with the sixth aspect is applied to each memory block.

FIG. 39 shows another example of the invention in accordance with the sixth aspect applied to each memory block. In this example shown in FIG. 39, the embodiment of FIG. 26 is applied. More specifically, the comparing circuit 8, the dummy GND level generating circuit 19 and transistor Tr15 are provided outside the memory block 50. When an activating signal S0 is applied, comparing circuit 8 compares the potential of sense drive line SN with the reference voltage, renders conductive the transistor Tr16 in accordance with the comparison output, and discharges the sense drive line SN to the ground level. The output from comparing circuit 8 is delayed by a delay circuit 81, and after the lapse of a prescribed time period, transistor Tr15 is rendered conductive, discharging the potential of sense drive line SN to the dummy GND potential Vss'.

Figure 40:
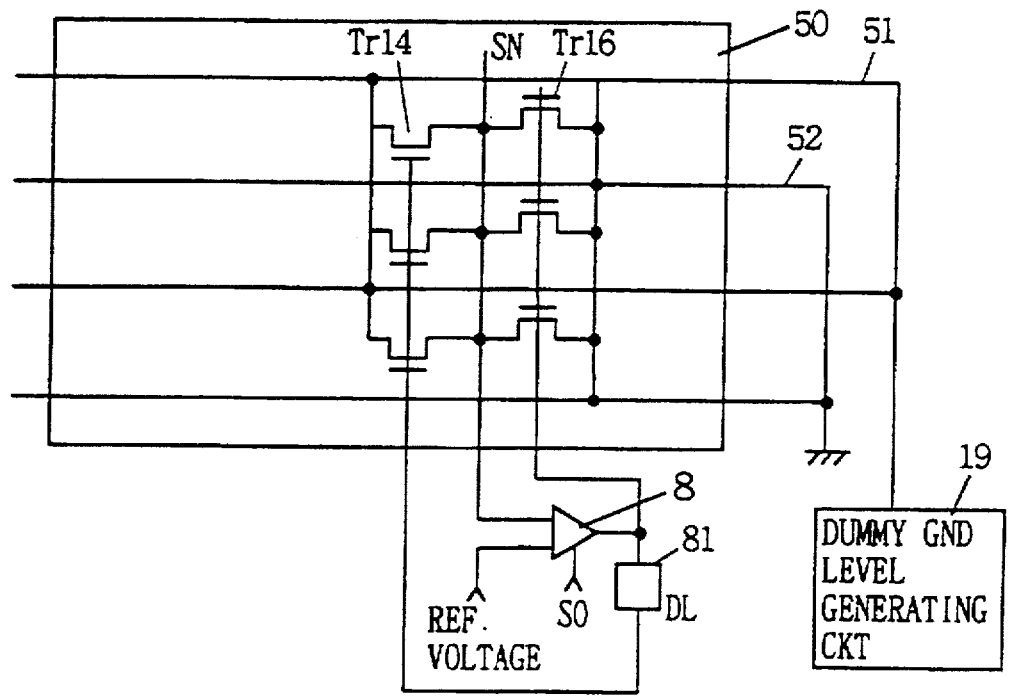
FIG. 40 shows a further example in which the present invention in accordance with the sixth aspect is applied to each memory block.

FIG. 40 shows a still another example of the present invention in accordance with the sixth aspect applied to each memory block. On memory block 50, the dummy GND line 31 and the ground line 52 are arranged alternately, and between the lines 51 and 52, discharging transistors Tr14 and Tr16 are arranged. Outside the memory block 50, comparing circuit 8, delay circuit 81 and dummy GND level generating circuit 19 are arranged. Comparing circuit 8 compares the reference voltage with the potential of the sense drive line SN in response to the activating signal S0, and in accordance with the comparison output, discharging transistor Tr16 is rendered conductive and sense drive line SN is discharged to the low level of the word lines. The comparison output is delayed by the delay circuit 81, and after the lapse of a prescribed time period, transistor Tr14 is rendered conductive and the sense drive line SN is discharged to the potential Vss' of the dummy GND line 51.

Figure 41:
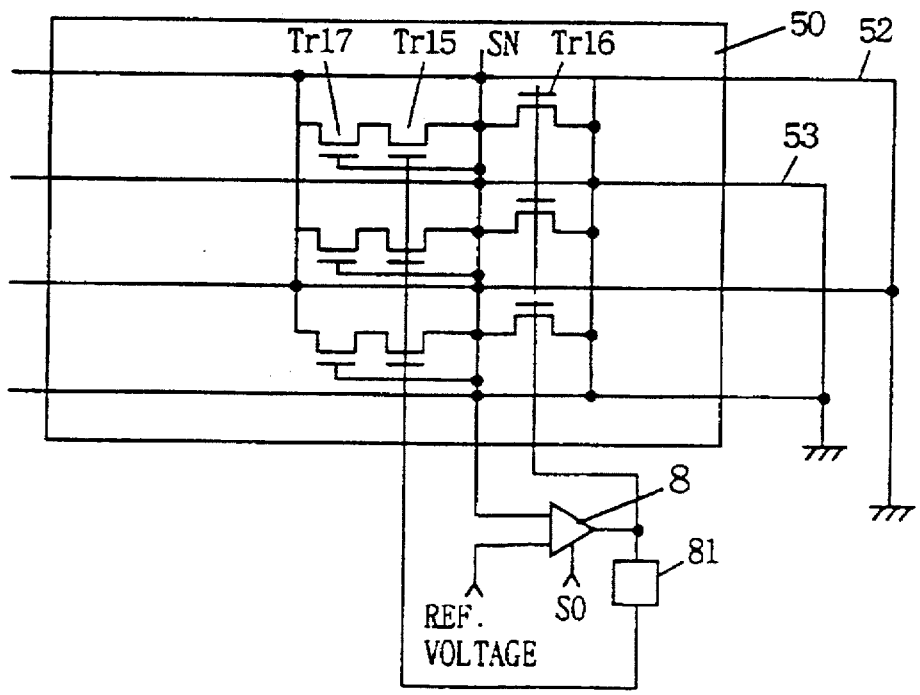
FIG. 41 shows a still further embodiment in which the present invention in accordance with the sixth aspect is applied to each memory block.

FIG. 41 shows a still another example of the present invention in accordance with the sixth aspect applied to each memory block. The example shown in FIG. 41 is a modification of the embodiment shown in FIG. 28. As in the example of FIG. 40, ground lines 52 and 53 are arranged alternately on memory block 50, and between these lines, discharging transistors Tr16 and Tr15 and a diode-connected transistor Tr17 are arranged. In accordance with the comparison output from comparing circuit 8, discharging transistor Tr16 is discharged to the low level of the word lines, after the lapse of a prescribed time period determined by the delay circuit 81, discharging transistor Tr15 is rendered conductive, and the potential of the sense drive line SN is discharged by the threshold voltage of transistor Tr17.

Figure 42:
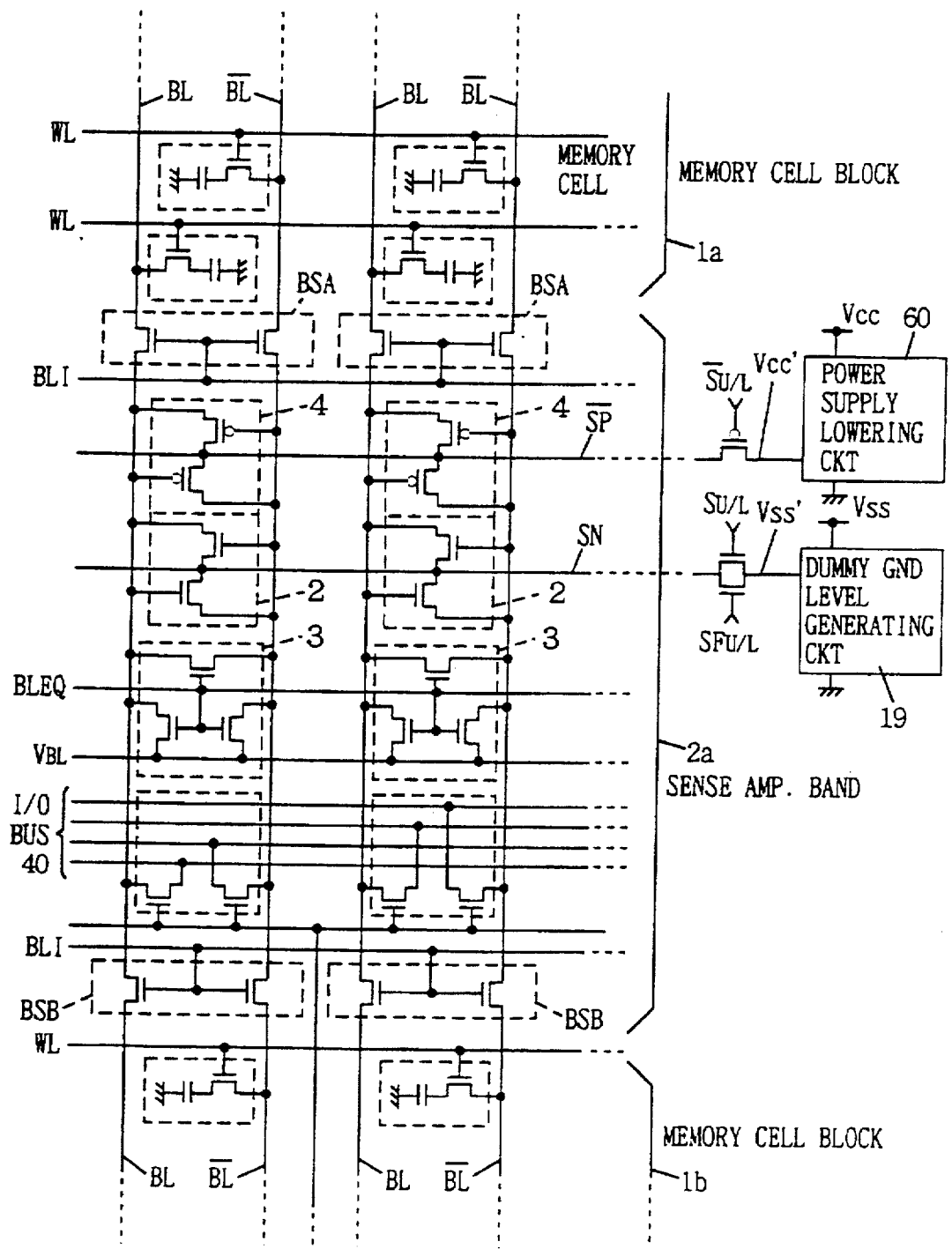
FIG. 42 is a schematic diagram showing a first embodiment in accordance with a seventh aspect of the present invention.

FIG. 42 is a schematic diagram showing a first embodiment in accordance with a seventh aspect of the present invention. FIG. 42 shows memory cell blocks, sense amplifier portion and sense amplifier drive circuit of a dynamic RAM, which includes word lines WL, bit line pairs BL, $\overline{BL}$, memory cells MC, transfer gates BSA and BSB of shared sense amplifier, control signal BLI thereof, a p channel sense amplifier PSA, a p channel sense amplifier drive line SP, an n channel sense amplifier NSA, an n channel sense amplifier drive line SN, a bit line equalizing circuit EQ, an equalizing control circuit PLEQ, and a switching circuit IOSW for the I/O bus. Further, it includes the dummy GND level generating circuit 19 and a power supply voltage lowering circuit 60 which are features of the present embodiment. The power supply voltage lowering circuit 60 provides a lowered voltage Vcc' which is provided by lowering the power supply voltage Vcc, and which lowered voltage Vcc' is supplied to the p channel sense amplifier drive line SP through switch circuit SW10. The dummy GND level generating circuit provides the dummy GND potential Vss' which is higher than the low level of the word lines, and the dummy GND potential Vss' is supplied to the drive line SN of n channel sense amplifier 2 through switch circuit SW11. Switch circuit SW10 is rendered conductive by a signal $\overline{SU/L}$ for controlling the sense amplifier drive line SP, and switch circuit SW11 is rendered conductive by signals SU/L and SFU/L controlling the sense drive line SN of n channel sense amplifier 2.

Figure 43:
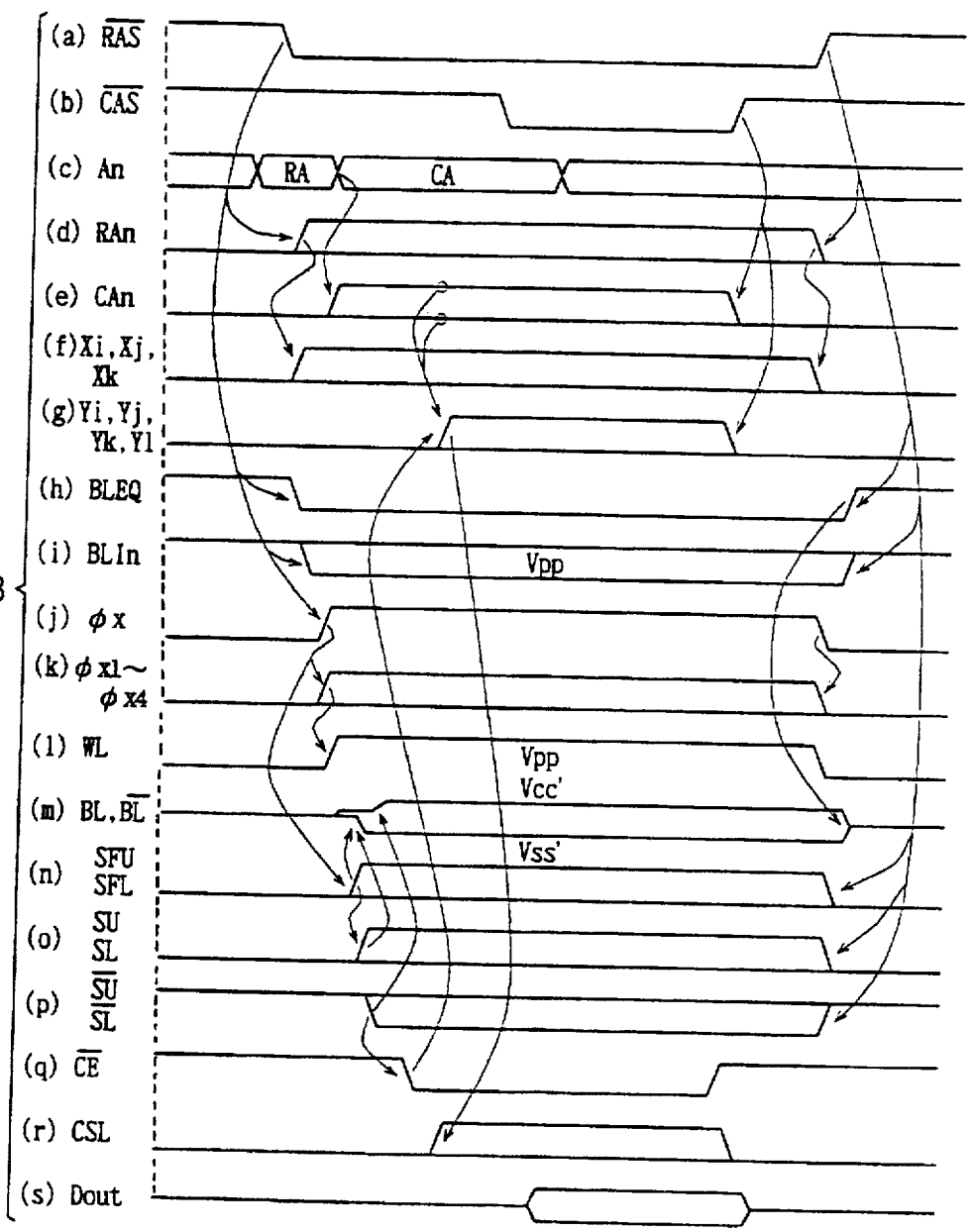
FIG. 43 is a time chart showing the operation of the embodiment shown in FIG. 42.

FIG. 43 is a time chart showing the operation of the embodiment shown in FIG. 42. FIG. 43 shows main clocks representing internal operation of the dynamic RAM shown in FIG. 42. More specifically, the time chart shows external inputs $\overline{RAS}$, $\overline{CAS}$ and An, an internal low address signal RAn, internal column address signal CAn, row predecode signals Xi, j, k, column predecode signals Yi, j, k, a master row signal φx, a decode signal thereof, which is a trigger signal φx1 of the word line WL, a column enable signal CE provided after the end of sensing operation, a signal CSL which is a column selection signal and used for connecting the I/O bus to the sense amplifier, and a data output Dout.

The operation of the embodiment shown in FIG. 42 will be described with reference to FIG. 43. At first, transfer gates BSA and BSB are both conductive, memory blocks 1a and 1b are connected to a sense amplifier band 2a, and bit line pair BL, $\overline{BL}$ is precharged to VBL (=(Vcc'+Vss')/2) as shown in FIG. 43(m) by the equalizing circuit 3. When memory cell block 1a is selected, memory cell block 1b is disconnected from sense amplifier band 2a by transfer gate BSB.

Thereafter, when word line WL rises to "H" as shown in FIG. 43(l), data is read from memory cell MC to bit line BL and transferred to sense amplifiers 2 and 4. When n channel sense amplifier 2 is activated, switch circuit SW11 is rendered conductive by the signals SFU/L, SU/L as shown in FIG. 43(n), and the dummy GND potential Vss' generated by dummy GND level generating circuit 19 is supplied through switch circuit SW11 to sense drive line SN. When p channel sense amplifier 4 is activated, switch circuit SW10 is rendered conductive by the signal $\overline{SU/L}$ shown in FIG. 43(p), and the voltage Vcc' lowered by the power supply lowering circuit 60 is supplied through switch circuit SW10 to p channel sense drive line SP. By the sense amplifiers 2 and 4, the potentials of the bit line pair BL and $\overline{BL}$ are amplified to Vcc' and Vss', respectively.

As already described with reference to the embodiments above, the effect obtained by setting the low level bit line to the dummy GND potential Vss' will be described in detail in the following.

Figure 44:
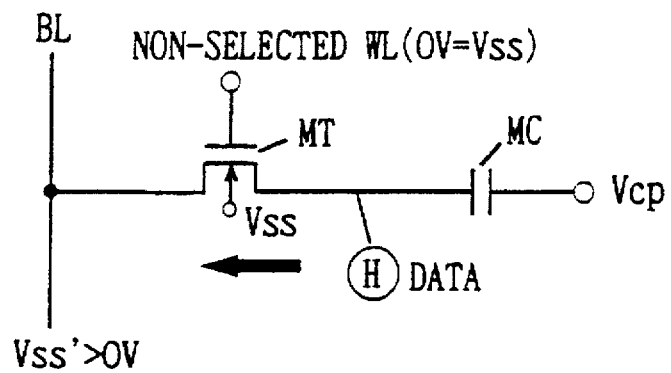
FIG. 44 is an illustration of path through which a sub threshold current of the memory cell flows.
Figure 45:
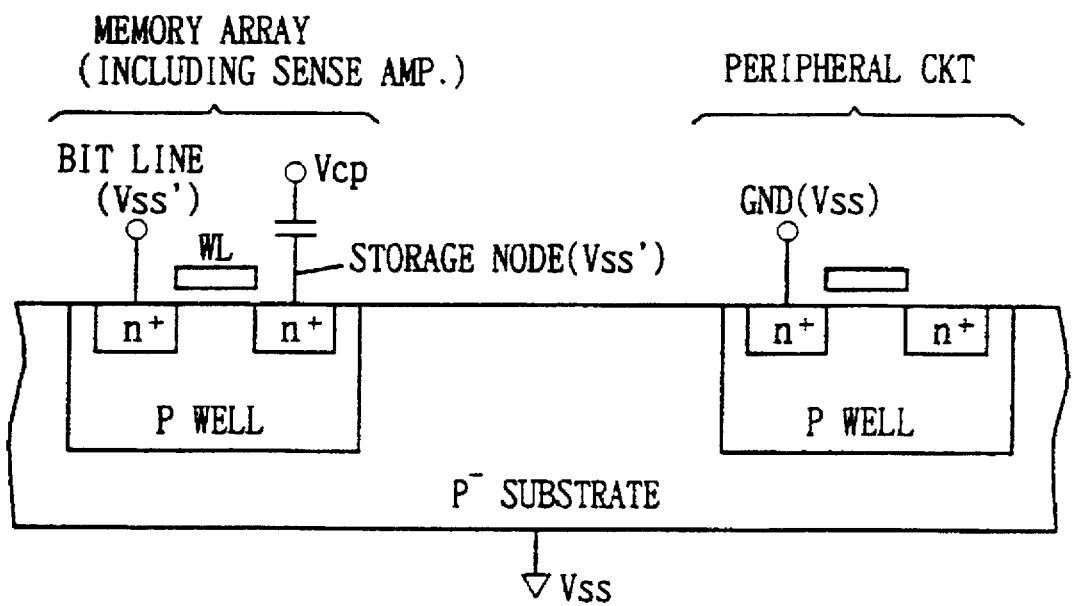
FIG. 45 is a cross section of the first embodiment in accordance with the seventh aspect of the present invention.

FIGS. 44 and 45 are illustrations showing the effects of the present invention.

(1) It becomes stable against disturb refresh

The bit lines of the selected block are amplified to the potentials Vcc' and Vss', and in the non-selected memory cells connected thereto, the gate potential of memory cell transistor MT is at Vss=0 V, the bit line BL is Vss'>0V, and the potential of the storage node is at the "H" level potential of Vcc', as shown in FIG. 44. In this case, the sub threshold current (denoted by the arrow in FIG. 44) across the memory cell transistor MT can be significantly reduced as compared with the conventional example in which the potentials of the bit line BL and of the word line WL are both at 0V.

(2) The threshold voltage VTM of memory cell transistor MT can be set low, improving reliability As described in (1) above, since it can be made strong against disturb refresh, the threshold voltage VTM of memory cell transistor MT can be set lower than in the prior art. Therefore, it becomes possible to lower the boosted voltage Vpp of the word line (the value Vpp must satisfy Vpp>Vcc'+VTM in order to write data of the "H" level sufficiently high to the memory cell), improving reliability of the transistor.

(3) The boosted voltage generating circuit becomes unnecessary

Conventionally, memory cell substrate or well potential must be set to a negative potential in view of minority carrier injection. However, in the present invention, the low level of the memory cell is the potential Vss', and the potential of the substrate (well) is the low level of the word lines Vss'. Therefore, viewed from the memory cell, the substrate is substantially set to a bias potential of a negative voltage. Since the boosted voltage generating circuit becomes unnecessary, power consumption can be reduced.

(4) The triple well structure becomes unnecessary

As described in ISSCC 89 *Digest of Technical Papers* pp. 248–249, when a P substrate is used, a triple well must be employed in order to set the well potential to a negative potential of Vbb for preventing injection and to set the peripheral circuits to the low level of the word lines Vss so as to improve performance of the transistor, and therefore the number of programming steps must be increased. However, in the present invention, since the "L" level of the bit lines and the memory cell in the memory cell array portion are set to the dummy GND potential Vss' and the well potential is set to the low level of the word lines, the "L" level of the peripheral circuitry and the well potential can be both set to the low level of the word lines Vss, whereby the function of the aforementioned triple well structure can be realized by a common twin well structure such as shown in FIG. 45.

Figure 46:
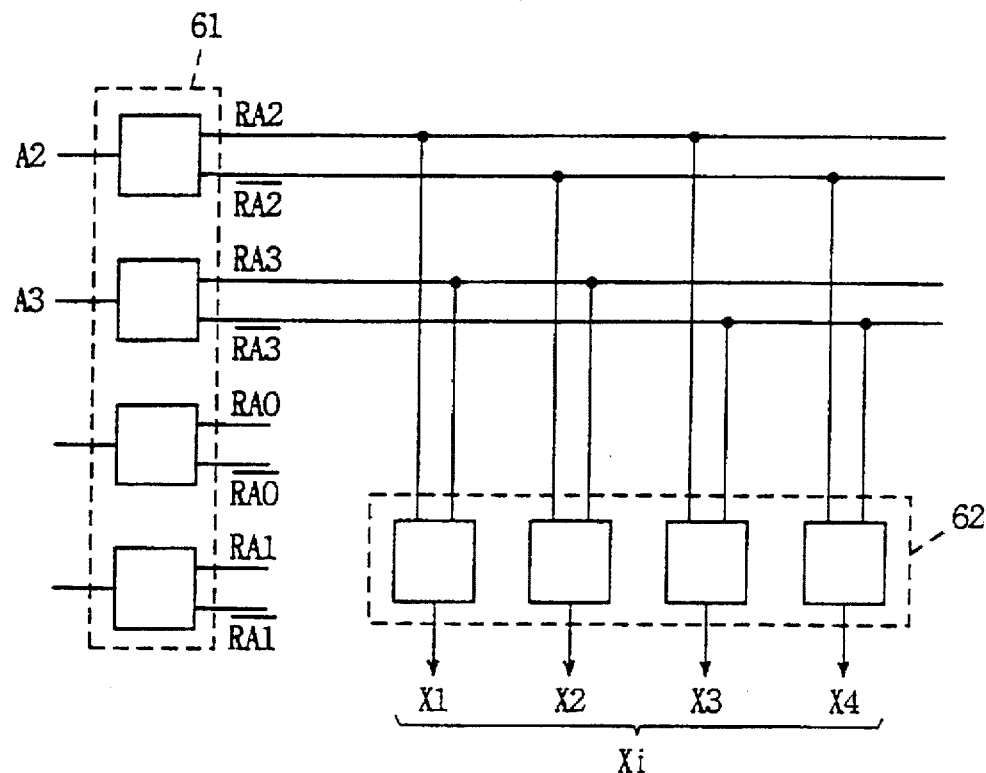
FIG. 46 shows a circuit for generating row predecoder outputs Xi, j, k.
Figure 47:
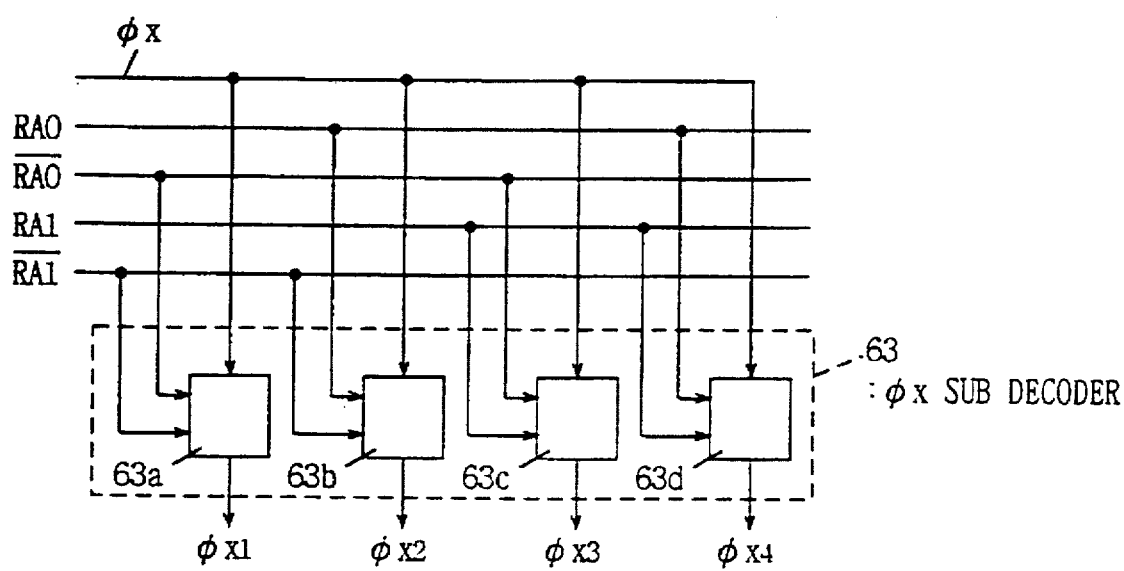
FIG. 47 shows a circuit for generating a master row decode signal φxi.
Figure 48:
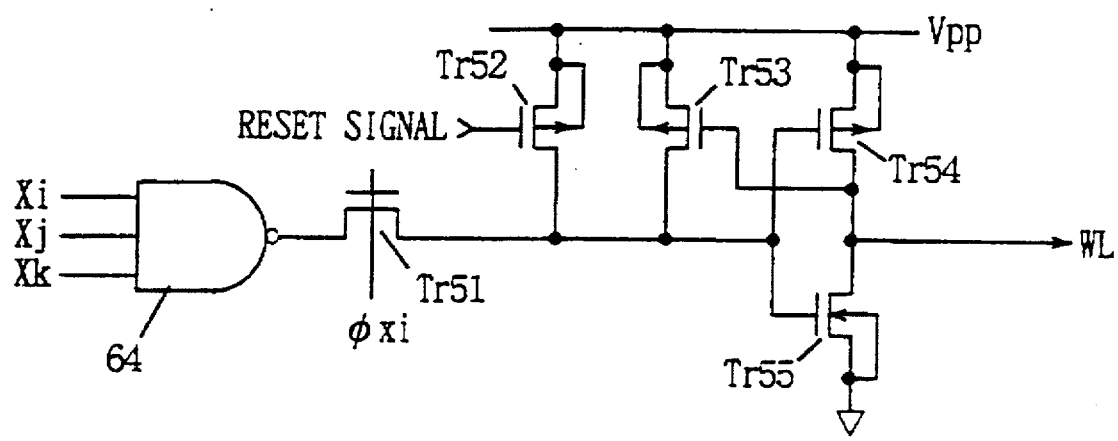
FIG. 48 is a schematic diagram showing a word line driving signal generating circuit.
Figure 49:
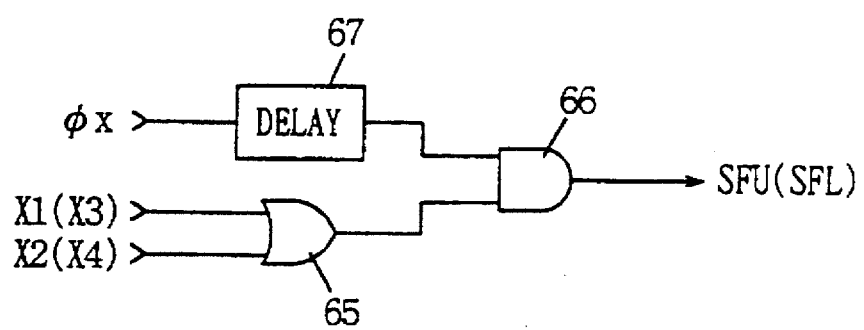
FIG. 49 shows a column SFU/L signal generating circuit.
Figure 50:
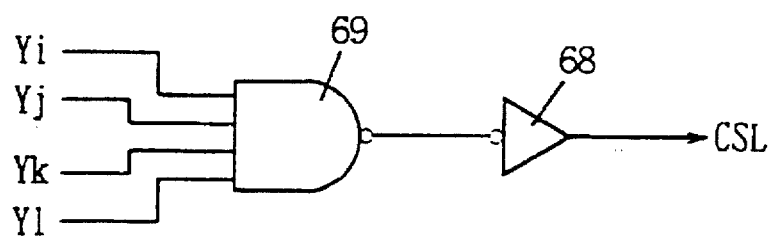
FIG. 50 shows a circuit for generating a CSL signal.

FIGS. 46 to 50 are schematic diagrams for generating various clock signals shown in FIG. 42. More specifically, FIG. 46 shows a circuit for generating row predecoder outputs Xi, j, k, FIG. 47 shows a circuit for generating the master row decode signal φxi, FIG. 48 shows a circuit for generating the word line driving signal, FIG. 49 shows a circuit for generating the column SFU/L signal, and FIG. 50 shows a circuit for generating the column selection signal. As shown in FIG. 46, internal address signals A0 to A3 are applied to a row address buffer 61, row address signals RA0, $\overline{RA0}$ to RA3, $\overline{RA3}$ are provided, of which row address signals RA2, $\overline{RA2}$, RA3, $\overline{RA3}$ are applied to a row predecoder 62 and decoded into row predecode signals X1, X2, X3 and X4. Row address signals RA0, $\overline{RA0}$, RA1 and $\overline{RA1}$ are applied to a sub decoder 63 shown in FIG. 47. To sub decoder 63, the master row signal φx has been applied, and in response to the row address signals RA0, $\overline{RA0}$, RA1 and $\overline{RA1}$, sub decoder 63 selects the master row signal φx and provides φx1 to φx4.

The row predecode signals X1 to X4 shown in FIG. 46 are applied to a row decoder 64 shown in FIG. 48, and any of the signals φx1 to φx4 of FIG. 47 is applied to the gate of the selection gate Tr51 of FIG. 48. When the selection gate Tr51 is rendered conductive by the signal φx1, the decoded output of row decoder 64 is output as the word line driving signal through a word line driver consisting of n channel transistor Tr54 and p channel transistor Tr55. The master row signal φx is delayed by a delay circuit 67 shown in FIG. 49 and applied to one input and of an AND gate 65. The row predecode output X1 or X3 and X2 or X4 are applied to the other input end of the AND gate 66 through an OR gate 65, and from the AND gate 66, the signal SFU/L is provided. As shown in FIG. 50, column predecode signals Yi, j, k, l are provided from a column predecoder, not shown, applied to a column decoder 69, and the output thereof is inverted by an inverter 68 and output as the CSL signal.

The operations of the circuits for generating the various clock signals shown in FIG. 46 to 49 will be briefly described with reference to FIG. 43.

As shown in (c) of FIG. 43, internal address signal An is applied to address buffer 61 and output from address buffer 61 as a row address signal RAn as shown in (d) of FIG. 43, and applied to row predecoder 62. From row predecoder 62, a predecode signal Xi is provided as shown in (f) of FIG. 43. As shown in (j) of FIG. 43, from master row signal φx and row address signal RAn, sub decoder 63 provides signals φx1 to φx4 as shown in (k) of FIG. 43. Row decoder 64 shown in FIG. 48 performs decoding operation in accordance with the row predecoder outputs Xi, j, k, and selection gate Tr51 is rendered conductive in response to the signal φxi and provides the word line driving signal shown in (1) of FIG. 43. The master row signal φx is delayed by delay circuit 67, an OR of the row predecode output X1 or X3 and X2 or X4 is obtained by OR gate 65, an AND of the output from OR gate 65 and the output from delay circuit 67 is provided by AND gate 66, and the signal SFU/L is output as shown in (n) of FIG. 43. Referring to FIG. 50, column decoder 69 provides the AND of column address signals Yi to Y1, the output thereof is inverted by inverter 68 and output as the CSL signal.

FIG. 51 is a schematic diagram showing a second embodiment in accordance with the seventh aspect of the present invention. In the embodiment of FIG. 51, the transfer gates BSA and BSB shown in FIG. 42 are replaced by p channel transistors Tr61 to 64, the voltage lowering circuit 60 shown in FIG. 42 is eliminated, and to the drive line $\overline{SP}$ of p channel sense amplifier 4, the power supply voltage Vcc' is applied through transistor Tr65. Transistors Tr61 and Tr62 are controlled by control signal $BLI_L$, while transistor Tr63 and Tr64 are controlled by control signal $BLI_R$. The equalizing circuit shown in FIG. 42 is not shown in FIG. 51.

FIG. 52 is a time chart showing the operation of the embodiment show in FIG. 51. The operation of the embodiment shown in FIG. 51 will be described with reference to FIG. 52. At the time of precharging, control signals $VLI_L$ and $VLI_R$ are at the "L" level, transistors Tr61 to Tr64 are rendered conductive, and the bit lines BL and $\overline{BL}$ are precharged to the potential of VBL. When the left side block is selected, the control signal $BLI_R$ attains to "H" level, and transistors Tr63 and Tr64 are rendered non-conductive. Then, referring to (a) of FIG. 52, the word line WL rises to the potential of Vpp, and data is read from memory cell 1 to the bit line pair BL, $\overline{BL}$ shown in (b) of FIG. 52. The read data is amplified by n channel sense amplifier 2 and then by p channel sense amplifier 4. At this time, the drive line SN of n channel sense amplifier 2 is connected to the ground level Vss through switch 71, while drive line $\overline{SP}$ of p channel sense amplifier 4 is connected to the power supply voltage Vcc' through transistor Tr65. Since $BLT_L$ is at the low level of the word lines Vss', the "H" level of the bit line pair BL, $\overline{BL}$ is at the level of the power supply voltage Vcc', while "L" level is floating higher than the low level of the word lines Vss' by the threshold voltage Vth of transistors Tr61 and Tr62. More specifically, it is at the level Vss' higher than the low level of the word lines Vss by the threshold voltage Vth. In the embodiment shown in FIG. 51, the dummy GND level generating circuit 19 shown in FIG. 42 is not necessary. Since the sense amplifiers fully swing to the low level of the word lines Vss, the sensitivity can be improved.

Figure 53:
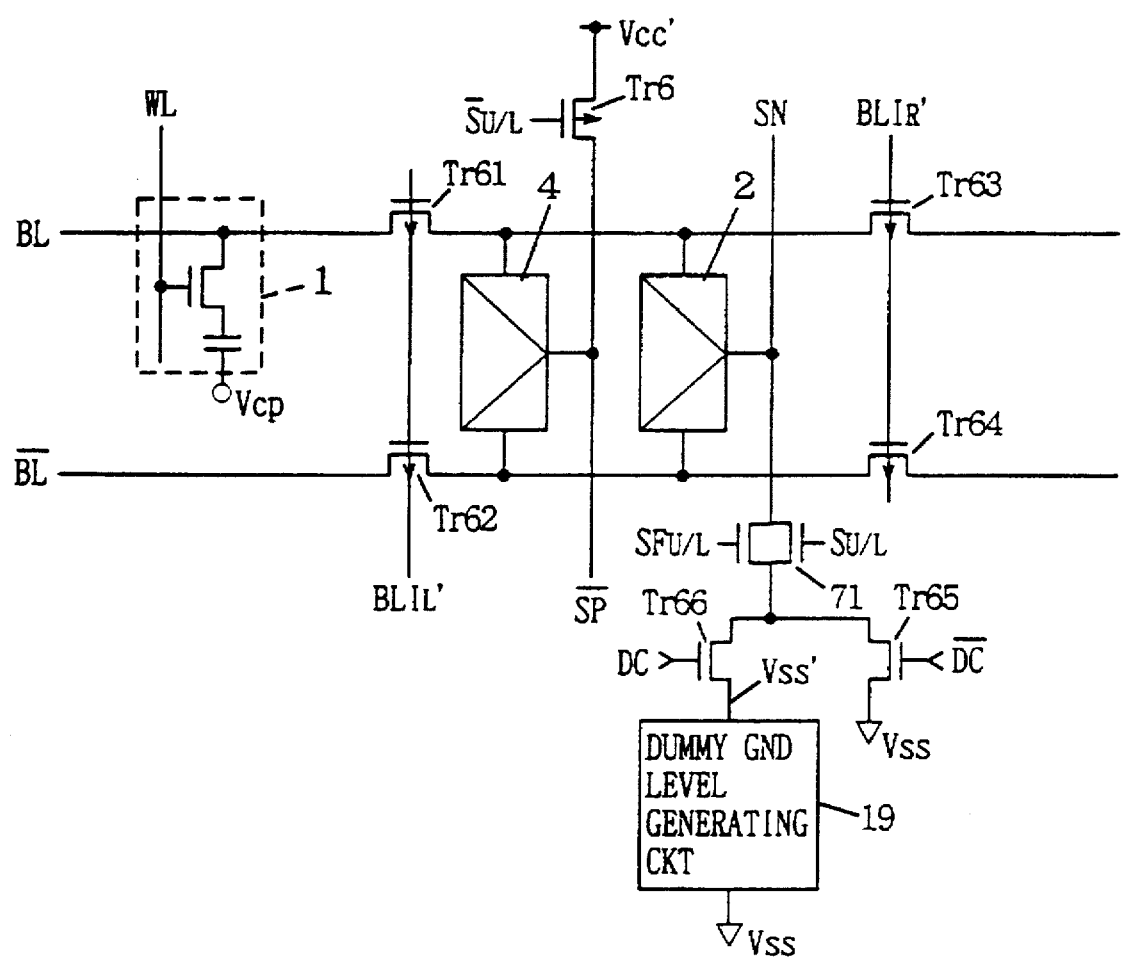
FIG. 53 is a schematic diagram showing a third embodiment in accordance with the seventh aspect of the present invention.

FIG. 53 is a schematic diagram showing a third embodiment in accordance with the seventh aspect of the present invention. This embodiment is an improvement over that of FIG. 51, which addresses the problem of the embodiment of FIG. 51 that when the sense drive lines SN and $\overline{SP}$ are equalized, the potential of bit line pair BL, $\overline{BL}$ attains not to VBL=(Vcc'+Vss')/2 but to Vcc'/2. More specifically, in this embodiment, sense drive line SN is connected to the drains of transistors Tr65 and Tr66 through switch circuit 71, transistor Tr65 receives at its gate the control signal DC and has its source grounded. The transistor Tr66 receives at its gate the control signal DC and at its source, the potential Vss' from the dummy GND level generating circuit 19.

Figure 54:
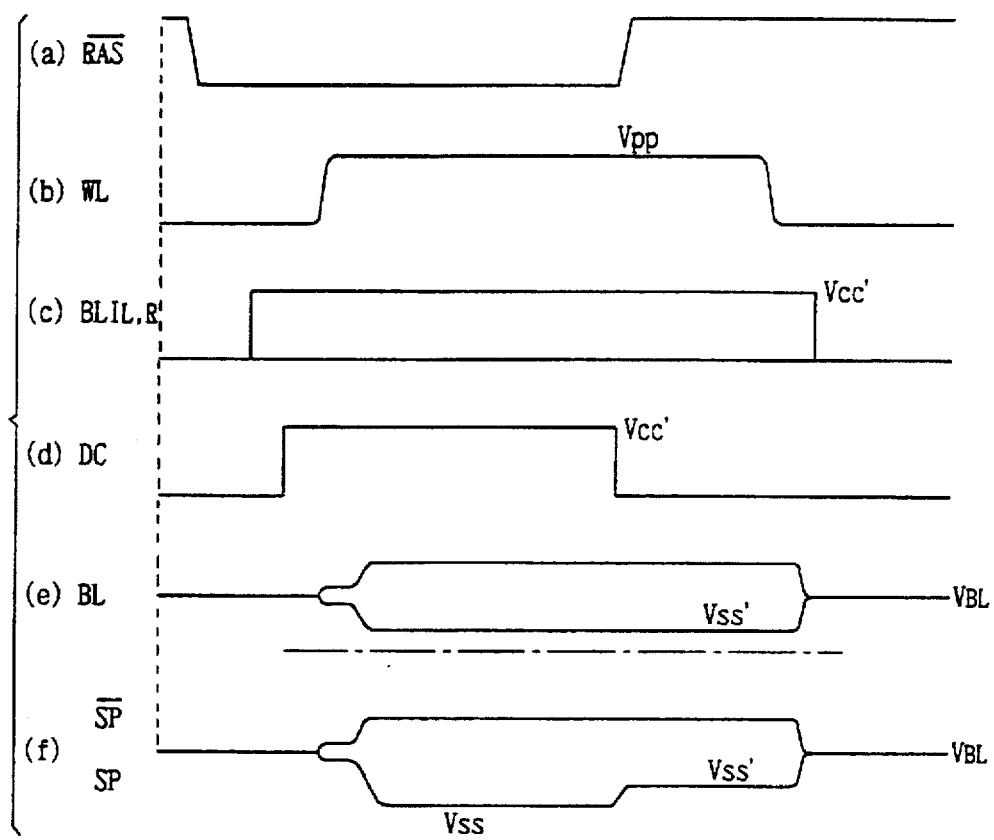
FIG. 54 is a time chart showing the operation of the embodiment shown in FIG. 53.

FIG. 54 is a time chart showing the operation of the embodiment of FIG. 53. The operation of the embodiment shown in FIG. 53 will be described with reference to FIG. 54. At the start of sensing operation, when row address strobe signal $\overline{RAS}$ of (a) of FIG. 54 attains to the "L" level, this signal is delayed and provided as the control signal DC. More specifically, when control signal DC rises to Vcc' as shown in FIG. 54(d), transistor Tr65 is rendered conductive, and sense drive line SN attains to the low level of the word lines Vss level through switch circuit 71. Namely, sense amplifier 2 operates with the potential difference between the low level of the word lines Vss and the power supply potential Vcc', resulting higher sensitivity. Then, after the lapse of a prescribe time period, control signal $\overline{DC}$ rises to Vcc', so that transistor Tr66 is rendered conductive, the potential Vss' is applied from dummy GND level generating circuit 19 to sense drive line SN, and the precharge potential of sense amplifier 2 becomes equal to the bit line potential VBL. More specifically, in the embodiment shown in FIG. 53, at the initial state of sensing operation, the sense drive line SN operates with the potential difference between the low level of the word lines and Vcc', and after the lapse of a prescribed time period, it operates between the potential Vss' which is higher than the low level of the word lines Vss and the power supply voltage Vcc', as shown in (f) of FIG. 54.

Figure 55:
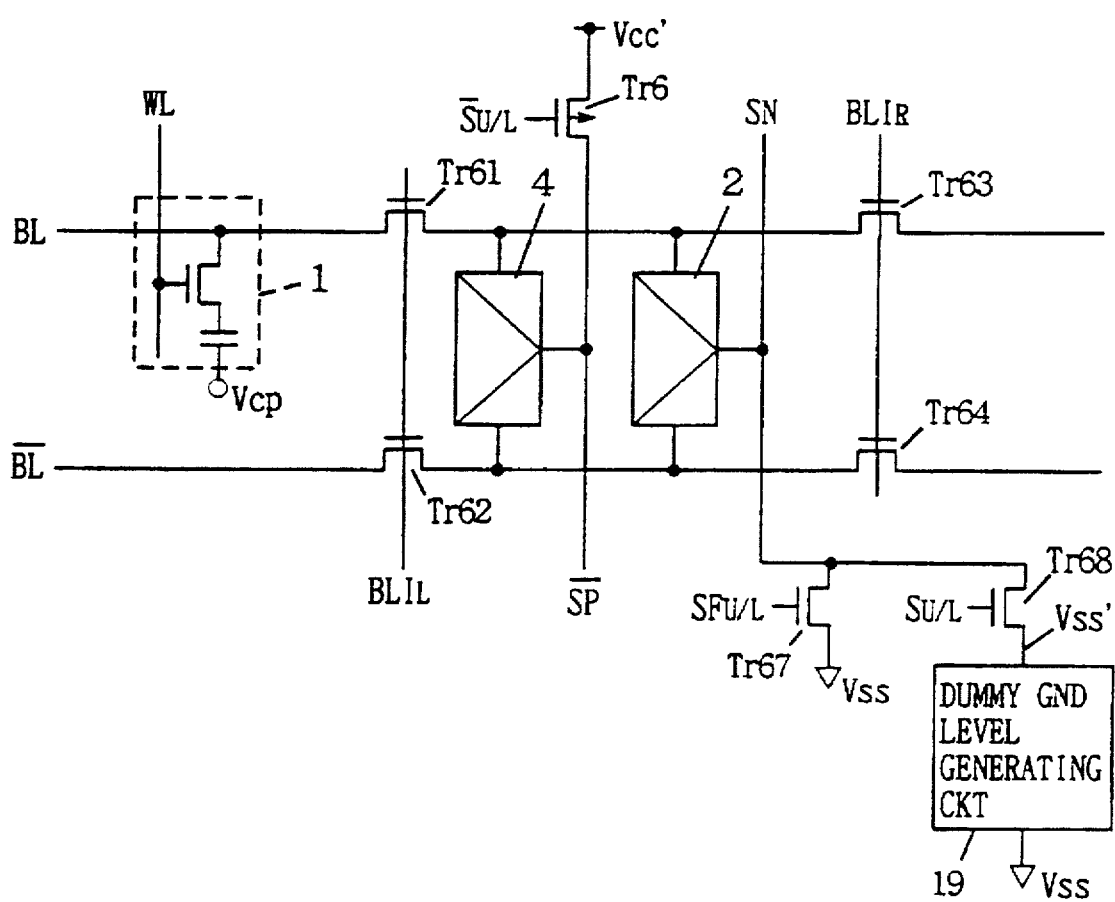
FIG. 55 is a schematic diagram showing a fourth embodiment in accordance with the seventh aspect of the present invention.

FIG. 55 is a schematic diagram showing a fourth embodiment in accordance with the seventh aspect of the present invention. In the embodiment shown in FIG. 55, the potential of sense drive line SN is switched between the low level of the word lines Vss' and the dummy GND potential Vss' by means of transistors Tr67 and Tr68. Transistor Tr67 is rendered conductive by control signal SFU/L, while transistor Tr68 is controlled by control signal SU/L. Transistor Tr67 has its source connected to the low level of the word lines Vss', and transistor Tr68 has its source connected to the dummy GND level generating circuit 19.

Figures 56, 57:
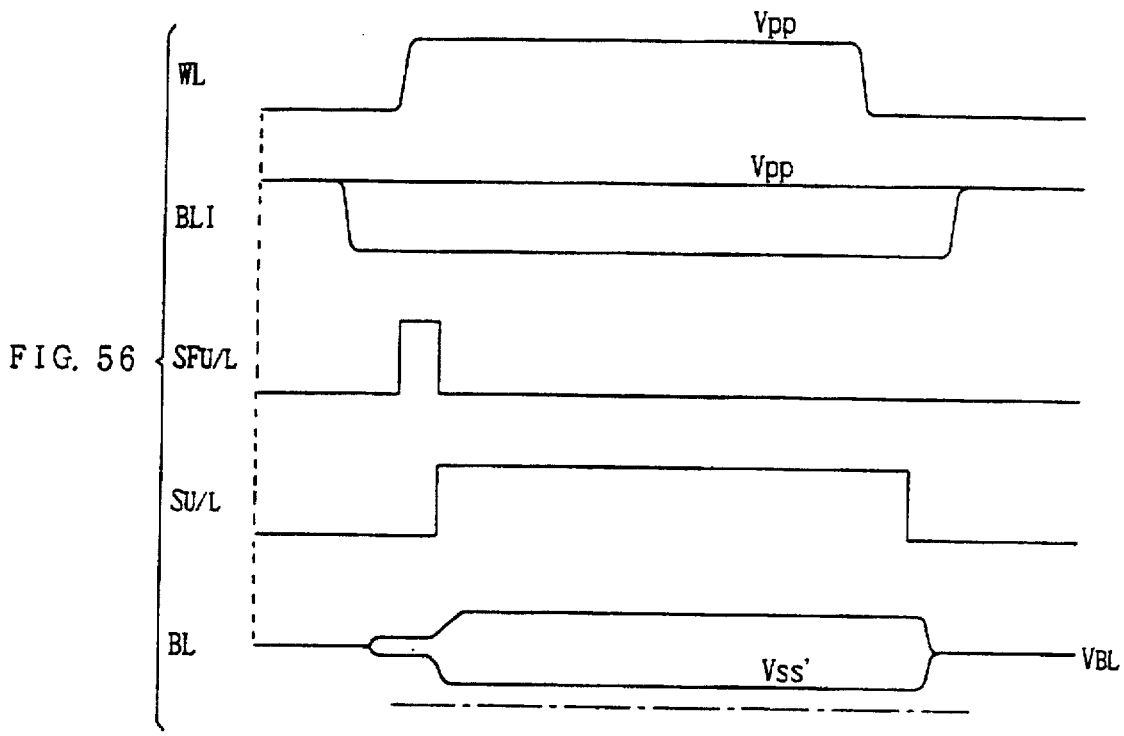
FIG. 56 is a time chart showing the operation of the embodiment shown in FIG. 55.
FIG. 57 is an illustration of the principle of an eighth aspect of the present invention.

FIG. 56 is a time chart showing the operation of the embodiment shown in FIG. 55. As shown in FIG. 56(c), at the start of sensing operation, the signal SFU/L attains to the "H" level, transistor Tr67 is rendered conductive, and the sense drive line SN attains to the low level of the word lines Vss. Therefore, sense amplifier 2 operates between the low level of the word lines Vss and the power supply voltage Vcc', resulting in higher sensitivity at the initial stage of sensing and faster sensing operation. Referring to (e) of FIG. 56, before the "L" level potential of the bit line BL attains to the dummy GND level Vss', the signal SFU/L attains to the "L" level and the control signal SU/L attains to the "H" level as shown in FIG. 56, so that transistor Tr68 is rendered conductive, and the dummy GND level Vss' is applied to sense drive line SN, preventing overswing of bit lines BL and $\overline{BL}$.

FIG. 57 is an illustration showing the principle of an eighth aspect of the present invention. In the eighth aspect of the present invention, the dummy GND level higher than the low level of the word lines by a predetermined potential is set as in the first aspect of the present invention shown in FIG. 1(b), and in addition, an internal power supply voltage Int.Vcc which is lower than the external power supply voltage Ext.Vcc by a predetermined potential is generated, so that the IC operates between the internal power supply voltage Int.Vcc level and the dummy GND level. The IC operational voltage is selected to improve data retention characteristic of the DRAM memory cells, and other potential may be set for other circuit portions.

Figure 58:
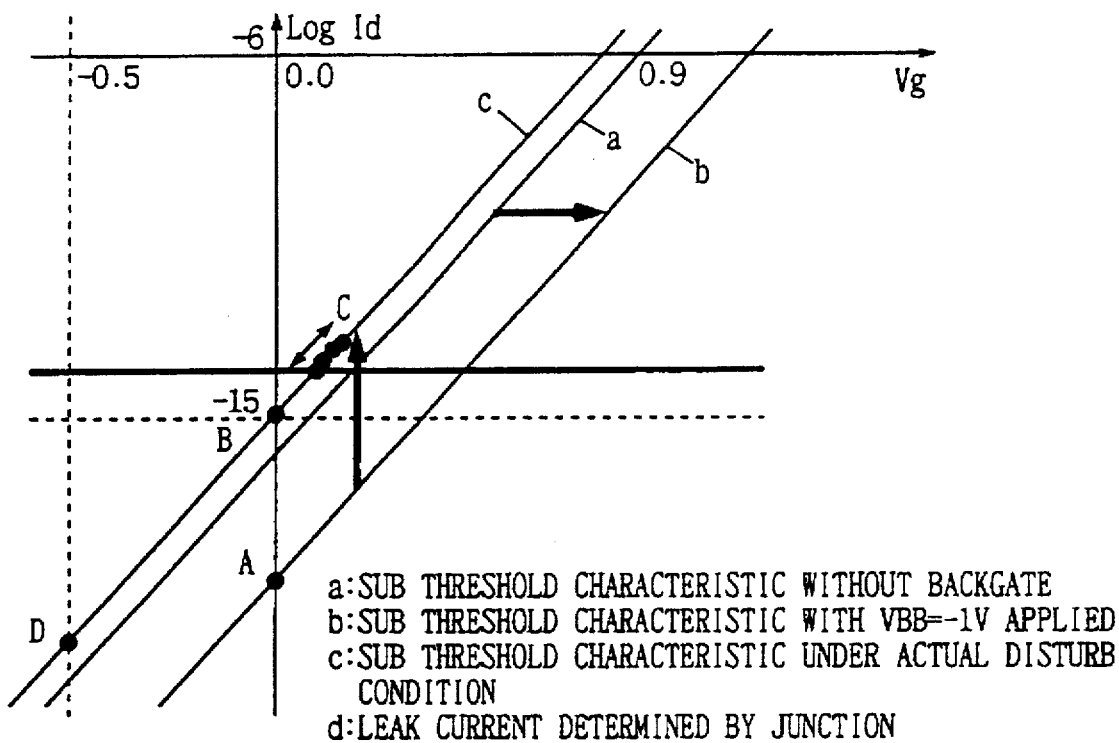
FIG. 58 is an illustration showing sub threshold leak current of the word line in the present invention in accordance with the eighth aspect.

FIG. 58 is an illustration showing sub threshold leak current of the word line with respect to the eighth aspect of the present invention.

In the state shown in FIG. 57, the operational voltage of the bit line system including the memory cells is between the internal power supply voltage Int.Vcc and the dummy GND. In other words, the amplitude level of the "L" level side of the bit line is the dummy GND. The non-selected level of the word line is the GND level. Consequently, the non-selected level of the word line is made lower relative to the "L" level of the bit line, reducing the sub threshold leak current.

This will be described with reference to FIG. 58. FIG. 58 shows sub threshold leak of the word line, in which the abscissa represents the gate voltage and the ordinate represents the Log value of the leak current. The sub threshold leak current characteristic of the word line when substrate potential is not applied is represented by a, and the level of the junction leak current is represented by d. If the gate voltage is 0V, the sub threshold leak current is maintained smaller than the junction leak current. When a negative substrate potential is applied, it changes as shown by b and further decreases. However, actually, the characteristic changes as shown by c dependent on the state of application of voltage between the source.drain and increase in temperature, and therefore the sub threshold leak current when the gate voltage is 0V is degraded to B. In this state, there is little margin with respect to the junction leak current, and therefore it is highly possible that it becomes larger than the junction leak current shown by C, responding to small gate potential noise with excessively high sensitivity. However, at this time, if the gate potential is set relatively negative by applying the present invention, the sub threshold leak current can be made sufficiently small as shown by D. Therefore, the substrate potential can also be set shallower. For example, if a substrate potential of −80 mV is applied, the leak current can be reduced by one order of magnitude.

Figure 59:
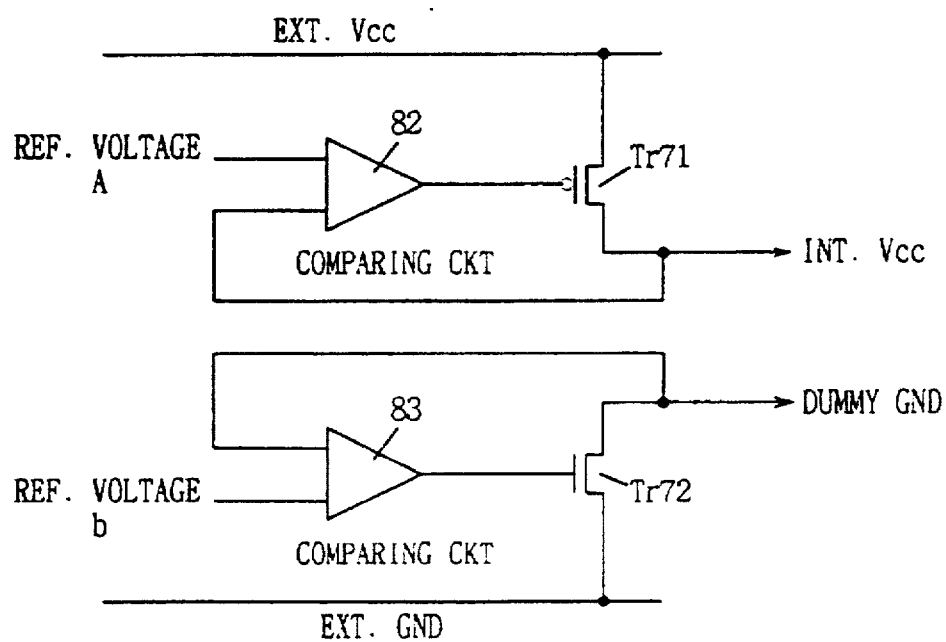
FIG. 59 is a schematic diagram showing a first embodiment in accordance with the eighth aspect of the present invention.

FIG. 59 is a schematic diagram showing a first embodiment in accordance with the eighth aspect of the present invention. Referring to FIG. 59, a p channel transistor Tr71 has its source connected to the line of the external power supply voltage Ext.Vcc, its gate connected to an output of a comparing circuit 82, its drain connected to a comparing input end of comparing circuit 82, and from the drain, the internal power supply voltage Int.Vcc is provided. Comparing circuit 82 compares the internal power supply voltage Int.Vcc with a reference voltage A, and lowers the external power supply voltage Ext.Vcc to internal power supply voltage Int.Vcc. An n channel transistor Tr72 has its drain connected to the external GND, its gate connected to an output of a comparing circuit 82, and its source provides the dummy GND, and is connected to a comparing input end of a comparing circuit 83. Comparing circuit 83 compares the dummy GND with the reference voltage, and generates the dummy GND level which is slightly higher than the external GND, from n channel transistor Tr72.

Figures 60A, 60B, 60C:
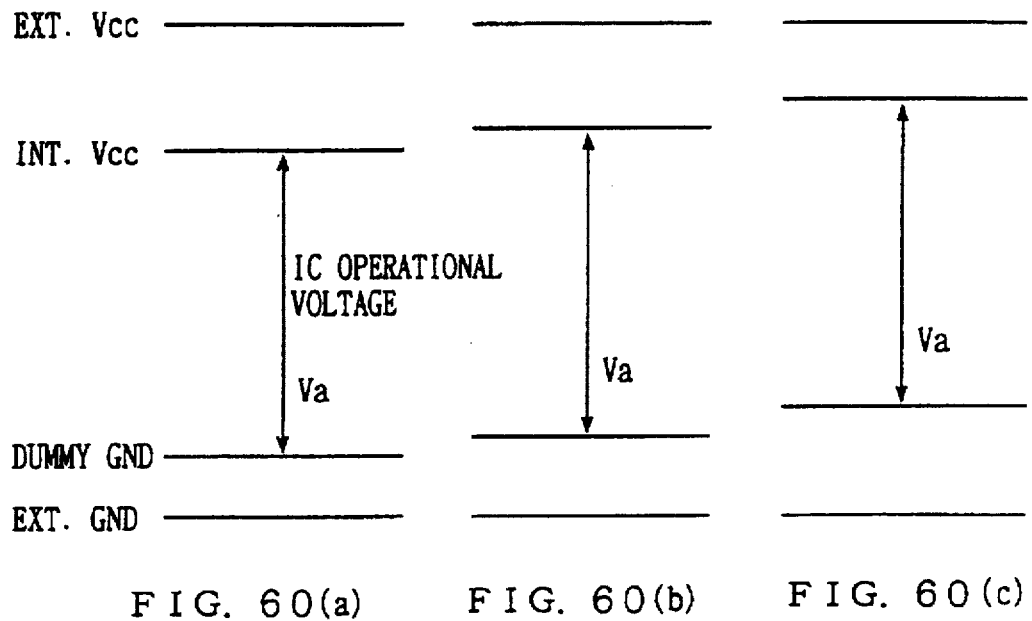
FIG. 60 shows an IC operation voltage in the embodiment shown in FIG. 59.
Figures 61A, 61B, 61C:
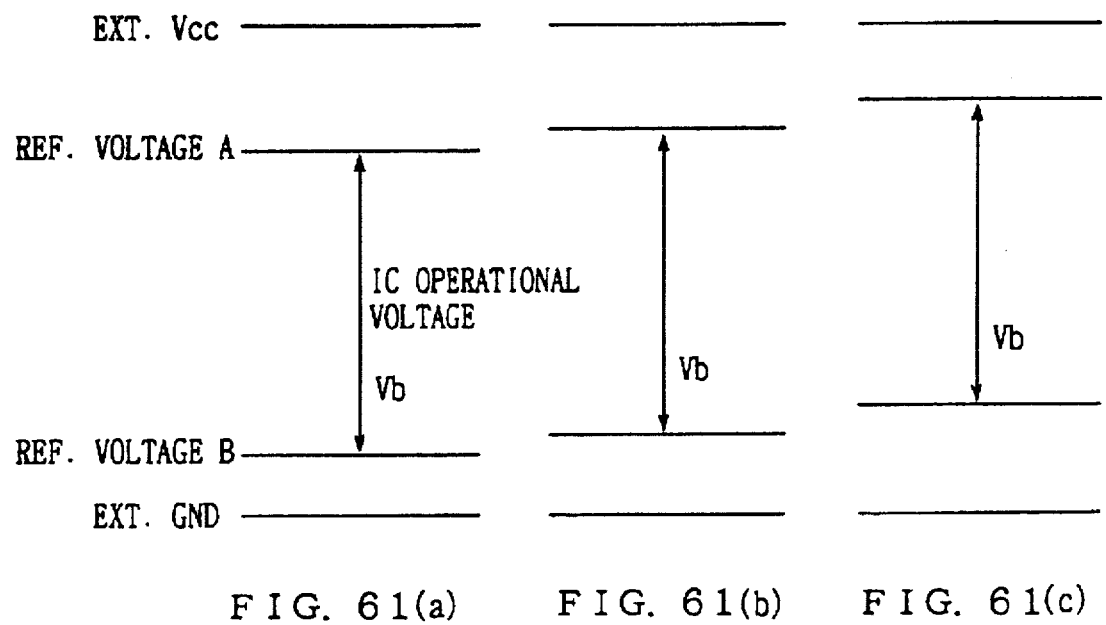
FIG. 61 shows a change in a reference voltage in the embodiment shown in FIG. 59.

FIG. 60 shows IC operational voltage of the embodiment shown in FIG. 59, and FIG. 61 shows changes in the reference voltage of the embodiment shown in FIG. 59.

As in the embodiment shown in FIG. 59, newly setting the dummy GND while maintaining constant the internal power supply voltage Int.Vcc further reduces the operational voltage of the memory cell especially when the DRAM memory array circuit is operated. This leads to reduction of the amount of charges to be stored in the memory cells, causing undesirable degradation of retention characteristic. Therefore, in that case, the internal power supply voltage Int.Vcc may be shifted in accordance with the amount of shift of the dummy GND from the operational range shown in (a) of FIG. 60 to (b) or (c) of FIG. 60 in order to ensure sufficient amount of charges to be stored.

By this structure, the amount of charges stored in the memory cell can be maintained, and the sub threshold leak current can be suppressed by such a structure as shown in FIG. 59. In addition, the substrate bias potential can be reduced and the junction leak current can also be suppressed. Therefore, retention characteristic of the memory cell can be significantly improved. This can be implemented quite simply, only by controlling the reference voltages A and B applied to the internal power supply voltage generating circuit and to the dummy GND generating circuit such that the difference therebetween is kept constant. More specifically, referring to (a) to (c) of FIG. 61, the reference voltages A and B should be set such that the difference Vb provided by subtracting the reference voltage A for generating the internal power supply voltage Int.Vcc from the reference voltage B for generating the dummy GND is kept unchanged. However, as can be readily understood from the embodiment shown in FIG. 59, the potentials of the internal power supply voltage Int.Vcc and of the dummy GND can be freely adjusted by changing the amount of shifts of the reference voltages A and B.

Figure 62:
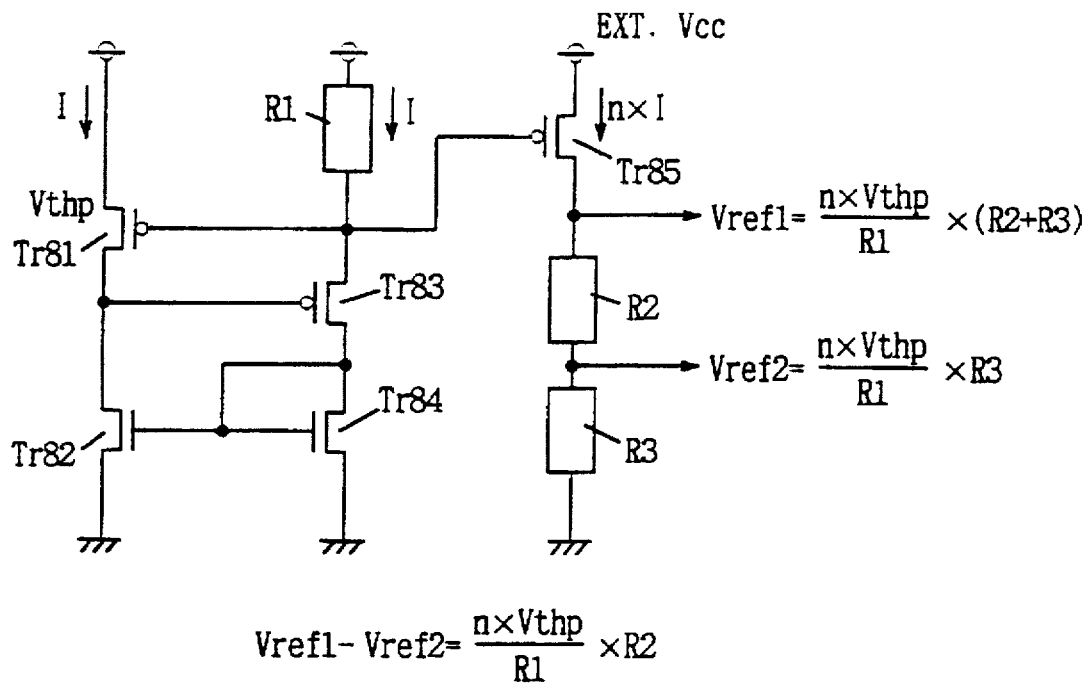
FIG. 62 is an electric circuit diagram showing an example of a reference voltage generating circuit for generating the reference voltage detected in FIG. 59.

FIG. 62 is a schematic diagram showing an example of the reference voltage generating circuit for generating the reference voltage shown in FIG. 59. Referring to FIG. 62, a p channel transistor Tr81 has its source connected to the external power supply voltage Ext.Vcc line, and its drain connected to the drain of an n channel transistor Tr82 and to the gate of a p channel transistor Tr83. The n channel transistor Tr82 has its source grounded, and the p channel transistor Tr83 has its source connected to the gate of p channel transistor Tr81, the gate of p channel transistor Tr85 and to one end of a resistor R1. The resistor R1 has the other end connected to the external power supply voltage Ext.Vcc line.

The p channel transistor Tr83 has its drain connected to the gate of n channel transistor Tr82 and to the gate and the drain of n channel transistor Tr84. The n channel transistor Tr84 has its source grounded, and p channel transistor Tr85 receives at its source the external power supply voltage Ext.Vcc. The p channel transistor Tr85 has its drain grounded through resistors R2 and R3. From the node between the drain of p channel transistor Tr85 and the resistor R2, the reference voltage Vref1 is provided, and from the node between resistors R2 and R3, the reference voltage Vref2 is provided.

In the reference voltage generating circuit shown in FIG. 62, n channel transistors Tr82 and Tr84 and p channel transistor Tr83 constitute a current mirror circuit, and therefore the current I flowing through p channel transistor Tr81 comes to be equal to the current I flowing through resistor R1. At this time, the amount of current can be represented as I=Vthp/R1, as the threshold value Vthp of p channel transistor Tr81 and the potential drop across resistor R1 are the same. If p channel transistors Tr81 and Tr85 have the same size, e.g. as the same channel width, the same current flows through respective transistors. However, when p channel transistor Tr85 is adapted to have the current drivability n times that of p channel transistor Tr81 by changing, for example, the channel width of p channel transistor Tr85, the amount of current flowing through p channel transistor Tr85 can be represented as nI. Therefore, the currents flowing through resistors R2 and R3 can be represented as nI, and reference voltages Vref1 and Vref2 have the following values.

Vref1={(n×Vthp)/R1}×(R2+R3)

Vref2={(n×Vthp)/R1}×R3

At this time, the difference between the reference voltages Vref1 and Vref2 is represented by Vref1−Vref2={(n×Vthp)/R1}×R2

Namely, the difference between the reference voltages Vref1 and Vref2 is represented as the potential drop of resistor R2 caused by the current flowing through p channel transistor Tr85, and therefore it is possible to shift while the difference between the reference voltages Vref1 and Vref2 is maintained, only by changing the resistance of resistor R3.

Figure 63:
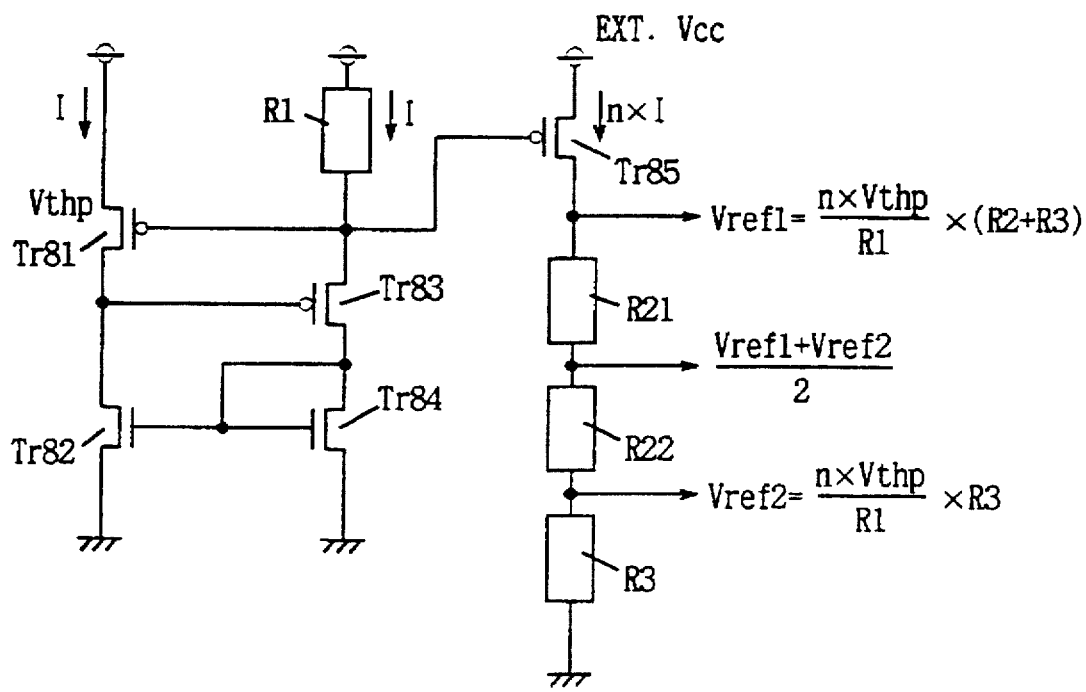
FIG. 63 shows an improvement of the reference voltage generating circuit shown in FIG. 62.

FIG. 63 shows an improvement of the reference voltage generating circuit shown in FIG. 62. When the internal power supply voltage Int.Vcc and the dummy GND are generated based on the reference voltages generated from the reference voltage generating circuit shown in FIG. 62 and the memory cell is operated in accordance with the generated voltages, it becomes necessary to shift the ½ Vcc level of the ½ Vcc bit line precharge method currently used in the DRAM as well. Therefore, in the example shown in FIG. 63, the resistor R2 is replaced by resistors R21 and R22 by dividing the resistance to ½. From the node between the resistors R21 and R22, a new reference voltage (Vref1+Vref2)/2 is generated. When the ½ Vcc generating circuit is configured based on the new reference voltage, the ½ Vcc level potential can be readily generated, and therefore even when the internal power supply voltage Int.Vcc and the dummy ground GND change, the change can be followed.

Figure 64:
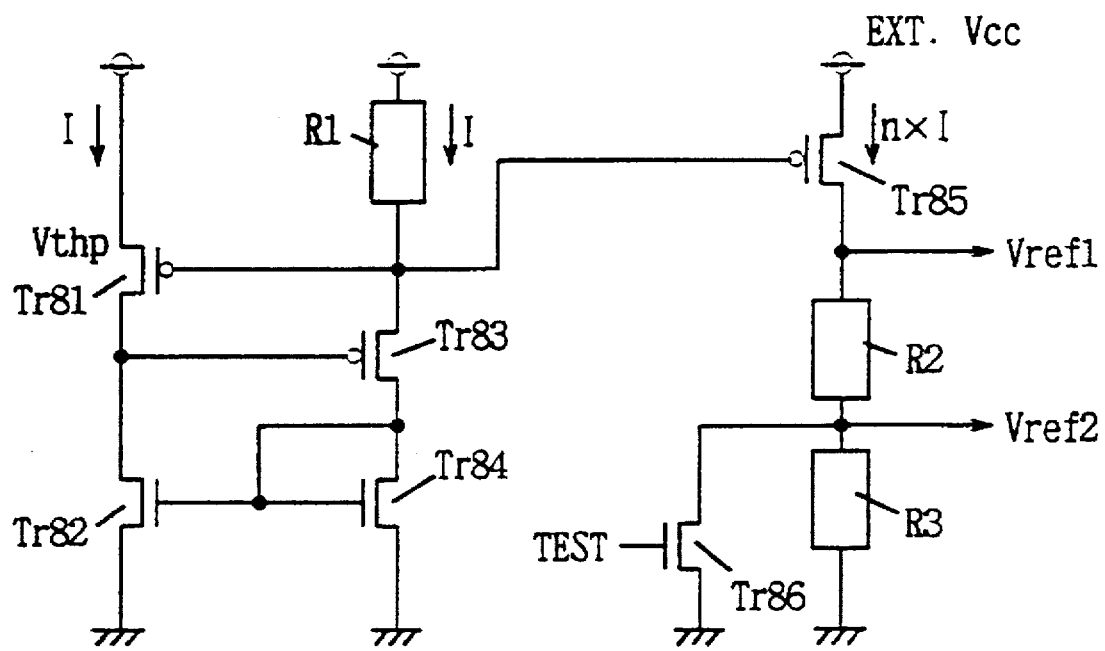
FIG. 64 shows a further improvement of the reference voltage generating circuit shown in FIG. 62.

FIG. 64 is a schematic diagram showing a still another improvement of the reference voltage generating circuit shown in FIG. 62. The embodiment of FIG. 64 is adapted such that the dummy GND and the internal power supply voltage Int.Vcc generated based on the reference voltages Vref1 and Vref2 set in the circuit configuration shown in FIG. 62 can be shifted provisionally. More specifically, it is used when the dummy GND is set at approximately the same potential as the external GND provisionally, and in this example, an n channel transistor Tr86 is connected parallel to the resistor R3, and to the gate of n channel transistor Tr86, a test signal is applied.

Figure 65:
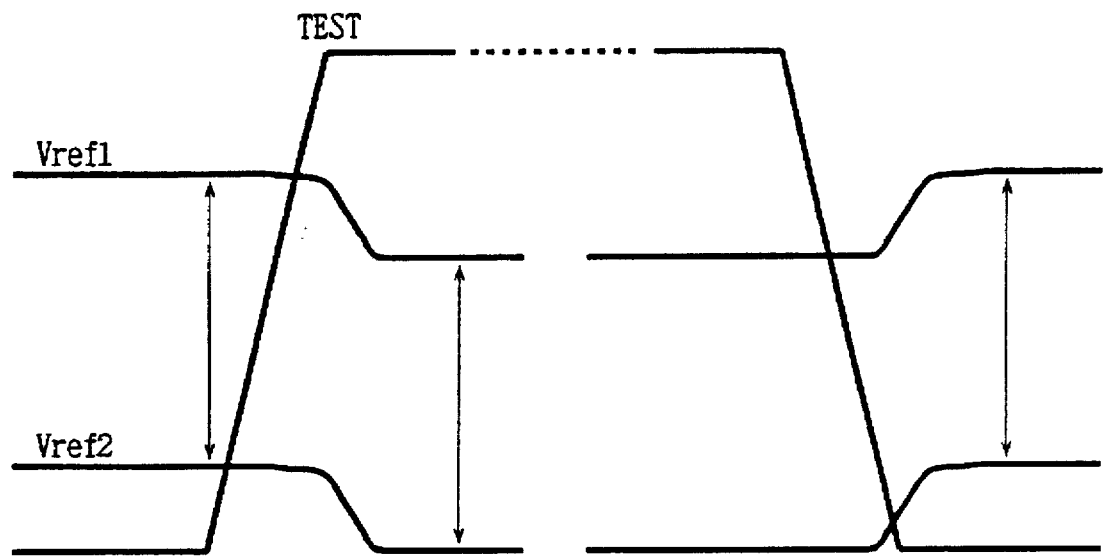
FIG. 65 is a diagram of waveforms showing the operation of the reference voltage generating circuit of FIG. 64.

FIG. 65 is a diagram of waveforms showing the operation of the circuit shown in FIG. 64. Generally, the test signal applied to the gate of n channel transistor Tr86 is at the inactive state of "L" level, and reference voltages Vref1 and Vref2 are set at prescribed potentials as already described with reference to FIG. 62. If desired, for example when it is desired to evaluate the retention characteristic of the memory cell with the sub threshold leak current accelerated with the storage capacity of the memory cell maintained, it is possible to lower the potential while the potential difference between the internal power supply voltage Int.Vcc and the dummy GND is kept constant, by short-circuiting the reference voltage Vref2 to the external GND, by activating the test signal to "H" level. After the end of the test, the test signal is again inactivated, and the potentials of reference voltages Vref1 and Vref2 can be set to the previous potentials.

Figure 66:
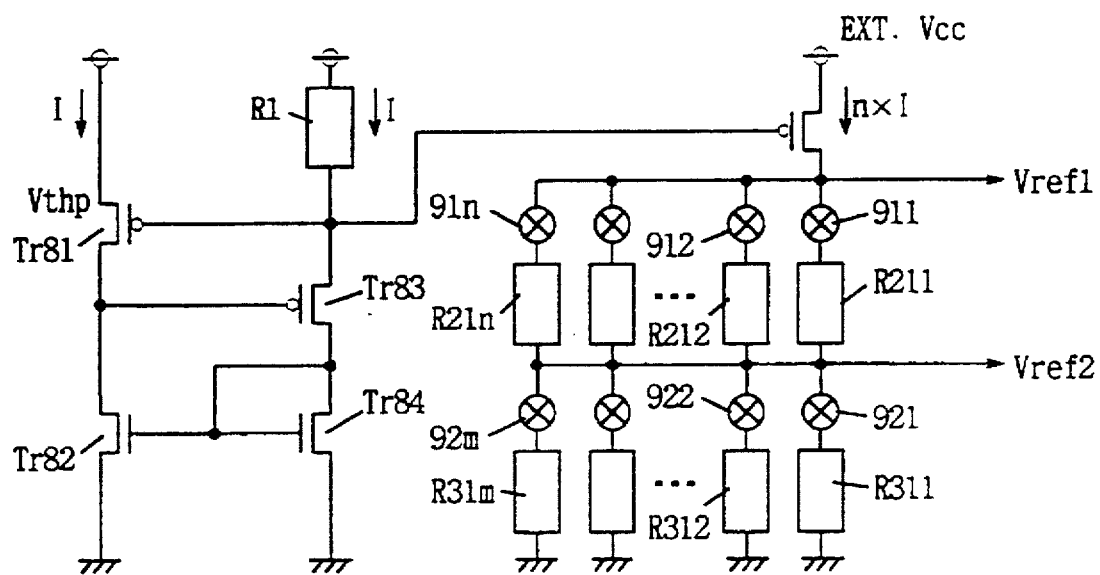
FIG. 66 shows a further example of the reference voltage generating circuit.

FIG. 66 is a schematic diagram showing a still further example of the reference voltage generating circuit shown in FIG. 66. In the reference voltage generating circuit shown in FIG. 66, the resistor R2 of FIG. 62 is replaced by n resistors R211, R212, . . . , R21n connected in parallel, and resistor R3 is replaced by m resistors R311, R312, . . . , R31m connected in parallel. Corresponding to respective resistors R211, R212, . . . , R21n, fuses 911, 912, . . . , 91n are provided, and corresponding to the resistors R311, R312, . . . , R31m, fuses 921, 922, . . . , 92m are provided. By changing respective resistance values by blowing off the fuses 911, 912, . . . , 91n and 921, 922, . . . , 92m by laser trimming or other means, the reference voltages Vref1 and Vref2 can be adjusted. A voltage determined by the voltage drop derived from the resistances of resistor R311, R312, . . . , R31m is provided as reference voltage Vref2, and as a voltage between the reference voltages Vref1 and Vref2, a voltage determined by the voltage drop across resistors R211, R212, . . . , R21n and R311, R312, . . . , R31m is provided. The resistance value increases as larger number of fuses are blown off, and thus the voltage value can be freely adjusted.

Figure 67:
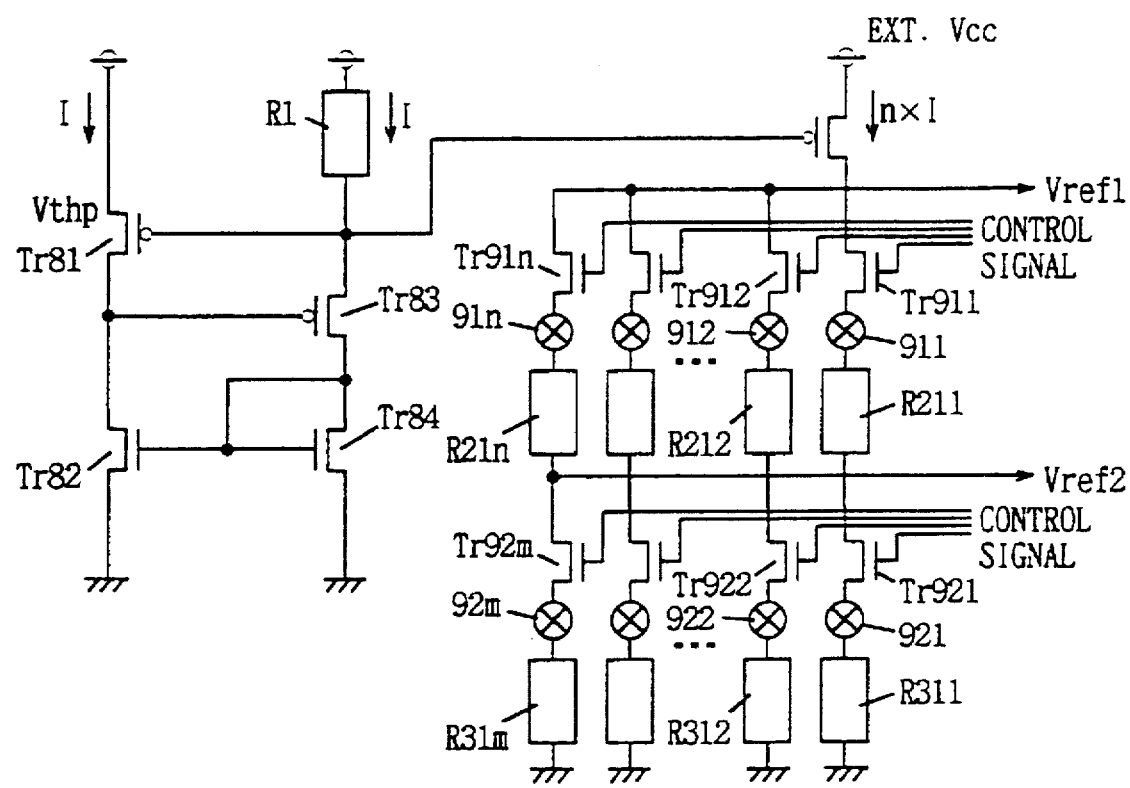
FIG. 67 shows a still further example of the reference voltage generating circuit.

FIG. 67 shows a still another example of the reference voltage generating circuit. In the reference voltage generating circuit shown in FIG. 67, n channel transistor Tr911, Tr912, . . . , Tr91n, Tr921, Tr922, . . . , Tr92m are connected in series to fuses 911, 912, . . . , 91n, 921, 922, . . . , 92m, respectively. Before blowing off the fuse, the corresponding transistor is rendered conductive so as to adjust the values of the reference voltages Vref1 and Vref2, test result is confirmed, and then the fuse is blown off to provide the desired voltage. In this case, on resistance of each of n channel transistors Tr911, Tr912, . . . , Tr91n, Tr921, Tr922, . . . , Tr92m must also be considered.

The embodiment shown in FIG. 67 can be applied not only to testing but also special applications. For example, recently a method has been proposed in which refreshing of the DRAM memory cell is controlled so that the interval between refreshing is made longer than specified in the standard specification so as to reduce current consumption in refreshing operation which is the bottleneck of the DRAM, specially when the DRAM is not used for a long period of time. At this time, if further reduction of current consumption is desired, the operational voltage may be reduced in addition to widening of the interval between refreshing operations. In such a circumstance, the circuit shown in FIG. 67 may be used to shift the operational voltage to the optimal state, so as to reduce current consumption.

Figure 68:
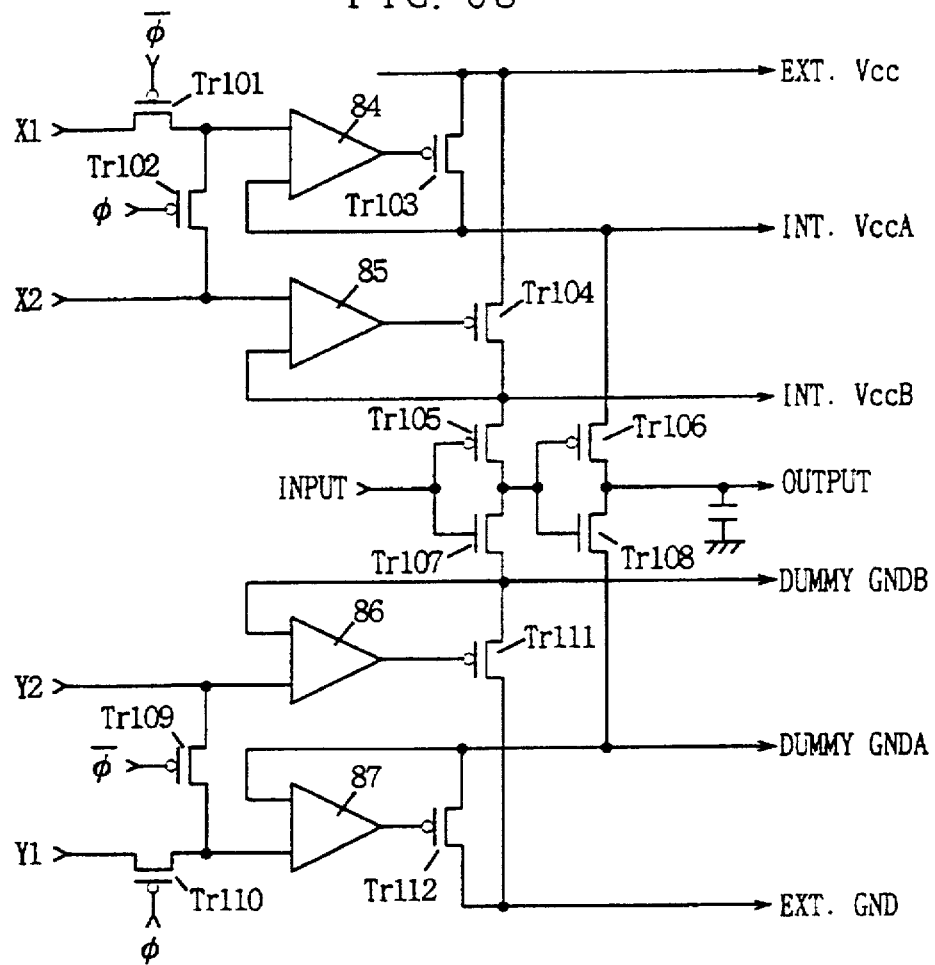
FIG. 68 is a schematic diagram of an embodiment in which power consumption is reduced in refreshing operation, when the chip is not used.

FIG. 68 is a schematic diagram of an embodiment in which power consumption is reduced at the time of refreshing operation, when the chip is not used.

For example, in a DRAM, in normal operation, the subthreshold leak current of the word line is increased by disturbing during normal operation. Accordingly, it is assumed that the operational voltage of the memory cell is modified by the circuit of the present invention and the power supply for the constant potential is set slightly higher than the power supply of the lower potential side. Thereafter, the chip is kept inoperative for a long period of time and only the refreshing operation is carried out. In that case, there is not much disturbing and therefore increase of the leak current because of the disturbing is not a serious problem. Then, by lowering the lower potential side of the operational voltage of the memory cell, the electric field across the junction of the memory cell is made smaller, whereby increase of the leak current because of the junction leak can be reduced.

The embodiment shown in FIG. 68 is adapted to switch the internal power supply voltage between Int.VccA and B, and dummy GNDA and B in such a case.

Referring to FIG. 68, the structure will be described. A p channel transistor Tr101 receives at its source a reference signal X1 for generating an internal power supply voltage Int.VccA, at its gate a clock signal $\bar{\phi}$, and has its drain connected to a comparing input and of a comparing circuit 84. An output from comparing circuit 84 is connected to the gate of a p channel transistor Tr103. The transistor Tr103 receives at its source an external power supply voltage Ext.Vcc, and has its drain connected to a reference input end of comparing circuit 84 and provides the internal power supply voltage Int.Vcc A. A reference signal X2 for generating an internal power supply voltage Int.VccB is applied to a comparing input end of a comparing circuit 85, and the output from comparing circuit 85 is connected to the gate of a p channel transistor Tr104. The p channel transistor Tr104 receives at its source the external power supply voltage Ext.Vcc, and has its drain connected to a reference input end of comparing circuit 85 and provides an internal power supply voltage Int.VccB. Between the comparing input ends of comparing circuits 84 and 85, a p channel transistor Tr102 is connected, to the gate of which a clock signal $\phi$ is applied.

An n channel transistor Tr110 receives at its source a reference signal Y1 for generating the level of a dummy GNDA, at its gate the clock signal $\phi$, and the transistor has its drain connected to a comparing input end of a comparing circuit 87. The output of comparing circuit 87 is connected to the gate of n channel transistor Tr112, of which source is connected to an external GND. An n channel transistor Tr112 has its drain connected to a reference input end of comparing circuit 87 and provides the dummy GNDA. A reference signal Y2 for generating the level of a dummy GNDB is applied to a comparing input end of a comparing circuit 86, and the output of comparing circuit 86 is connected to the gate of n channel transistor Tr111. The source of this transistor is connected to the external GND. The n channel transistor Tr111 has its drain connected to the reference input end of comparing circuit 86 and provides the dummy GNDB. Between comparing input ends of comparing circuits 86 and 87, an n channel transistor Tr109 is connected, to the gate of which the clock signal $\bar{\phi}$ is applied.

Further, between the internal power supply voltage Int.VccB and the dummy GNDB, a series circuit of p channel transistor Tr105 and an n channel transistor Tr107 as well as a series circuit of a p channel transistor Tr106 and an n channel transistor Tr108 are connected. The p channel transistor Tr105 and the n channel transistor Tr107 receive at their gates an input signal, have their drains connected to the gates of p channel transistor Tr106 and n channel transistor Tr108, respectively, and p channel transistor Tr106 and n channel transistor Tr108 have their drains used as the outputs.

Figure 69:
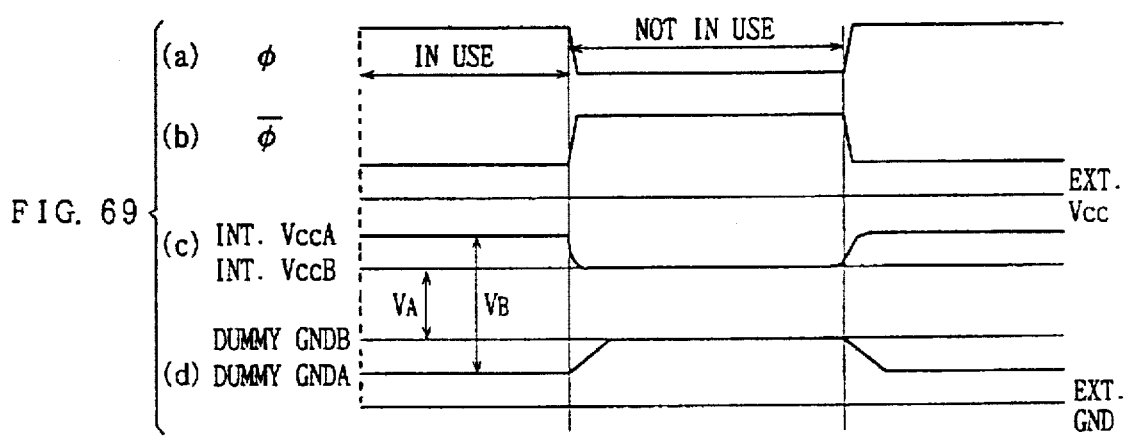
FIG. 69 is a time chart showing the operation of the embodiment of FIG. 68.

FIG. 69 is a time chart showing the operation of the circuit shown in FIG. 68. In use, the signal $\phi$ attains to the "H" level as shown in (a) of FIG. 69, and $\overline{\phi}$ attains to the "L" level as shown in (b) of FIG. 69. Consequently, p channel transistor Tr101 of FIG. 68 is rendered conductive, the reference signal X1 is applied to comparing circuit 84, and reference signal X2 is applied to comparing circuit 85. Comparing circuit 84 compares the internal power supply voltage Int.VccA with the reference signal X1, the p channel transistor Tr103 lowers the external power supply voltage Ext.Vcc in accordance with the output therefrom, and provides an internal power supply voltage Int.VccA which is lower than the external power supply voltage Ext.Vcc as shown in (c) of FIG. 69. At this time, comparing circuit 85 controls p channel transistor Tr104 so that the external power supply voltage Ext.Vcc is lowered, and hence the internal power supply voltage Int.VccB of which level is lower than the internal power supply voltage Int.VccA is provided.

Meanwhile, as the signal $\overline{\phi}$ attains to "L", n channel transistor Tr109 is rendered conductive, n channel transistor Tr110 is rendered non-conductive, and the reference signal Y2 is applied to comparing circuits 86 and 87. Comparing circuit 87 compares the reference signal Y2 with the dummy GNDA, and provides the dummy GNDA which has higher potential than the external GND as shown in (d) of FIG. 69. Meanwhile, comparing circuit 86 controls n channel transistor Tr111, so that the dummy GNDA having higher level than the dummy GNDA is provided.

Meanwhile, p channel transistor Tr105 and n channel transistor Tr107 operate at a potential $V_A$ between the internal power supply voltage Int.VccB and the dummy GNDB, while p channel transistor Tr106 and n channel transistor Tr108 operate at a potential $V_B$ between the internal power supply voltage Int.VccA and the dummy GNDA.

Figure 70:
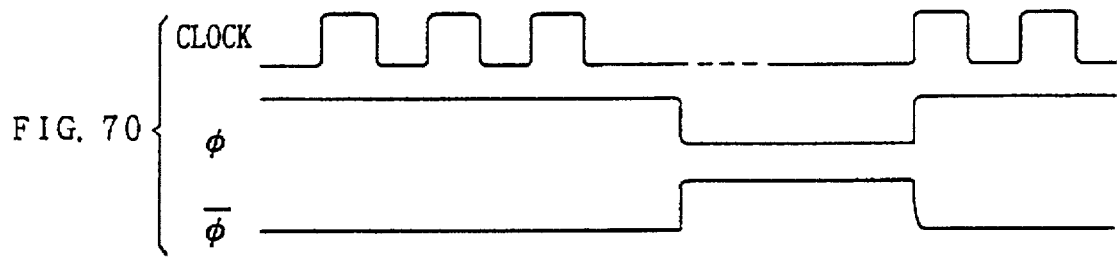
FIG. 70 is a time chart showing the operation of the embodiment of FIG. 68.

When not in use, if a clock signal as a chip operating signal is not provided for a prescribed time period as shown in (a) of FIG. 70, the signal $\phi$ falls to "L" level, the signal $\overline{\phi}$ rises to the "H" level, and when the device is set to the operative state and the clock signal is input, then the signal $\phi$ rises to "H" level, and $\overline{\phi}$ falls to "L" level. As the signal $\phi$ falls to "L" level, p channel transistor Tr102 of FIG. 68 is rendered conductive, the signal $\overline{\phi}$ attains to "H" level, p channel transistor Tr101 is rendered non-conductive, and reference signal X2 is applied to comparing circuits 84 and 85. Therefore, comparing circuit 85 renders p channel transistor Tr104 conductive, thus providing internal power supply voltage Int.VccB.

Meanwhile, n channel transistor Tr109 is rendered non-conductive and n channel transistor Tr110 is rendered conductive, so that comparing circuit 87 renders conductive n channel transistor Tr112, so as to raise the potential of the ground GNDB. Consequently, an output buffer consisting of p channel transistor Tr106 and n channel transistor Tr108 operate at the potential Vb. More specifically, since it is preferred to increase the speed of operation of the output buffer during use even if there is little leak current, the device is operated at a potential of Vb. When not in use, the device may be operated at a potential $V_A$ which is lower than $V_B$, suppressing leak current.

Figure 71:
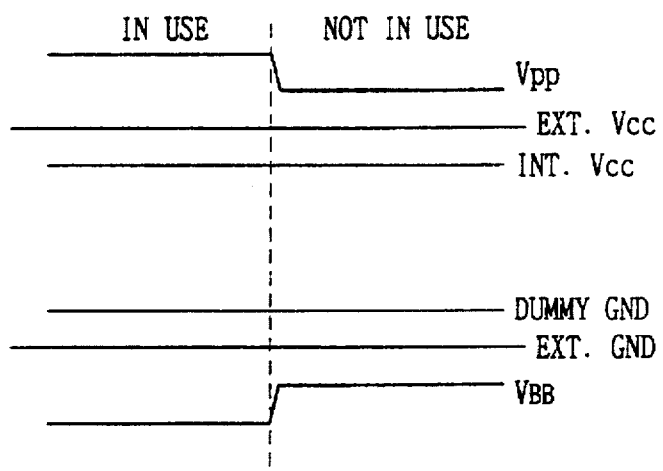
FIG. 71 is an illustration of an embodiment in which operations of a substrate potential generating circuit and of a boosted voltage generating circuit are controlled when the chip is not used.

FIG. 71 shows a principle of an embodiment in which operations of the substrate bias voltage and the boosted power supply circuit are controlled when not in use. In the example shown in FIG. 71, the level of the substrate bias voltage $V_{BB}$ is made deeper than the external GND and the level of the boosted voltage Vpp is made higher than the external power supply voltage Ext.Vcc during use, while the level of the substrate bias voltage Vbb is made shallower than the external GND and the level of the boosted voltage Vpp is made lower than the external power supply voltage Ext.Vcc when not in use.

Figure 72:
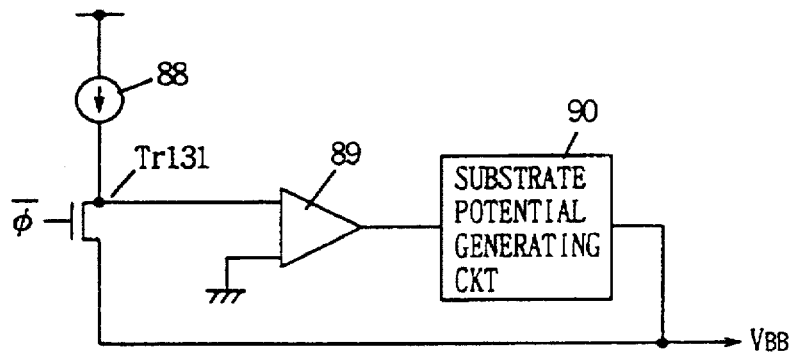
FIG. 72 shows an example of a substrate potential generating circuit.

FIG. 72 shows an example of a circuit controlling the substrate bias voltage. Referring to FIG. 72, a signal $\overline{\phi}$ is applied to the gate of an n channel transistor Tr131. The drain of n channel transistor Tr131 is connected to a comparing input end of a comparing circuit 89. A constant current from a constant current source 88 is supplied to the drain of n channel transistor Tr131. Comparing circuit 89 has its reference input end grounded. An output from comparing circuit 89 is connected to a substrate potential generating circuit 90, and the output of substrate potential generating circuit 90 is connected to the source of n channel transistor Tr131 and provides the substrate bias voltage Vbb.

As already described with reference to FIG. 69, the signal $\overline{\phi}$ attains to "L" level during use, rendering less conductive n channel transistor Tr131. Consequently, the resistance value between the drain and the source of n channel transistor Tr131 increases, current flow from the constant current source 88 is suppressed, and therefore the potential at the comparing input end of comparing circuit 89 rises. Comparing circuit 89 compares a comparison input with the low level of the word lines, the output of which is applied to the reference potential generating circuit 87. Accordingly, as shown in FIG. 71, reference potential generating circuit 87 makes higher the substrate bias voltage $V_{BB}$ than the external GND.

When not in use, the signal $\overline{\phi}$ attains to the "H" level and n channel transistor Tr131 is rendered conductive. Therefore, the resistance value decreases, allowing easier flow of the current from the constant current source 88. As a result, the comparison input voltage of comparing circuit 89 decreases, and substrate potential generating circuit 90 makes shallower the substrate bias voltage $V_{BB}$ than the external GND, in accordance with the output from comparing circuit 89.

Figure 73:
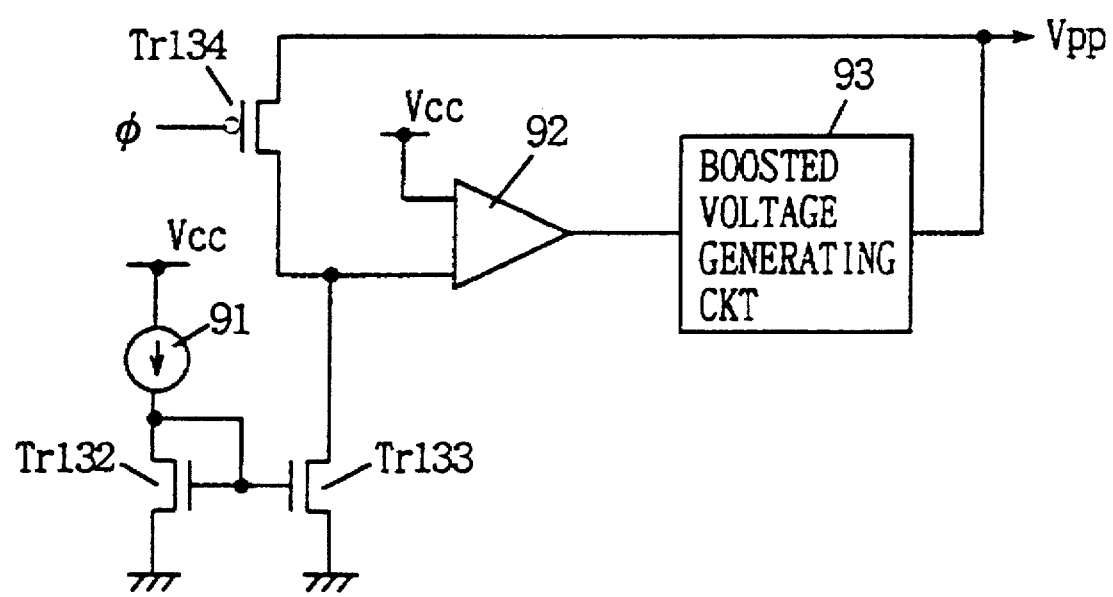
FIG. 73 shows an example of the boosted voltage generating circuit.

FIG. 73 is a schematic diagram showing an example in which the potential of the boosted voltage Vbb is controlled to be different when in use and not in use. The p channel transistor Tr134 receives at its gate the signal $\phi$, and has its source connected to a comparing input end of a comparing circuit 92. A comparing input of comparing circuit 92 is connected to the drain of an n channel transistor Tr133 of which source is grounded and of which gate is connected to the drain and the gate of an n channel transistor Tr132. The n channel transistor Tr132 has its source grounded, and n channel transistor Tr132 receives at its drain a constant current from a constant current source 91. To a reference input end of comparing circuit 92, the external power supply voltage Ext.Vcc is applied, and the output from comparing circuit 92 is connected to a boosted voltage generating circuit 93. The output of boosted voltage generating circuit 93 is connected to the drain of a p channel transistor Tr134, and the boosted voltage Vpp is provided.

The operation will be described. A current from constant current source 91 flows to n channel transistor Tr132, and a current having the same value also flows to n channel transistor Tr133. Since the signal φ attains to the "H" level during use, p channel transistor Tr134 is rendered less conductive, increasing the resistance value. As a result, the voltage at the comparing input of comparing circuit 92 attains to Vpp-Ir (where r represents the resistance of p channel transistor Tr134). Comparing circuit 92 compares the external power supply voltage Ext.Vcc and the comparing input, and elevates the boosted voltage Vpp generated from boosted voltage generating circuit 93.

When the signal φ attains to the "L" level as the device is not in use, p channel transistor Tr134 is rendered more conductive, lowering the comparing input voltage of comparing circuit 92. Therefore, comparing circuit 92 lowers the boosted voltage Vpp generated from boosted voltage generating circuit 93.

As described above, in the embodiment shown in FIGS. 72 and 73, the boosted voltage Vpp is raised and the substrate bias voltage Vpp is made deeper than the external GND in use, while not in use, the boosted voltage Vpp is made lower and the substrate bias voltage $V_{BB}$ is made shallower, so as to reduce leak current at the time of non-use.

Figure 74:
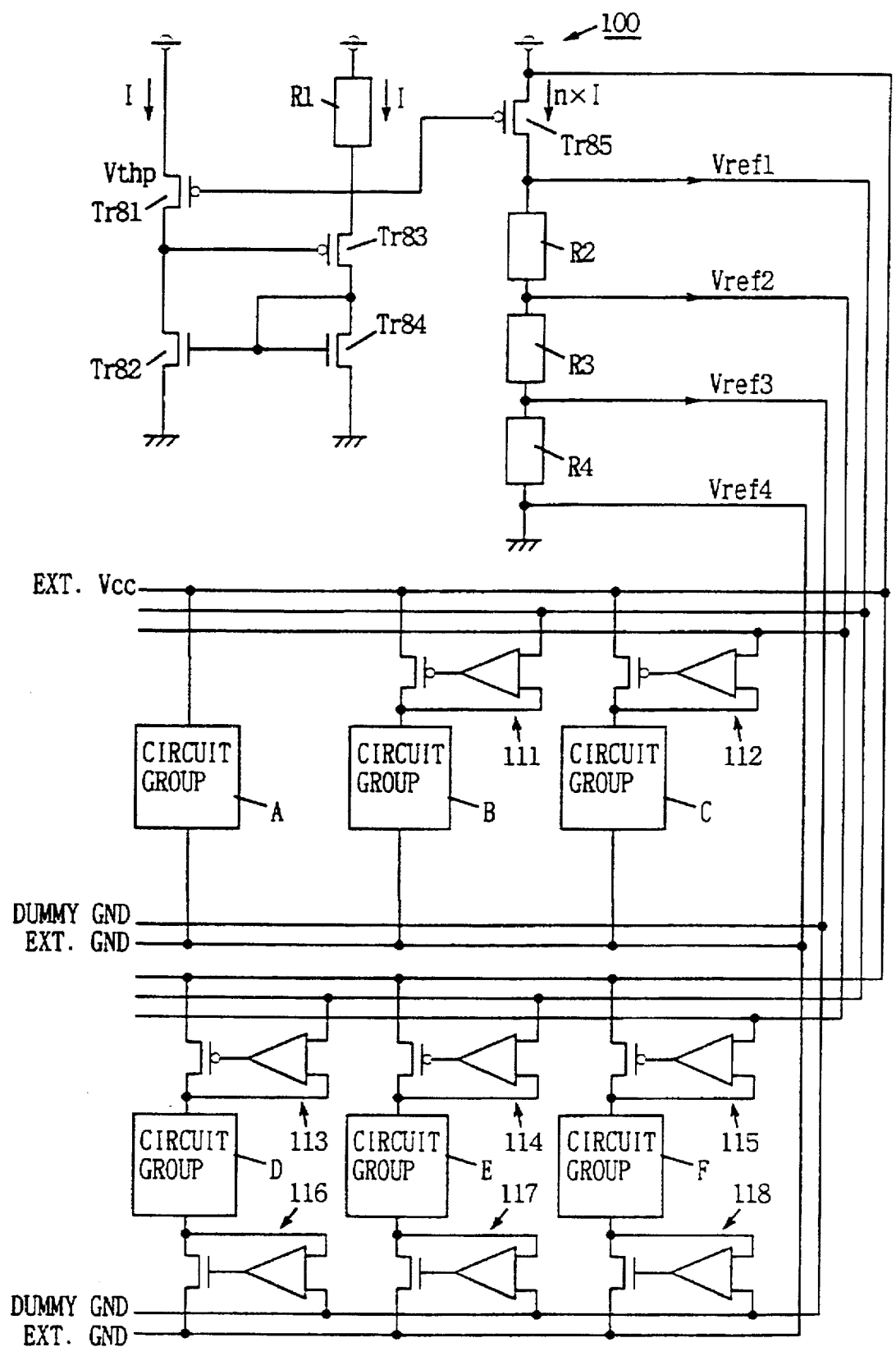
FIG. 74 is a schematic diagram in a LSI when the invention in accordance with the eighth aspect is applied.

FIG. 74 shows a circuit in an LSI to which the present invention in accordance with the eighth aspect is applied. In the example shown in FIG. 74, based on a plurality of reference potentials generated from one and same reference potential generating circuit 100, different potentials are supplied to various circuit groups in the LSI, so that the circuits operate at arbitrary potentials respectively. More specifically, the reference potential generating circuit 100 is structured in the similar manner as shown in FIG. 62 in which resistors R2, R3 and R4 are connected in series between the drain of p channel transistor Tr85 and the ground, and from respective nodes, reference voltages Vref1, Vref2, Vref3 and Vref4 are generated. In the LSI, circuit groups A to F are provided. Circuit group A operates at a potential between the external power supply voltage Ext.Vcc and the external GND, and circuit group B operates at a potential between the external GND and the internal power supply voltage Int.Vcc1 which is set based on the reference voltage Vref1 set by a potential setting circuit 111. Circuit group C operates at a potential between the external GND and an internal power supply voltage Int.Vcc2 which is set based on the reference voltage Vref2 set by a potential setting circuit 112. Circuit group D operates at a potential between an internal power supply voltage Int.Vcc3 which is set based on the reference potential Vref1 by a potential setting circuit 113 and a dummy GND1 which is set based on the reference voltage Vref3 by a potential setting circuit 116. Similarly, circuit group E operates at a potential between the internal power supply voltage INT.Vcc3 set based on the reference voltage Vref1 by a potential setting circuit 114 and the dummy GND1 set based on the reference voltage Vref3 by a potential setting circuit 117. Circuit group F operates at a potential between the internal power supply voltage Int.Vcc2 set based on the reference voltage Vref3 by a potential setting circuit 115 and the dummy GND set based on the reference voltage Vref3 by a potential setting circuit 118.

Figure 75:
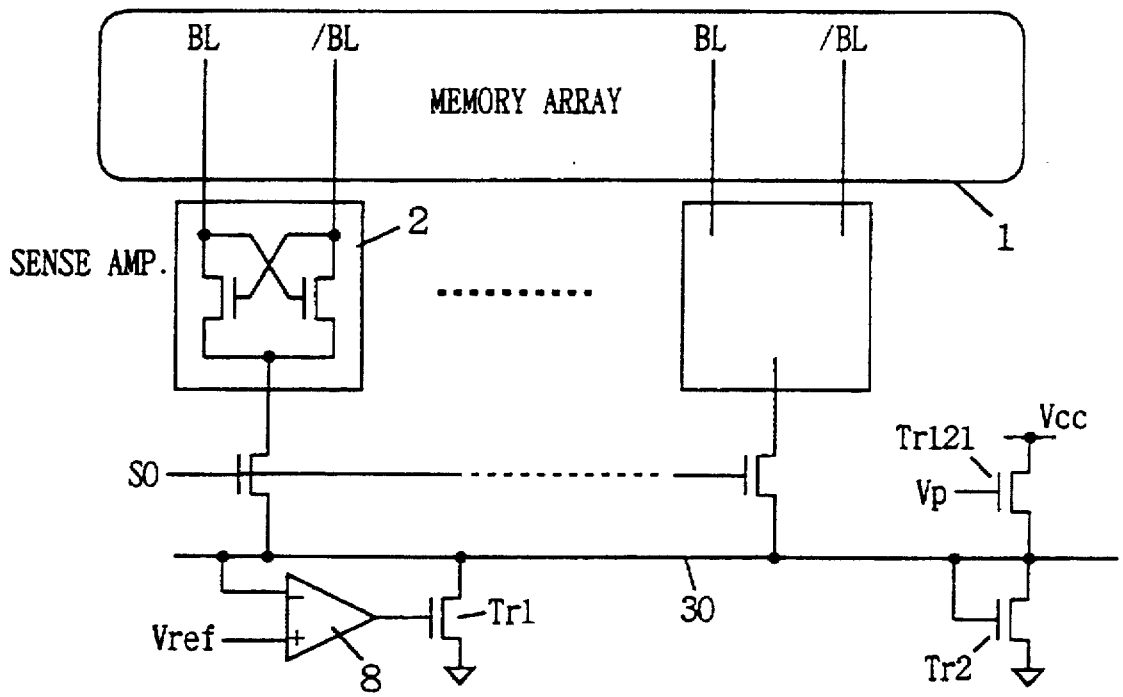
FIG. 75 shows a first embodiment in accordance with a ninth aspect of the present invention.

FIG. 75 shows a first embodiment in accordance with a ninth aspect of the present invention. The embodiment shown in FIG. 75 is an improvement of the embodiment shown in FIG. 22. More specifically, in the embodiment shown in FIG. 22, when active, differential amplifying circuit 8 and n channel transistor Tr3 are activated so as to keep the potential of the dummy GND line 30 at a constant potential, and in the standby state, it is clamped by n channel transistor Tr2 at the threshold voltage Vthn thereof. In that case, the reference voltage Vref of the differential amplifying circuit 8 is Vref=Vthn. However, it is possible that in the standby state, the level of the dummy GND line 30 lowers undesirably, because of the sub threshold current of n channel transistor Tr2.

In view of the foregoing, the embodiment shown in FIG. 75 is made to prevent lowering of the level of dummy GND line 30. For this purpose, an n channel transistor Tr121 is connected between the dummy GND line 30 and the external power supply voltage Ext.Vcc. A level compensation circuit of dummy GND line 30 is formed by n channel transistors Tr2 an Tr121. The gate potential of n channel transistor Tr121 is set at 2Vref. Therefore, the sub threshold current flowing through n channel transistor Tr2 is equivalent to the sub threshold current flowing through n channel transistor Tr121, and therefore the potential of dummy GND line 30 can be kept constant.

Figure 76:
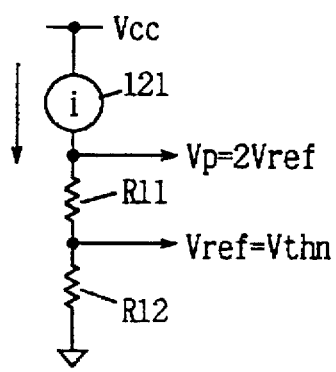
FIG. 76 is a schematic diagram of a circuit for generating a reference voltage Vref and a gate voltage Vp shown in FIG. 75.

FIG. 76 is a schematic diagram of a circuit for generating the reference voltage Vref and the gate voltage Vp shown in FIG. 75. Referring to FIG. 76, a constant current source 121 and resistors R11 and R12 are connected in series between the external power supply voltage Ext.Vcc and the external GND, from the node between constant current source 121 and resistor R11, the potential Vp=2Vref is provided, and from the node between resistors R11 and R12, the potential Vref=Vthn is provided.

Figure 77:
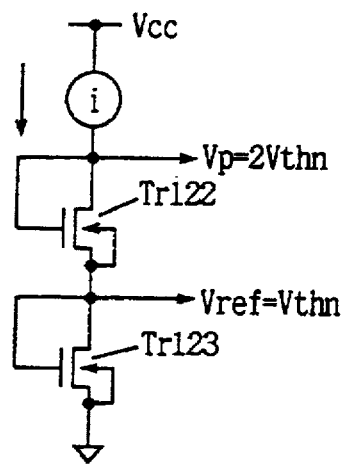
FIG. 77 shows an example in which a resistor shown in FIG. 76 is replaced by a transistor.

FIG. 77 shows an example in which resistors R11 and R12 shown in FIG. 76 are provided by transistors. More specifically, resistor R11 is replaced by an n channel transistor Tr122, and resistor R12 is replaced by an n channel transistor Tr123. In this example, a back gate bias potential is set such that the transistors Tr122 and Tr123 have the same threshold voltage.

Figure 78:
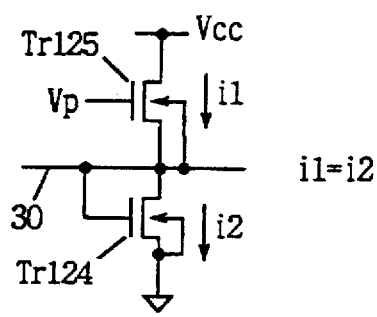
FIG. 78 shows an improvement of the embodiment shown in FIG. 75.

FIG. 78 shows another embodiment in accordance with the ninth aspect of the present invention. In this embodiment shown in FIG. 78, in place of n channel transistor Tr121 shown in FIG. 75, a p channel transistor Tr125 is connected between the external power supply voltage Ext.Vcc and the dummy GND line 30. In this case, the gate potential of p channel transistor Tr125 is biased to Vcc-Vt. Other operations are the same as those of FIG. 75.

Figure 79:
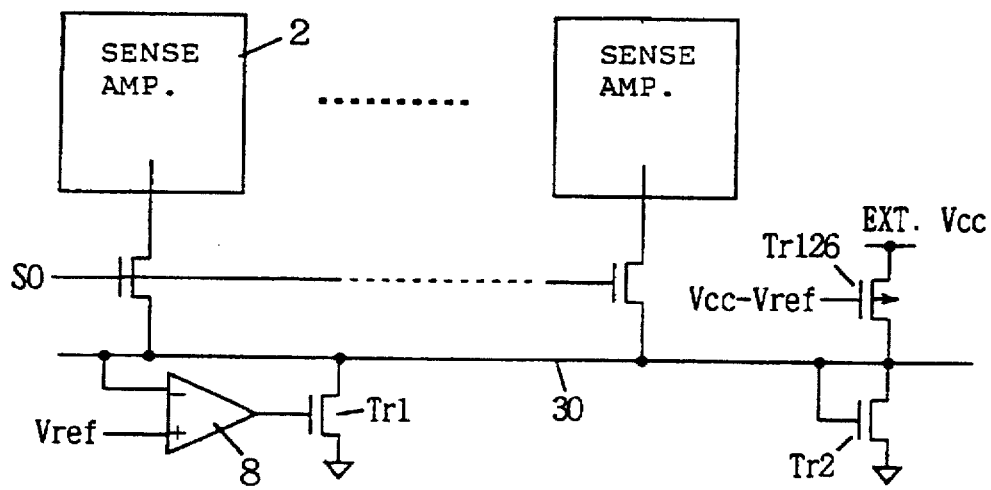
FIG. 79 shows another embodiment in accordance with the ninth aspect of the present invention.

FIG. 79 shows a still another embodiment in accordance with the ninth aspect of the present invention. In the embodiment shown in FIG. 79, in place of n channel transistor Tr121 of FIG. 75, a p channel transistor Tr126 is connected between the line of the external power supply voltage Ext.Vcc and the dummy GND line 30. The operation is the same as that of FIG. 75 except that the gate potential of p channel transistor Tr126 is biased to Vcc-Vp.

Figure 80:
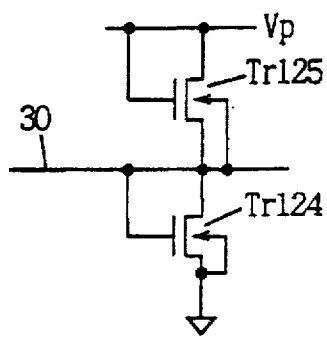
FIG. 80 shows an improvement of the embodiment shown in FIG. 78.

FIG. 80 shows an improvement of the embodiment shown in FIG. 78. More specifically, a gate voltage Vp is applied to the gate and the drain of p channel transistor Tr125. Since the sub threshold current is supplied from voltage Vp, the voltage Vp is supplied from the circuit shown in FIG. 77, and therefore it must have current compensating ability.

Figure 81:
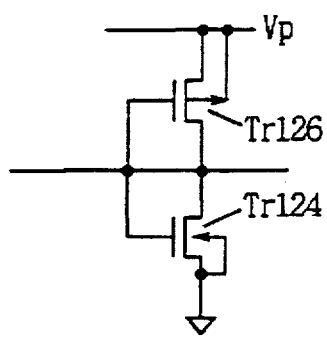
FIG. 81 shows an improvement of the example shown in FIG. 80.

FIG. 81 shows an improvement of the example shown in FIG. 80. More specifically, the back gate n channel transistor Tr125 shown in FIG. 80 is replaced by a p channel transistor Tr127 with a back gate.

In the embodiments in accordance with the ninth aspect of the present invention described above, Vp was set to Vp=2Vref and the sub threshold currents of the transistors are set to the same value. However, the level of the dummy GND line 30 can be kept constant provided that the sub threshold current of n channel transistor Tr124 is equal to that of n channel transistor Tr127 or to that of p channel transistor Tr125, even if Vp is not 2Vref. For this purpose, threshold values and sizes of respective transistors may be adjusted.

Figure 82:
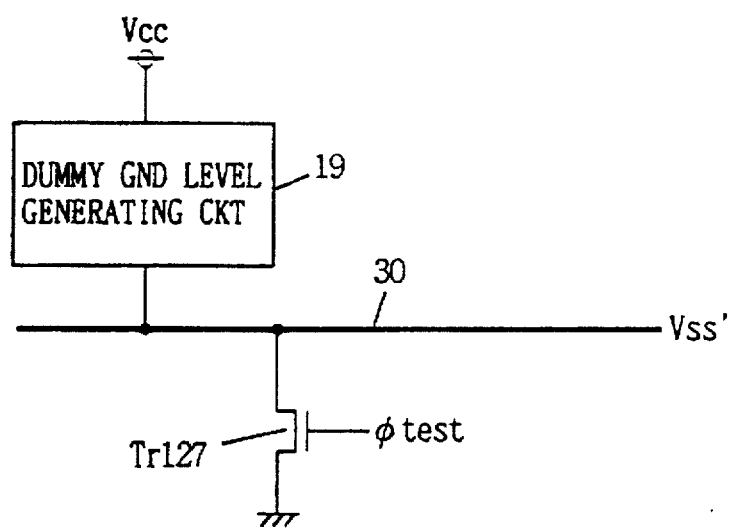
FIG. 82 is a schematic block diagram showing a first embodiment in accordance with a tenth aspect of the present invention.
Figure 83:
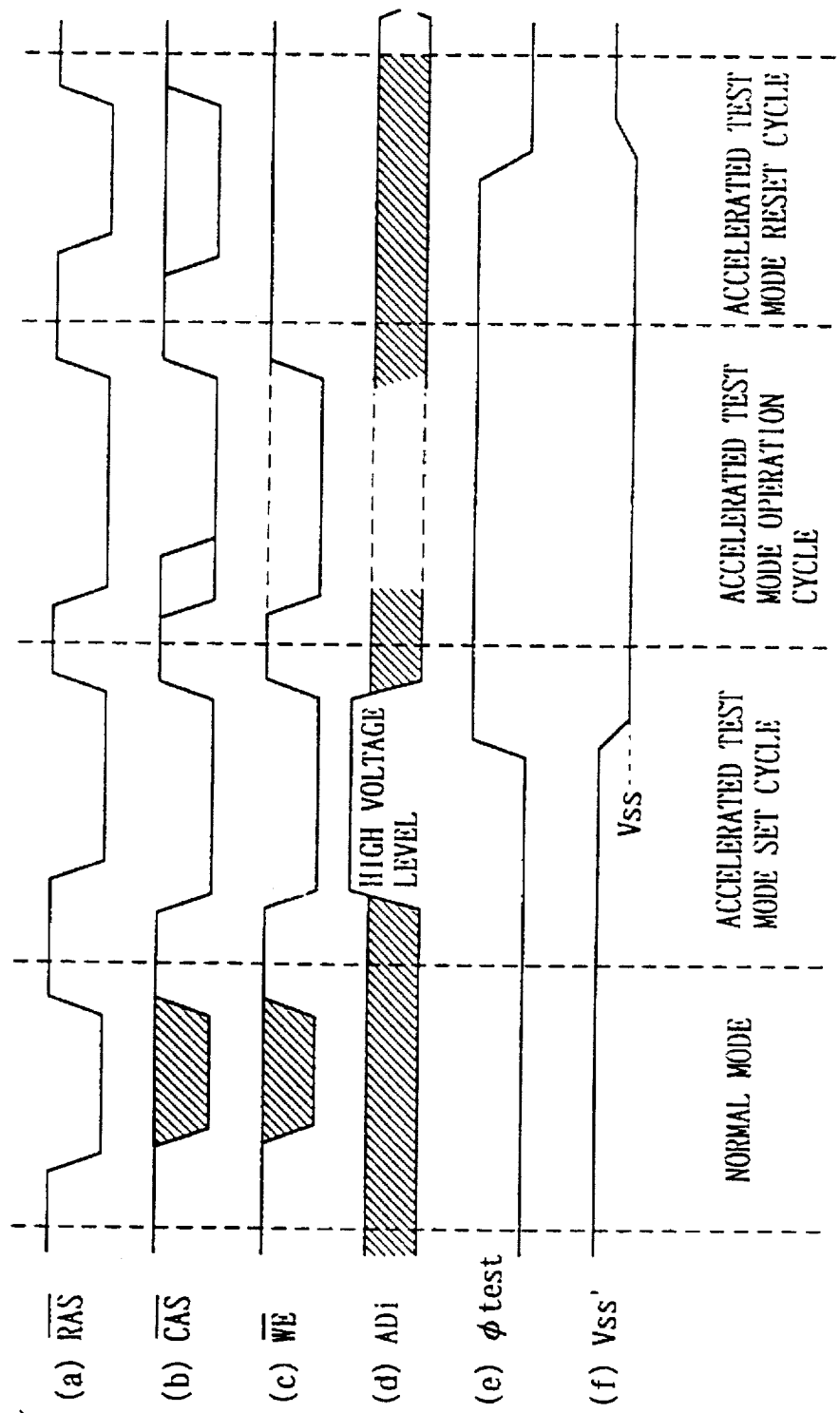
FIG. 83 is a time chart showing the operation of the embodiment shown in FIG. 82.

FIG. 82 is a schematic block diagram showing a first embodiment in accordance with a tenth aspect of the present invention and FIG. 83 is a time chart showing the operation thereof.

As already described, by setting the line of low level potential of internal circuit 5 to the level Vss' of the dummy GND, the disturb refresh time (data retention time) of the memory cell MC can be made longer. However, this means that the test time of the disturb refresh time before shipment becomes longer, increasing the cost of testing. Therefore, the tenth aspect of the present invention is directed to reduction of test time while maintaining the high performance that the disturb refresh time during normal operation is long.

Referring to FIG. 82, the dummy GND level Vss' generated by dummy GND level generating circuit 19 is applied to the dummy GND line 30. There is provided an n channel transistor Tr127 having its drain connected to dummy GND line 30, its source grounded and receiving at its gate a test mode enable signal φtest indicating the entrance of test mode.

The operation will be described. After normal operation mode, at a WCBR timing (Write and CAS Before RAS) at which the signals $\overline{WE}$ and $\overline{CAS}$ fall earlier than the signal $\overline{RAS}$, a high voltage level higher by several V than the power supply voltage level Vcc is input to a designated address pin. The WCBR and the input of the high voltage level to the designated address pin set a disturb refresh acceleration test mode.

When the set timing is confirmed and the set cycle starts, a test mode enable signal φtest is generated. When the signal φtest is input to the gate of n channel transistor Tr127, n channel transistor Tr127 turns on and pulls the dummy GND line 30 to the low level of the word lines Vss. At this time, the line of low level potential for sense amplifier is not at the dummy GND level Vss' (0.5V) but at the true low level of the word lines Vss (0V) supplied from an external pad. Therefore, the level of the bit line BL shown in FIG. 44 is also set not to the dummy GND level Vss' (0.5V) but to the low level of the word lines Vss (0V), and the potential Vgs of the gate (word line WL) with respect to the source (bit line BL) of the memory cell transistor MT changes from a negative voltage of −0.5V to 0V. Therefore, sub leak current of memory cell transistor MT increases, degrading disturb refresh characteristic of the memory cell MC. Accordingly, when the operation enters this mode, disturb refresh is accelerated, reducing the test time.

Thereafter, when the CBR (CAS Before RAS) timing at which the signal $\overline{CAS}$ falls earlier than $\overline{RAS}$ is confirmed, the test mode enable signal φtest falls, n channel Tr127 turns off in response, and the dummy GND line 30 is again set to the dummy GND level Vss' (0.5V). Then the operation returns to the normal mode.

Figure 84:
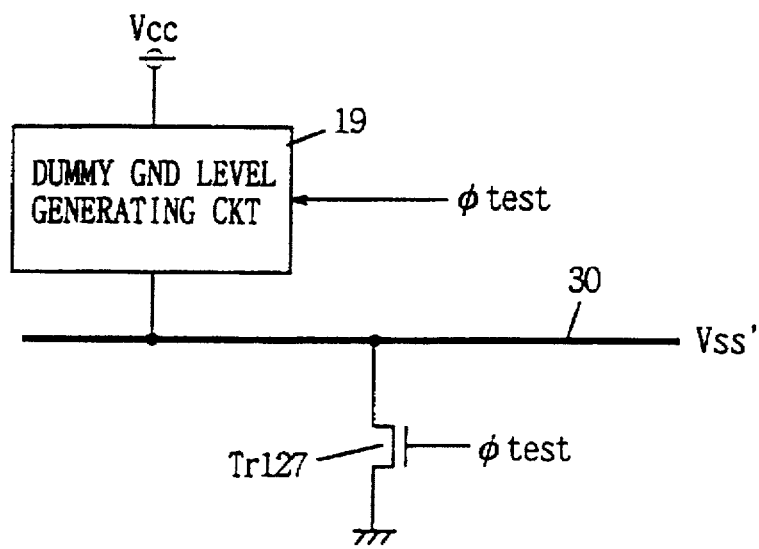
FIG. 84 is a block diagram showing a second embodiment in accordance with the tenth aspect of the present invention.
Figure 85:
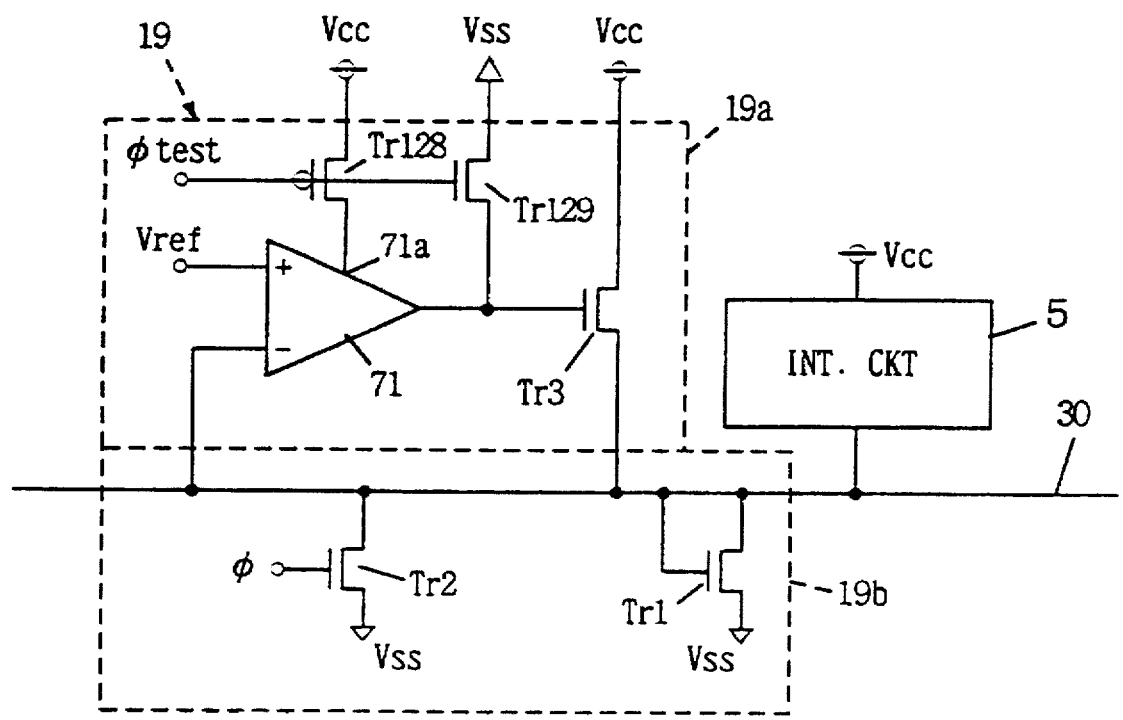
FIG. 85 is a schematic diagram showing a dummy GND level generating circuit in the embodiment shown in FIG. 84.

FIG. 84 is a schematic block diagram showing a second embodiment in accordance with the tenth aspect of the present invention and FIG. 85 is a schematic diagram showing the structure of the dummy GND level generating circuit 19 shown in FIG. 84. Basic structure is the same as that of the first embodiment. However, it is different in that the test mode enable signal φtest is also input to the dummy GND level generating circuit 19. The reason for this is to stop charging circuit 19a by the test mode enable signal test when the acceleration test mode is entered in such a dummy GND level generating circuit 19 that includes a charging circuit 19a, so as to compensate for excessive lowering of the dummy GND line 30.

More specifically, dummy GND level generating circuit 19 includes a charging circuit 19a and a discharging circuit 19b. Charging circuit 19a includes a differential amplifying circuit 71, n channel transistors Tr3 and Tr129, and a p channel transistor Tr128. Differential amplifying circuit 71 has its inverted input node connected to dummy GND line 30, and its non-inverted input node connected to receive the reference potential Vref (=Vss'). The n channel transistor Tr3 has its gate connected to an output node of differential amplifying circuit 71, its drain connected to receive the power supply voltage Vcc, and its source connected to dummy GND line 30. The n channel transistor Tr129 receives at its gate the test mode enable signal φtest, has its drain connected to the output node of differential amplifying circuit 71 and its source grounded. The p channel transistor Tr128 receives at its gate the test mode enable signal φtest, at its drain the power supply potential Vcc, and has its source connected to the power supply node 71a of differential amplifying circuit 71. Discharging circuit 19b includes n channel transistors Tr1 and Tr2. The n channel transistor Tr1 and Tr2 have their drains both connected to dummy GND line 30 and their sources both grounded. The n channel transistor Tr1 has its gate connected to dummy GND line 30 and n channel transistor Tr2 receives at its gate an internally generated signal φ.

When the test mode enable signal test is at the "L" level in the normal mode, p channel transistor Tr128 turns on, and n channel transistor Tr129 turns off. When p channel transistor Tr128 turns on, the power supply potential Vcc is applied to the power supply node 71a of differential amplifying circuit 71, and differential amplifying circuit 71 is activated. When the potential of dummy GND line 30 becomes lower than the reference potential Vref, the output from differential amplifying circuit 71 attains to the "H" level, turning n channel transistor Tr3 on, whereby the dummy GND line 30 is charged. If the potential of dummy GND line 30 becomes higher than the reference potential Vref, the output from differential amplifying circuit 71 attains to the "L" level, turning n channel transistor Tr3 off, whereby charging of dummy GND line 30 is stopped.

When the test mode enable signal φtest is at the "H" level in the acceleration test mode, p channel transistor Tr128 turns off and n channel transistor Tr129 turns on. When p channel transistor Tr128 turns off, application of the power supply potential Vcc to the power supply node 71a of differential amplifying circuit 71 is stopped, and differential amplifying circuit 71 is inactivated. Since n channel transistor Tr129 turns on, the output node of differential amplifying circuit 71 is grounded, turning off n channel transistor Tr3. Thus charging of dummy GND line 30 is stopped. The operation of the discharging circuit 19b is the same as in the dummy GND level generating circuit shown in FIG. 2, and therefore description thereof is not repeated.

The timings for setting and resetting the acceleration test mode are the same as those of the first embodiment, and similar effects as the first embodiment can be obtained.

Figure 86:
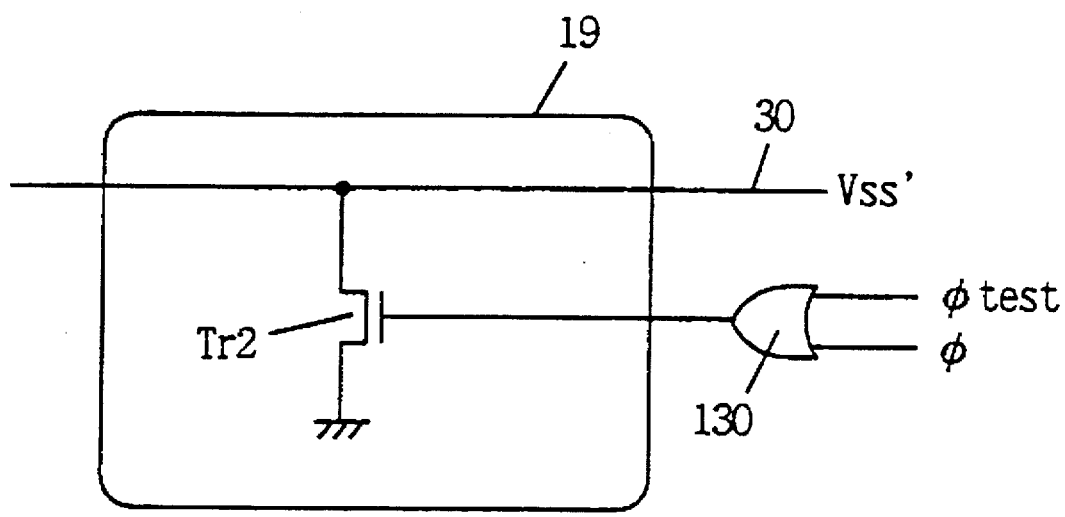
FIG. 86 is a schematic block diagram showing a third embodiment in accordance with the tenth aspect of the present invention.

FIG. 86 is a schematic block diagram showing a third embodiment in accordance with the tenth aspect of the present invention. In this embodiment, different from the first and second embodiments, the n channel transistor Tr127 receiving at its gate the test mode enable signal φtest is not provided separately, but an n channel transistor Tr of a large size already provided in dummy GND level generating circuit 19 for pulling the dummy GND line 30 to the low level of the word lines Vss is used. Tough the internally generated signal φ has been input to the gate of n channel transistor Tr2 in the above described embodiments, the internally generated signal φ and the test mode enable signal φtest are input to the NOR gate 130, and the output of the NOR gate 130 is input to the gate of n channel transistor Tr2 in this embodiment.

The timings for setting and resetting the accelerated test mode are the same as those shown in the first embodiment. In normal operation, since the test mode enable signal φtest is at the "L" level, n channel transistor Tr2 is controlled by the internally generated signal φ. However, when the operation enters the acceleration mode set cycle and the test mode enable signal φtest attains to the "H" level, the gate of n channel transistor Tr2 attains to the "H" level regardless of the state of the internally generated signal φ. Therefore, n channel transistor Tr2 turns on, pulling the dummy GND line 30 to the low level of the word lines Vss.

The similar effects as in the first embodiment can be obtained by this embodiment also.

Figure 87:
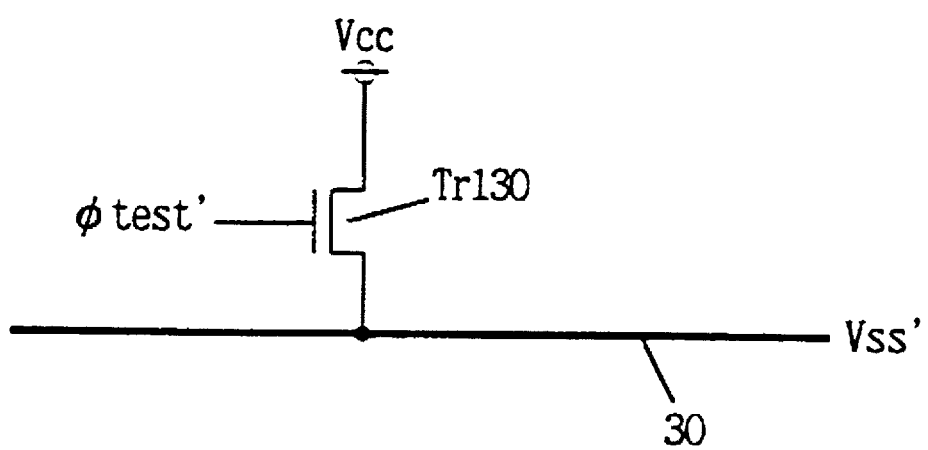
FIG. 87 is a schematic block diagram showing a fourth embodiment in accordance with the tenth aspect of the present invention.
Figure 88:
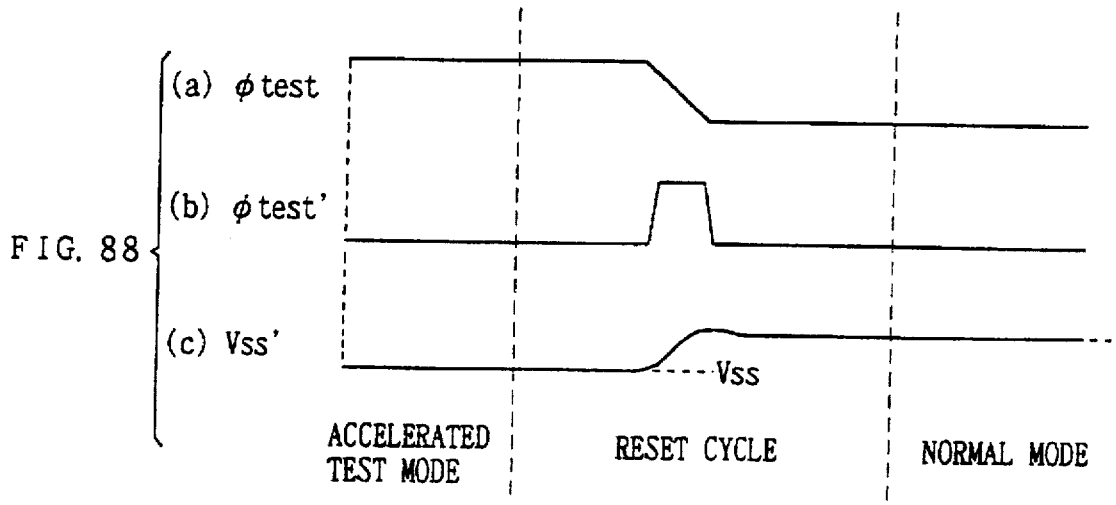
FIG. 88 is a time chart showing the operation of the embodiment of FIG. 87.

FIG. 87 is a schematic diagram showing a fourth embodiment in accordance with the tenth aspect of the present invention, and FIG. 88 is a time chart showing the operation thereof. Basic circuit configuration of this embodiment is the same as that in the first, second and third embodiments above, and though not shown in FIG. 87, dummy GND level generating circuit 19 and n channel transistor Tr127 are provided as well. In this embodiment, in addition to these components, an n channel transistor Tr130 is provided, which receives at its drain the power supply potential Vcc, has its source connected to the dummy GND line 30 and receives at its gate a one shot pulse signal φtest', which will be described later. The n channel transistor Tr130 assists the operation for setting dummy GND line 30 which has been pulled down to the low level of the word lines Vss (0V) in the accelerated test mode back to the normal dummy GND level Vss' (0.5V) in the reset cycle.

The operation will be described. In the accelerated test mode, test mode enable signal test is at the "H" level, n channel transistor Tr127 is on and dummy GND line 30 is pulled down to the low level of the word lines Vss (0V). Then, when the operation enters the reset cycle at the timing shown in the first embodiment, the test mode enable signal φtest falls to the "L" level, and n channel transistor Tr127 turns off. Based on the fall of the test mode enable signal φtest, the one shot signal φtest' is generated, which is input to the gate of n channel transistor Tr130. In response, n channel transistor Tr130 is rendered conductive, and dummy GND line 30 is quickly pulled up to the dummy GND level Vss' (0.5V).

Though an n channel transistor is used as the charging transistor Tr130, a p channel transistor may be used. However, in that case, it is necessary to invert the one shot pulse signal φtest'.

Figure 89:
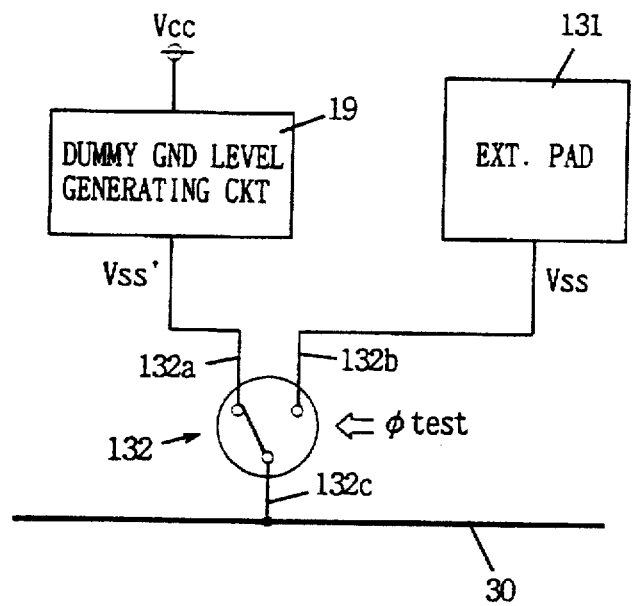
FIG. 89 is a schematic block diagram showing a fifth embodiment in accordance with the tenth aspect of the present invention.

FIG. 89 is a schematic block diagram showing a fifth embodiment in accordance with the tenth aspect of the present invention. Referring to FIG. 89, in this embodiment, a switch 132 is provided which switches in accordance with the test mode enable signal φtest. One switch terminal 132 of switch 132 is connected to an output of dummy GND level generating circuit 19, the other switch terminal 132b is connected to a grounded external pad 131, and a common terminal 132c is connected to the dummy GND line 30.

When the test mode enable signal test is at the "L" level in the normal mode, the common terminal 132c of switch 132 is connected to one switch terminal 132a, and dummy GND line 30 is set to dummy GND level Vss'. When the test mode enable signal φtest attains to the "H" level in the accelerated test mode, the common terminal 132c of switch 132 is connected to the other switch terminal 132b, and dummy GND line 30 is set to the low level of the word lines Vss.

Figure 90:
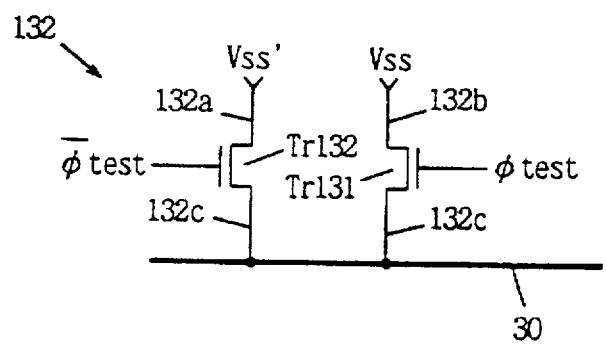
FIG. 90 is a schematic diagram showing a switch of the embodiment shown in FIG. 89.

The switch 132 consists of two n channel transistors Tr131 and Tr132 as shown in FIG. 90, for example. The drains of n channel transistors Tr131 and Tr132 serve as switch terminals 132b and 132a, respectively, the sources both serve as the common terminal 132c, and the gates receive the test mode enable signal φtest and complementary signal $\overline{\phi t}$, respectively. In this embodiment also, the similar effects as in the first embodiment can be obtained. This embodiment may be combined with the fourth embodiment.

Figure 91:
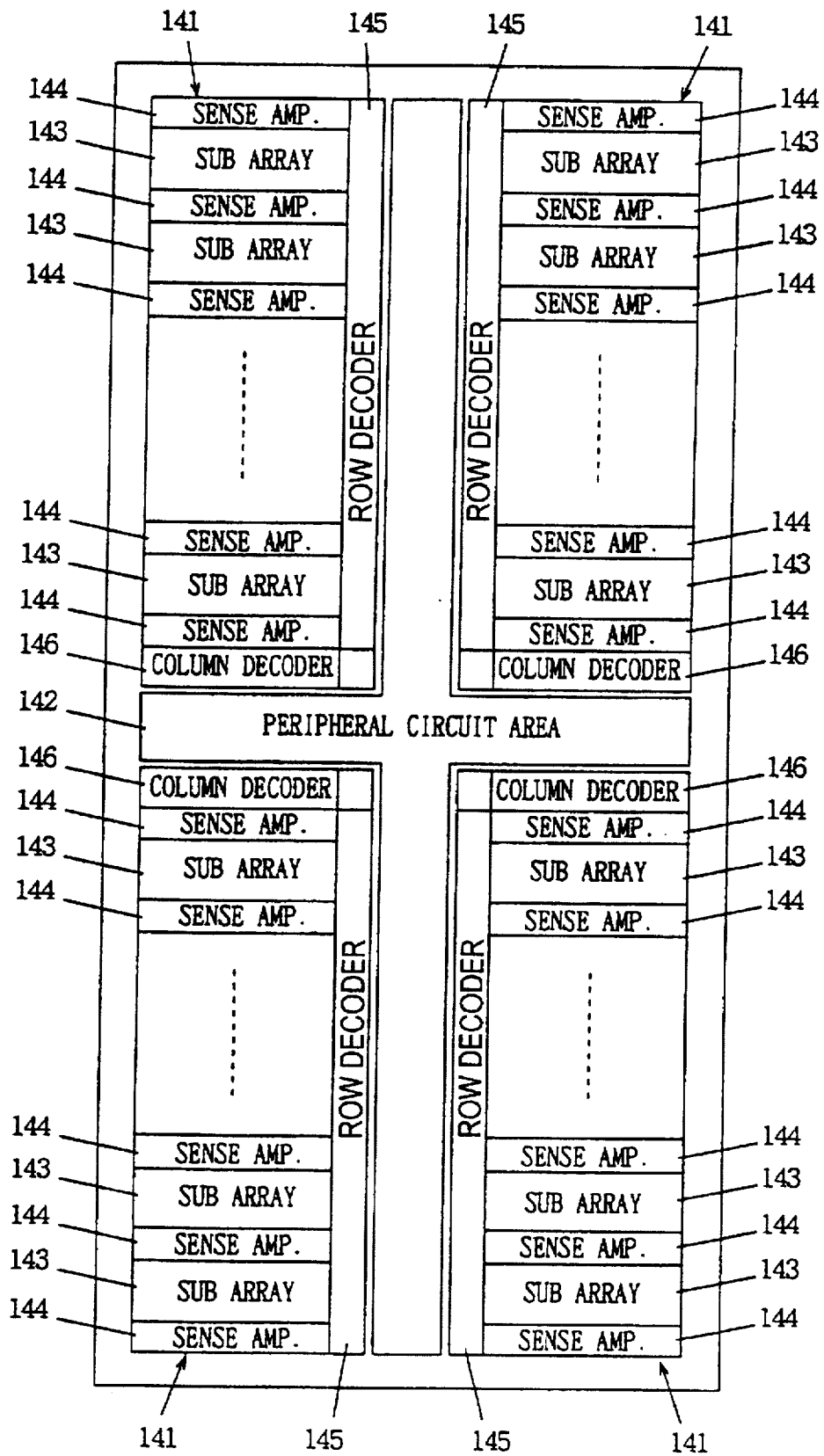
FIG. 91 is a schematic block diagram showing a sixth embodiment in accordance with the tenth aspect of the present invention.
Figure 92:
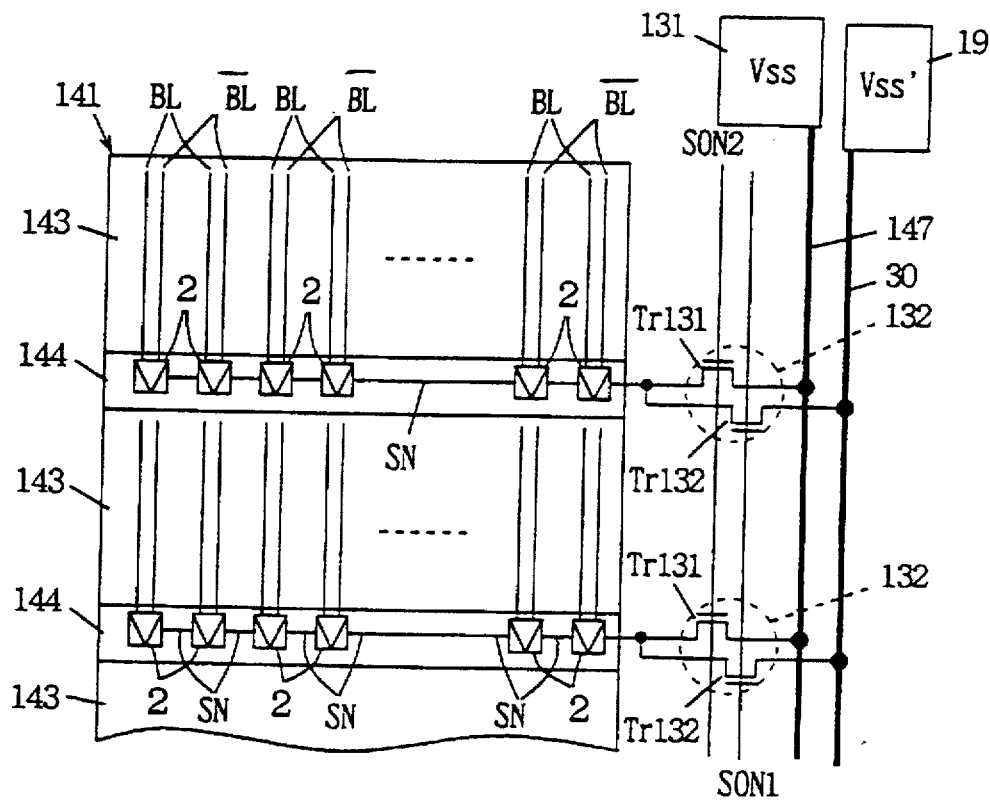
FIG. 92 shows, in enlargement, a main portion of the embodiment shown in FIG. 91.
Figure 93:
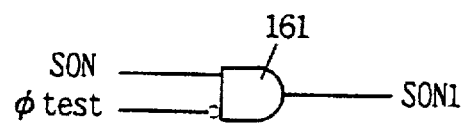
FIG. 93 is a block diagram showing a circuit providing a sense amplifier activating signal SON1.

FIG. 91 is a block diagram showing a DRAM chip configuration in accordance with a sixth embodiment in accordance with the tenth aspect of the present invention and FIG. 92 shows, in enlargement, the main portion thereof. Referring to FIGS. 91 and 92, the DRAM chip includes a plurality of memory array areas 141 and a peripheral circuit area 142 provided therebetween. Each memory array area 141 includes a plurality of sub arrays 143 arranged in the row direction, a plurality of sense amplifier bands 144 provided between and on both sides of, the sub arrays 143, a row decoder 145 and a column decoder 146.

Sub array 143 includes a plurality of memory cells (not shown) arranged in rows and columns, word lines (not shown) provided for respective rows, and bit line pairs BL, $\overline{BL}$ provided for respective columns. Sense amplifier band 144 includes a sense amplifier 2 provided corresponding to each column, and each sense amplifier 2 is connected to the corresponding bit line pair BL, $\overline{BL}$. The sense amplifiers 2 of each sense amplifier band 144 are commonly connected to the sense drive line SN.

Peripheral circuit area 142 includes dummy GND line 30 to which dummy GND level Vss' is applied by dummy GND level generating circuit 19, a ground line 147 which is grounded through external pad 131, and switches 132 provided respectively for the sense amplifier bands 144. Switch 132 includes an n channel transistor Tr132 connected between dummy GND line 30 and sense drive line SN, and an n channel transistor Tr131 connected between the ground line 147 and sense drive line SN. The n channel transistors Tr132 and Tr131 are controlled by sense amplifier activating signals SON1 and S0N2, respectively.

Sense amplifier activating signal SON1 is provided from a gate circuit 161 which receives sense amplifier activating signal SON and test mode enable signal φtest. Gate circuit 161 provides sense amplifier activating signal SON as it is when the test mode enable signal φtest is at the "L" level in the normal mode. When test mode enable signal φtest is at the "H" level in the test mode, gate circuit 161 always provides "L" level regardless of the sense amplifier activating signal SON.

Figure 94:
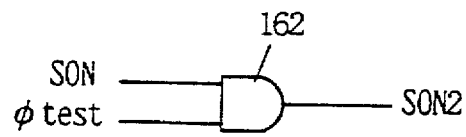
FIG. 94 is a schematic block diagram showing a circuit providing a sense amplifier activating signal SON2.
Figure 95:
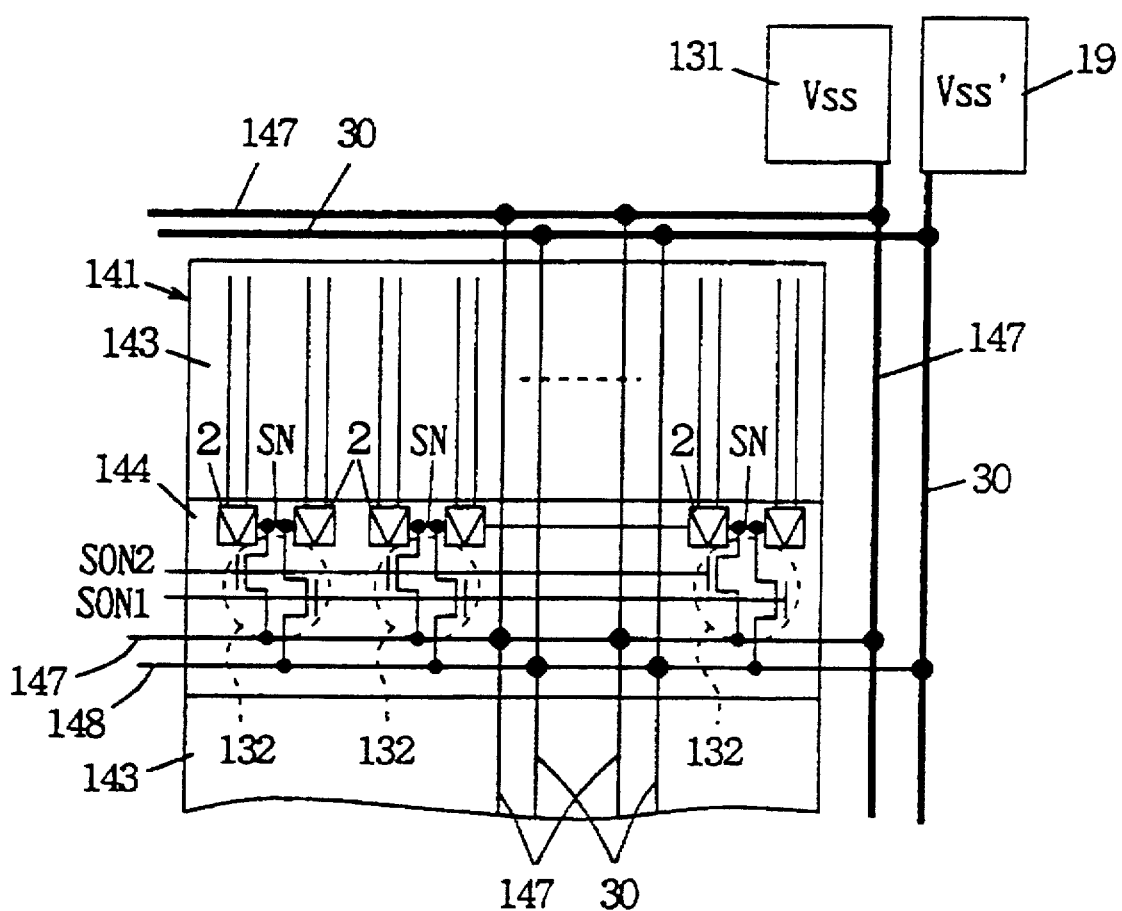
FIG. 95 shows an improvement of the example shown in FIG. 92.

Referring to FIG. 94, sense amplifier activating signal S0N2 is provided from an AND gate circuit 162 which receives sense amplifier activating signal SON and test mode enable signal φtest. When the test mode enable signal φtest is at the "L" level in the normal mode, AND gate circuit 162 always provides the "L" level regardless of the sense amplifier activating signal SON. When the test mode enable signal φtest is at the "H" level in the test mode, AND gate circuit 162 provides sense amplifier activating signal SON as it is. The operation will be described. In the normal mode, n channel transistor Tr132 turns on in response to the rise of sense amplifier activating signal SON1 to the "H", and dummy GND level Vss' is applied to sense drive line SN. In the test mode, n channel transistor Tr131 turns on in response to the rise of the activating signal S0N2 to the "H" level, and sense drive line SN is grounded.

Similar effects as in the first embodiment can be obtained in this embodiment.

If dummy GND line 30 and ground line 147 are formed as mesh respectively to cover the memory area 141 and the sense drive lines SN of the sense amplifiers and the dummy GND line 30 and the ground line 147 are connected thereto by means of a plurality of switches 132, interconnection resistances of interconnections SN30 and 147 can be reduced, preventing floating of the potential derived from interconnection resistance.

Here, sense amplifiers 2, switches 132 and the like are formed on the surface of a silicon substrate, and ground lines 147 and dummy GND lines 30 are insulated from each other and successively stacked above the silicon substrate.

Figure 96:
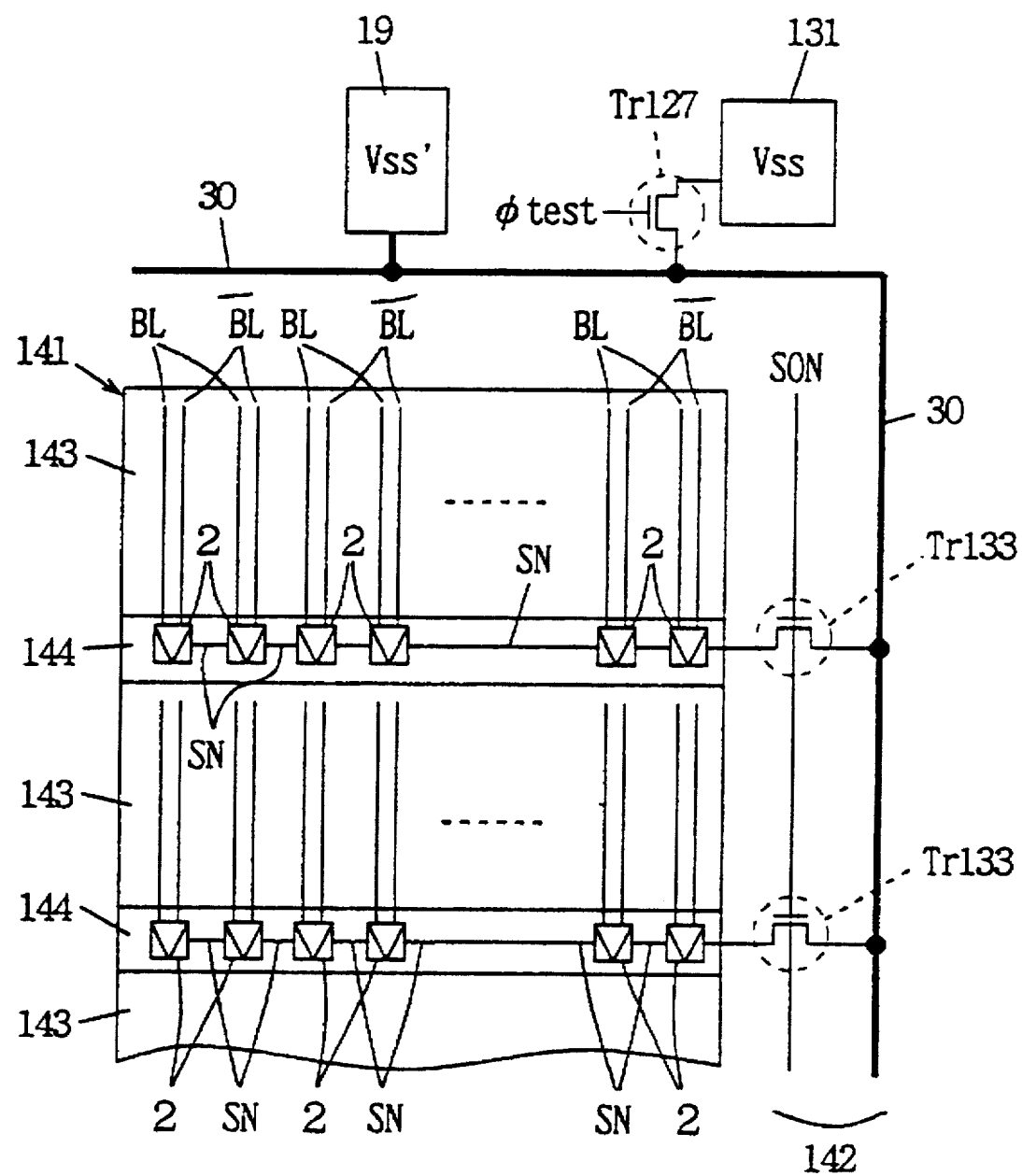
FIG. 96 shows, in enlargement, a main portion of a seventh embodiment in accordance with the tenth aspect of the present invention.

FIG. 96 is a partially enlarged schematic diagram showing a DRAM chip configuration in accordance with a seventh embodiment in accordance with the tenth aspect of the present invention. Referring to FIG. 96, in the DRAM chip, the peripheral circuit area 142 includes n channel transistors Tr provided respectively for the sense amplifier bands 144, a dummy GND line 30 to which dummy GND level Vss' is applied from dummy GND level generating circuit 19, and an n channel transistor Tr127 for grounding the dummy GND line 30 in response to the test mode enable signal φtest. Each n channel transistor Tr133 is connected between sense drive line SN of each sense amplifier band 144 and dummy GND line 30, and receives at its gate the sense amplifier activating signal SON. The n channel transistor Tr127 is connected between external pad 131 and dummy GND line 30, and receives at its gate the test mode enable signal φtest.

The operation will be described. In the normal mode, test mode enable signal φtest is at the "L" level, n channel transistor Tr127 is off and dummy GND line 30 is set to dummy GND level Vss'. In the test mode, test mode enable signal φtest attains to the "H" level, n channel transistor Tr127 turns on and dummy GND line 30 is grounded. When sense amplifier activating signal SON attains to the "H" level, n channel transistor Tr133 turns on and sense amplifier 2 is activated.

In this embodiment also, the same effects as in the first embodiment can be obtained. As compared with the sixth aspect, the number of transistors and the number of interconnections can be reduced.

Figure 97:
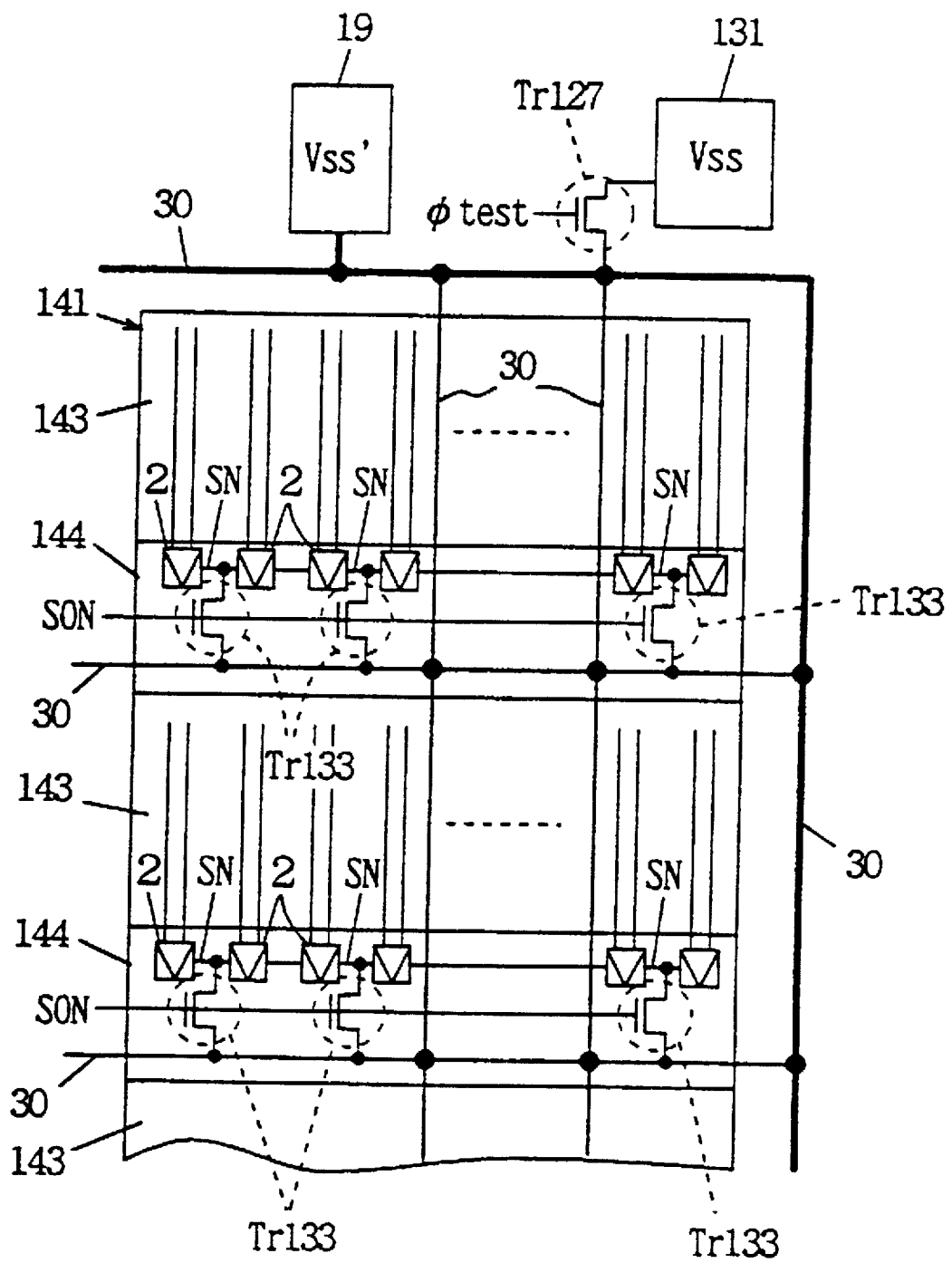
FIG. 97 shows an improvement of the example shown in FIG. 96.

Referring to FIG. 97, if the dummy GND line 30 is formed as a mesh to cover memory cell area 141, and sense drive lines SN of respective sense amplifier bands 144 and the dummy GND line 30 are connected by means of a plurality of switches 132, interconnection resistance of interconnections SN and 30 can be reduced, and floating of potential derived from interconnection resistance can be prevented.

Figure 98:
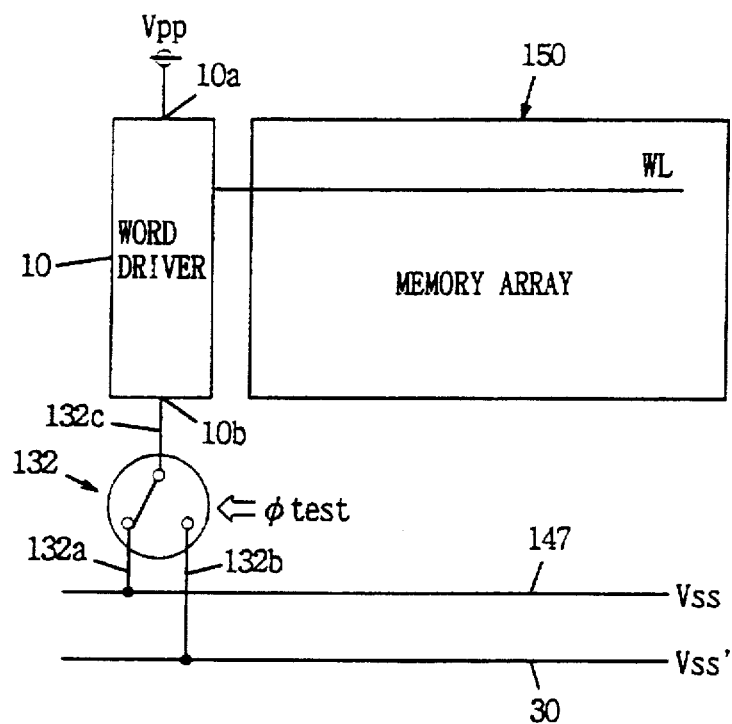
FIG. 98 is a schematic block diagram showing an eighth embodiment in accordance with the tenth aspect of the present invention.
Figure 99:
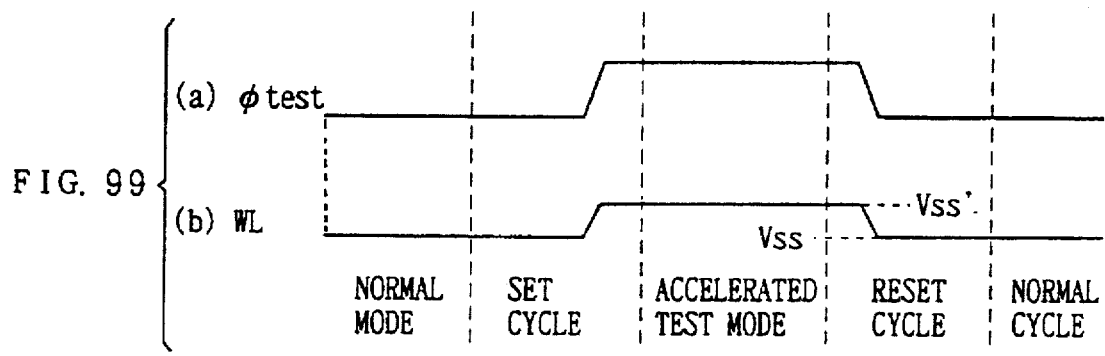
FIG. 99 is a time chart showing the operation of the embodiment shown in FIG. 98.

FIG. 98 is a block diagram showing an eighth embodiment in accordance with the tenth aspect of the present invention, and FIG. 99 is a time chart showing the operation thereof. Referring to FIG. 98, this embodiment includes a memory array 150, a word driver 10 for driving word lines WL of the memory array 150, and a switch 132. To a high level potential line 10a of word driver 10, a high supply potential Vpp which is boosted from power supply potential Vcc is applied. A low level potential line 10b of word driver 10 is connected to a common terminal 132c of switch 132, one switching terminal 132a of switch 132 is connected to the ground line 147 and the other switch terminal 132b of switch 132 is connected to dummy GND line 30. Switch 132 is the same as that shown in FIG. 89, and it is connected by test mode enable signal φtest.

The operation will be described. From the normal mode, the operation enters the accelerated test mode set cycle at the timing shown in FIG. 83, and when test mode enable signal φtest rises to the "H" level, the low level potential line 10b of word driver 10 is switched from the low level of the word lines Vss (0V) to the dummy GND level Vss' (0.5V) by means of switch 132. Consequently, the non-selected level of word line WL is raised from the low level of the word lines Vss (0V) to the dummy GND level Vss' (0.5V), degrading the disturb refresh characteristic. This reduces the time necessary for the refresh test. Then, when the operation enters the reset cycle, the test mode enable signal φtest falls to the "L", the low level potential line 10b of word driver 10 is switched again to the low level of the word lines Vss (0V), and normal operation resumes.

When combined with the first to seventh embodiments, the disturb refresh characteristic can be further degraded, further increasing the effect of reducing necessary test time.

Figure 100:
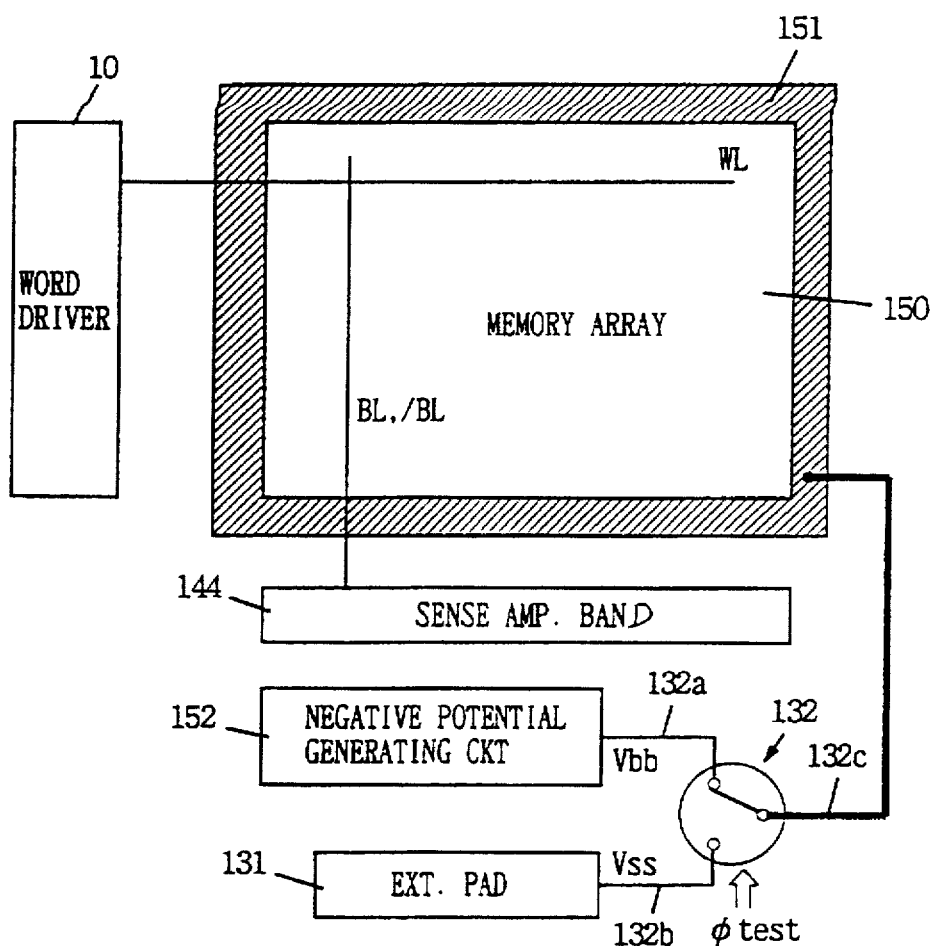
FIG. 100 is a schematic block diagram showing a ninth embodiment in accordance with the tenth aspect of the present invention.

FIG. 100 is a block diagram showing a ninth embodiment in accordance with the tenth aspect of the present invention. Referring to FIG. 100, this embodiment includes a memory array 150 formed in a well 151, a word driver 10 for driving word lines WL of memory array 150, and a sense amplifier band 144 connected to bit line pairs BL, $\overline{BL}$ of the memory array 150. This embodiment further includes a negative potential generating circuit 152 for generating a negative potential Vbb, a grounded external pad 131, and a switch 132 for switching and supplying the negative potential Vpp or the low level of the word lines Vss to well 151. One switch terminal 132a of switch 132 is connected to an output of negative potential generating circuit 152, the other switch terminal 132b is connected to external pad 131, and the common terminal 132c is connected to well 151. Switch 132 is the same as that shown in FIG. 89, and it is controlled by test mode enable signal φtest.

The operation will be described. In the normal mode, test mode enable signal φtest is at the "L" level, the common terminal 132c of switch 132 is connected to one switch terminal 132a, and the negative potential Vbb is applied to well 151 by negative potential generating circuit 151. Consequently, the sub leak current of memory cell transistor MT can be suppressed low, and disturb refresh characteristic of the memory cell MC can be maintained satisfactorily.

When accelerated test mode set timing starts at the timing shown in FIG. 83, the test mode enable signal φtest rises to the "H" level, the common terminal 132c of switch 132 is connected to the other switch terminal 132b, and well 151 is grounded through external pad 131. Therefore, sub leak current of memory cell transistor MT is increased, degrading disturb refresh characteristic of memory cell MC. Thus the test time can be reduced. Thereafter, when the operation enters the reset cycle, test mode enable signal φtest falls to the "L" level, and the negative potential Vpp is again applied to well 151.

If combined with the first to eighth embodiments above, the disturb refresh characteristic of the memory cell MC can be further degraded, and the effect of reducing the test time can be further improved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
    a memory cell array including a plurality of memory cells each connected to one of a plurality of bit lines and one of a plurality of word lines;

sense amplifiers for amplifying a small potential difference read from said memory cell array to said bit lines;

control means for controlling reading of data from said memory cell array and writing of data to said memory cell array; and potential setting means for setting low level potential lines of said bit lines, said memory cells and said sense amplifiers to a potential higher than low level of said word lines, wherein said potential setting means includes a first semiconductor element for elevating a potential of said low level potential lines by its threshold voltage.

2. The semiconductor memory device according to claim 1, wherein said potential setting means includes a second semiconductor element connected parallel to said first semiconductor element, rendered conductive in response to a signal corresponding to a period in which a large current flows, for discharging the potential of said low level potential lines.

3. The semiconductor memory device according to claim 2, wherein said potential setting means includes reference voltage generating means for generating a reference voltage which is approximately equal to said low level potential, and potential compensating means for comparing said low level potential with the reference voltage generated from said reference voltage generating means, and for elevating the potential of said low level potential lines to the potential higher than the low level of said word lines.

4. The semiconductor memory device according to claim 3, wherein said potential compensating means includes comparing means comparing the potential of said low level potential lines and said reference voltage, and switching means responsive to a comparison output from said comparing means for supplying a potential of a power supply line to said low level potential lines so as to set the low level potential lines to the potential higher than the low level of said word lines.

5. The semiconductor memory device according to claim 2, wherein said potential setting means includes sustain means for intermittently supplying a power supply potential to the low level potential lines so as to set the potential of the low level potential lines to the potential higher than the low level of said word lines.

6. The semiconductor memory device according to claim 5, wherein said sustain means includes an intermittently oscillating oscillation circuit, and a pumping circuit responsive to oscillation output from said oscillation circuit for supplying said power supply potential to the low level potential lines.

7. A semiconductor memory device comprising:

a memory cell array including a plurality of memory cells each connected to one of a plurality of bit lines and one of a plurality of word lines;

sense amplifiers for amplifying a small potential difference read from said memory cell array to said bit lines;

control means for controlling reading of data from said memory cell array and writing of data to said memory cell array;

potential setting means for setting low level potential lines of said bit lines, said memory cells and said sense amplifiers to a potential higher than low level of said word lines; and level lowering preventing means connected between a switching means and said low level potential lines for preventing lowering of a potential of said low level potential lines from that potential which is higher than the low level of said word lines, wherein said potential setting means includes reference voltage generating means for generating a reference voltage which is approximately equal to the potential of said low level potential lines, and comparing means for comparing the reference voltage from said reference voltage generating means and the potential of said low level potential lines, and said switching means responsive to a comparison output from said comparing means for discharging the potential of said low level potential lines to the low level of said word lines.

8. The semiconductor memory device according to claim 7, wherein said level lowering preventing means includes a diode.

9. The semiconductor memory device according to claim 8, further comprising:

a decoupling capacitor connected between a node between said switching means and said diode and said word lines, for absorbing change in potential.

10. A semiconductor memory device comprising:

a memory cell array including a plurality of memory cells each connected to one of a plurality of bit lines and one of a plurality of word lines;

sense amplifiers for amplifying a small potential difference read from said memory cell array to said bit lines;

control means for controlling reading of data from said memory cell array and writing of data to said memory cell array;

potential setting means for setting low level potential lines of said bit lines, said memory cells and said sense amplifiers to a potential higher than low level of said word lines;

voltage comparison stopping means responsive to a signal corresponding to a period in which a large current flows, for disabling a voltage comparing means; and float preventing means responsive to said signal corresponding to the period in which the large current flows for forcing a switching means to operate to prevent floating of a potential of said low level potential lines.

11. A semiconductor memory device comprising:

a memory cell array including a plurality of memory cells each connected to one of a plurality of bit lines and one of a plurality of word lines;

sense amplifiers for amplifying a small potential difference read from said memory cell array to said bit lines;

control means for controlling reading of data from said memory cell array and writing of data to said memory cell array; and potential setting means for setting low level potential lines of said bit lines, said memory cells and said sense amplifiers to a potential higher than low level of said word lines, wherein said potential setting means includes a switching element connected between the low level potential lines and ground for elevating a potential of said low level potential lines by its threshold voltage.

12. The semiconductor memory device according to claim 11, wherein
said switching element includes an element which is rendered conductive in response to a signal which corresponds to a period in which large current flows.

13. The semiconductor memory device according to claim 12, wherein
said switching element is rendered conductive when its input electrode falls to a potential not higher than the low level of said word lines;
said semiconductor memory device further comprising:
negative potential voltage generating means for generating a voltage of negative potential, and
switching means responsive to said signal corresponding to the period in which the large current flows for applying the negative potential voltage generated from said negative potential voltage generating means only in said period to the input electrode of said switching element so as to make response time shorter.

14. The semiconductor memory device according to claim 13, wherein
said switching means includes means for supplying, in a former half of said period corresponding to the period in which the large current flows, the low level of said word lines to the input electrode of said switching element, and in the a former half period, said negative potential voltage to the input electrode of said switching element.

15. A semiconductor memory device comprising:
a memory cell array including a plurality of memory cells each connected to one of a plurality of bit lines and one of a plurality of word lines;
sense amplifiers for amplifying a small potential difference read from said memory cell array to said bit lines;
control means for controlling reading of data from said memory cell array and writing of data to said memory cell array;
potential setting means for setting low level potential lines of said bit lines, said memory cells and said sense amplifiers to a potential higher than low level of said word lines;
word line driving means for driving said word lines; and
switching means for switching a low level potential line of said word line driving means to ground or to an output of said potential setting means.

16. The semiconductor memory device according to claim 15, wherein
said switching means includes means for switching said low level potential line of said word line driving means from the low level of said word lines to said output of said potential setting means before said low level of said word lines rises from a first logic to a second logic.

17. The semiconductor memory device according to claim 15, wherein
said memory cell array is arranged in a plurality of blocks, and
said switching means includes means for switching said low level potential line of said word line driving means from the low level of said word lines to said output of said potential setting means before said low level of said word lines rises from a first logic to a second logic in each said block.

18. The semiconductor memory device according to claim 17, wherein
said switching means includes means for switching a non-selected word line from the output of said potential setting means to the low level of said word lines, after a selected word line rises from the first logic to the second logic in each said block.

19. A semiconductor memory device, comprising;
a memory cell array including memory cells each connected to one of a plurality of bit lines and one of a plurality of word lines;
sense amplifiers for amplifying a small potential difference read from said memory cell array to said bit line;
control means for controlling reading of data from said memory cell array and writing of data to said memory cell array;
a first semiconductor element for setting low level potential lines of said bit lines, said memory cells and said sense amplifiers to a potential higher than ground potential by its threshold voltage;
a second semiconductor element connected parallel to said first semiconductor element, rendered conductive in response to a signal which corresponds to a period in which a large current flows, for discharging potential of said low level potential lines; and
clamping means for comparing the potential of said low level potential lines and a reference potential for clamping the potential of said low level potential lines at a predetermined potential in response to the potential of said low level potential lines being lower than said reference potential.

20. A semiconductor memory device comprising:
a memory cell array including memory cells each connected to one of a plurality of bit lines and one of a plurality of word lines;
a sense amplifier for amplifying a small potential difference read from said memory cell array to said bit lines;
control means for controlling reading of data from said memory cell array and writing of data to said memory cell array;
a drive line for driving said sense amplifier; and
potential setting means for setting, when said sense amplifier is driven, a low level potential of said sense amplifier drive line to a potential higher than low level of said word lines, wherein
said potential setting means includes
comparing means for comparing, when said sense amplifier is driven, voltage of said sense amplifier drive line with a predetermined reference voltage,
a first semiconductor element responsive to a comparison output from said comparing means for discharging the low level potential of said sense amplifier drive line to the potential higher than the low level of said word lines, and
said comparing means includes means for applying a negative potential voltage to said comparing means when said sense amplifier is not driven.

21. The semiconductor memory device according to claim 20, wherein
said comparing means includes a current comparing circuit.

22. The semiconductor memory device according to claim 21, wherein
said current comparing circuit includes hysteresis control means for adapting a reference level to have hysteresis characteristic.

23. A semiconductor memory device comprising:

a memory cell array including memory cells each connected to one of a plurality of bit lines and one of a plurality of word lines;

a sense amplifier for amplifying a small potential difference read from said memory cell array to said bit lines;

control means for controlling reading of data from said memory cell array and writing of data to said memory cell array;

a drive line for driving said sense amplifier; and potential setting means for setting, when said sense amplifier is driven, a low level potential of said sense amplifier drive line to a potential higher than low level of said word lines; and low level forcing means for forcing, when said memory cells are tested by a test circuit, said sense amplifier drive line to the low level of said word lines.

24. A semiconductor memory device, comprising:

a memory cell array including memory cells each connected to one of a plurality of bit lines and one of a plurality of word lines;

a sense amplifier for amplifying a small potential difference read from said memory cell array to said bit lines;

a transfer gate connected between said bit lines and said sense amplifier; and control means for controlling, when said sense amplifier is driven, gate potential of said transfer gate such that the gate potential is set to low level of said word lines, and a low level potential of said bit lines such that the low level potential is made higher by a threshold voltage of said transfer gate.

25. The semiconductor memory device according to claim 24, wherein said control means includes switching means for switching the low level potential of said bit lines when said sense amplifier is driven to a potential higher than a low level potential of said sense amplifier.

26. The semiconductor memory device according to claim 24, wherein said control means includes switching means for switching a low level potential of said sense amplifier such that the low level potential when said sense amplifier is driven is made higher than the low level potential of said bit lines before completion of said sense amplifier drive.

27. The semiconductor memory device according to claim 25, further comprising a drive line for driving said sense amplifier; wherein said switching means includes means for connecting, at the start of driving of said sense amplifier, the drive line of said sense amplifier to the low level of said word lines, and after initial sensing operation, switching said drive line to a potential higher than the low level of said word lines.

28. A semiconductor memory device, comprising:

a memory cell array including memory cells each connected to one of a plurality of bit lines and one of a plurality of word lines;

a sense amplifier for amplifying a small potential difference read from said memory cell array to said bit lines;

control means for controlling reading of data from said memory cell array and writing of data to said memory cell array; and potential setting means for setting low level potential lines of said bit lines, said memory cells and said sense amplifier to a potential higher than low level of said word lines, and for setting a high level potential at a potential lower than an externally applied power supply voltage, wherein said potential setting means includes means for setting a potential of said low level potential lines and said high level potential to arbitrary potentials, respectively.

29. The semiconductor memory device according to claim 28, wherein said potential setting means includes said means for arbitrarily setting said low level potential and said high level potential, while maintaining constant potential difference between said low level potential and said high level potential.

30. A semiconductor memory device, comprising:

a memory cell array including memory cells each connected to one of a plurality of bit lines and one of a plurality of word lines;

a sense amplifier for amplifying a small potential difference read from said memory cell array to said bit lines;

control means for controlling reading of data from said memory cell array and writing of data to said memory cell array; and potential setting means for setting low level potential lines of said bit lines, said memory cells and said sense amplifier to a potential higher than low level of said word lines, and for setting a high level potential at a potential lower than an externally applied power supply voltage, wherein said potential setting means includes high level potential setting means for setting said high level potential based on a first reference potential, and a low level potential setting means for setting a potential of said low level potential lines based on a second reference potential.

31. The semiconductor memory device according to claim 30, further comprising:

reference potential generating means for generating said first and said second reference potentials.

32. The semiconductor memory device according to claim 31, wherein said reference potential generating means includes means for generating said first and second reference potentials while maintaining constant level difference between the first and the second reference potentials.

33. A semiconductor memory device, comprising:

a memory cell array including memory cells each connected to one of a plurality of bit lines and one of a plurality of word lines;

a sense amplifier for amplifying a small potential difference read from said memory cell array to said bit lines;

control means for controlling reading of data from said memory cell array and writing of data to said memory cell array; and potential setting means for setting low level potential lines of said bit lines, said memory cells and said sense amplifier to a potential higher than low level of said word lines, and for setting a high level potential at a potential lower than an externally applied power supply voltage, wherein said potential setting means includes switching means for switching a potential of said low level potential lines to a potential approximately equal to the low level of said word lines for only a predetermined period.

34. A semiconductor memory device, comprising:

a memory cell array including memory cells each connected to one of a plurality of bit lines and one of a plurality of word lines;

a sense amplifier for amplifying a small potential difference read from said memory cell array to said bit lines;

control means for controlling reading of data from said memory cell array and writing of data to said memory cell array; and potential setting means for setting low level potential lines of said bit lines, said memory cells and said sense amplifier to a potential higher than low level of said word lines, and for setting a high level potential at a potential lower than an externally applied power supply voltage, wherein said potential setting means includes a plurality of first resistors connected in parallel each for setting a first reference potential to an arbitrary potential, a plurality of first fuses connected in series corresponding to said plurality of first resistors, invalidating corresponding one of the first resistors when blown off, a plurality of second resistors connected in parallel each for setting a second reference potential to an arbitrary potential, and a plurality of second fuses connected in series corresponding to said plurality of second resistors, invalidating corresponding one of the second resistors when blown off.

35. The semiconductor memory device according to claim 34, further comprising a plurality of transistors connected in series to said plurality of first and second fuses for rendering conductive or non-conductive the first and the second fuses for adjusting said first and second reference potentials.

36. A semiconductor memory device having an internal circuit to which a power supply voltage is externally applied, comprising:

potential setting means for setting a high level potential supplied to said internal circuit to a potential different from said externally supplied power supply voltage, and for setting a low level potential supplied to said internal circuit to a potential different from a low level of word lines of said semiconductor memory device, and means for changing the high level potential and the low level potential set by said potential setting means dependent on whether said semiconductor memory device is in use or not in use.

37. A semiconductor memory device having a chip formed on a semiconductor substrate, comprising:

a memory cell array including memory cells each connected to one of a plurality of bit lines and one of a plurality of word lines;

a sense amplifier for amplifying a small potential difference read from said memory cell array to the bit lines;

control means for controlling reading of data from said memory cell array and writing of data to said memory cell array;

substrate potential generating means for supplying a negative level substrate potential to said semiconductor substrate;

boosted voltage generating means for generating a boosted voltage to be supplied to said word lines; and potential setting means for switching potential of said boosted voltage and said negative level potential to arbitrary potentials dependent on whether the chip is in use or not in use.

38. A semiconductor memory device having a chip formed on a semiconductor substrate, comprising:

a memory cell array including memory cells each connected to one of a plurality of bit lines and one of a plurality of word lines;

a sense amplifier for amplifying a small potential difference read from said memory cell array to the bit lines;

control means for controlling reading of data from said memory cell array and writing of data to said memory cell array;

potential setting means for setting low level potential lines of said bit lines, said memory cells and said sense amplifier to a potential higher than low level of said word lines; and low level forcing means for forcing, when data retention time of said memory cells is tested, the low level potential lines of said bit lines, said memory cells and said amplifier to the low level of said word lines.

39. The semiconductor memory device according to claim 38, further comprising:

word line driving means for driving said word lines; and switching means for switching, when the data retention time of said memory cells is tested, a low level potential line of said word line driving means from ground side to a side of an output of said potential setting means.

40. A semiconductor memory device having a chip formed on a semiconductor substrate, comprising:

a memory cell array including a plurality of memory cells each connected to one of a plurality of bit lines and one of a plurality of word lines;

word line driving means for driving said word lines;

a sense amplifier for amplifying a small potential difference read from said memory cell array to the bit lines;

control means for controlling reading of data from said memory cell array and writing of data to said memory cell array; and potential setting means for setting, when data retention time of said memory cells is tested, low level potential line of said word line driving means to a potential higher than low level of said word lines.

41. The semiconductor memory device according to claim 40, further comprising:

substrate potential generating means for generating a negative level substrate potential to said semiconductor substrate; and substrate potential setting means for setting, when the data retention time of said memory cells is tested, a substrate potential of said semiconductor substrate higher than said negative level substrate potential.

42. A semiconductor memory device having a chip formed on a semiconductor substrate, comprising:

a memory cell array including memory cells each connected to one of a plurality of bit lines and one of a plurality of word lines;

a sense amplifier for amplifying a small potential difference read from said memory cell array to the bit lines;

control means for controlling reading of data from said memory cell array and writing of data to said memory cell array;

substrate potential generating means for supplying a negative level substrate potential to said semiconductor substrate; and substrate potential setting means for setting, when data retention time of said memory cells is tested, a substrate potential of said semiconductor substrate higher than said negative level substrate potential.

* * * * *